(12) United States Patent
Inoue et al.

(10) Patent No.: US 11,276,711 B2
(45) Date of Patent: Mar. 15, 2022

(54) SEMICONDUCTOR DEVICE, DISPLAY DEVICE, AND ELECTRONIC DEVICE

(71) Applicant: Semiconductor Energy Laboratory Co., Ltd., Atsugi (JP)

(72) Inventors: Hiroki Inoue, Kanagawa (JP); Fumika Akasawa, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 122 days.

(21) Appl. No.: 15/821,006

(22) Filed: Nov. 22, 2017

(65) Prior Publication Data
US 2018/0151593 A1    May 31, 2018

(30) Foreign Application Priority Data

Nov. 29, 2016  (JP) .................................. 2016-231653

(51) Int. Cl.
*G11C 19/00* (2006.01)
*H01L 27/12* (2006.01)
(Continued)

(52) U.S. Cl.
CPC ......... *H01L 27/124* (2013.01); *G09G 3/3233* (2013.01); *G09G 3/3266* (2013.01); *G09G 3/3648* (2013.01); *G09G 3/3677* (2013.01); *G11C 19/14* (2013.01); *G11C 19/28* (2013.01); *H01L 27/1225* (2013.01); *H01L 27/1255* (2013.01); *H03K 3/356017* (2013.01);
(Continued)

(58) Field of Classification Search
None
See application file for complete search history.

(56) References Cited

U.S. PATENT DOCUMENTS 4,763,136 A * 8/1988 Isobe ....................... B41J 2/345
                                                      347/208
5,949,398 A * 9/1999 Kim ....................... G11C 19/28
                                                      345/100
(Continued)

FOREIGN PATENT DOCUMENTS

EP          2065881 A       6/2009
JP       2001-144606 A      5/2001
(Continued)

OTHER PUBLICATIONS

Lym.H et al., "5V input level shifter circuit for IGZO thin-film transistors", IEICE Electronics Express, 2014, vol. 11, No. 13, pp. 1-6.
(Continued)

*Primary Examiner* — Tuan T Lam
(74) *Attorney, Agent, or Firm* — Fish & Richardson P.C.

(57) ABSTRACT

A level shifter including a transistor that can be formed through the same process as a display portion is provided. A semiconductor device serves as a level shifter including transistors having the same conductivity type. The semiconductor device includes a so-called MIS capacitor in which metal, an insulator, and a semiconductor are stacked as a capacitor for boosting an input signal. Since the MIS capacitor is used, the gate-source voltage of a transistor for generating an output signal can be increased. Thus, boosting operation to generate the output signal can be performed more surely.

13 Claims, 48 Drawing Sheets

(51) Int. Cl.
- *H03K 3/356* (2006.01)
- *G09G 3/36* (2006.01)
- *G09G 3/3266* (2016.01)
- *G09G 3/3233* (2016.01)
- *G11C 19/28* (2006.01)
- *G11C 19/14* (2006.01)
- *G06F 3/041* (2006.01)

(52) U.S. Cl.
CPC ..... *G06F 3/0412* (2013.01); *G09G 2300/046* (2013.01); *G09G 2310/0289* (2013.01)

(56) References Cited

U.S. PATENT DOCUMENTS

| | | | |
|---|---|---|---|
| 6,333,658 B1* | 12/2001 | Akita | H03K 5/135 |
| | | | 327/161 |
| 6,686,899 B2* | 2/2004 | Miyazawa | G09G 3/3648 |
| | | | 326/81 |
| 6,788,108 B2 | 9/2004 | Miyake et al. | |
| 6,930,666 B2 | 8/2005 | Miyazawa et al. | |
| 7,071,758 B2 | 7/2006 | Tseng et al. | |
| 7,091,749 B2 | 8/2006 | Miyake et al. | |
| 7,202,863 B2 | 4/2007 | Kimura et al. | |
| 7,362,139 B2 | 4/2008 | Miyake et al. | |
| 7,545,357 B2 | 6/2009 | Miyazawa et al. | |
| RE41,215 E | 4/2010 | Miyake et al. | |
| 7,786,985 B2 | 8/2010 | Kimura et al. | |
| 7,864,151 B1 | 1/2011 | Yamazaki et al. | |
| 8,044,906 B2 | 10/2011 | Kimura et al. | |
| 8,059,078 B2 | 11/2011 | Kimura et al. | |
| RE43,401 E | 5/2012 | Miyake et al. | |
| 8,310,474 B2* | 11/2012 | Koyama | G02F 1/13454 |
| | | | 345/206 |
| 8,456,402 B2 | 6/2013 | Kimura et al. | |
| 8,537,083 B2 | 9/2013 | Nakatsuka | |
| RE44,657 E | 12/2013 | Miyake et al. | |
| 8,823,620 B2 | 9/2014 | Kimura et al. | |
| 8,902,144 B2 | 12/2014 | Umezaki | |
| 8,902,374 B2 | 12/2014 | Umezaki | |
| 9,190,425 B2 | 11/2015 | Kimura et al. | |
| 9,337,184 B2 | 5/2016 | Umezaki | |
| 9,590,594 B2 | 3/2017 | Kozuma | |
| 9,640,135 B2 | 5/2017 | Kimura et al. | |
| 9,647,665 B2 | 5/2017 | Inoue et al. | |
| 9,755,643 B2 | 9/2017 | Inoue et al. | |
| 9,881,582 B2 | 1/2018 | Kimura et al. | |
| 9,941,308 B2 | 4/2018 | Umezaki | |
| 10,008,519 B1 | 6/2018 | Umezaki | |
| 10,074,313 B2 | 9/2018 | Nishikawa et al. | |
| 10,121,448 B2 | 11/2018 | Kimura et al. | |
| 10,304,873 B2 | 5/2019 | Umezaki | |
| 10,373,581 B2 | 8/2019 | Kimura et al. | |
| 10,593,267 B2 | 3/2020 | Nishikawa et al. | |
| 10,629,134 B2 | 4/2020 | Umezaki | |
| 10,867,576 B2 | 12/2020 | Kimura et al. | |
| 10,971,075 B2 | 4/2021 | Umezaki | |
| 2003/0020520 A1* | 1/2003 | Miyake | G09G 3/20 |
| | | | 327/112 |
| 2003/0107688 A1 | 6/2003 | Yamagishi | |
| 2004/0174189 A1* | 9/2004 | Nagao | G09G 3/3648 |
| | | | 326/97 |
| 2004/0253781 A1* | 12/2004 | Kimura | H03K 19/018507 |
| | | | 438/222 |
| 2008/0101529 A1* | 5/2008 | Tobita | G09G 3/3677 |
| | | | 377/64 |
| 2008/0187089 A1* | 8/2008 | Miyayama | G11C 19/28 |
| | | | 377/79 |
| 2010/0244946 A1* | 9/2010 | Murakami | G09G 3/3677 |
| | | | 327/564 |
| 2010/0245335 A1* | 9/2010 | Kimura | G09G 3/3677 |
| | | | 345/213 |
| 2014/0225641 A1* | 8/2014 | Kozuma | H03K 19/17748 |
| | | | 326/38 |
| 2014/0225644 A1* | 8/2014 | Aoki | H03K 19/017581 |
| | | | 326/41 |
| 2014/0266326 A1* | 9/2014 | Ancis | H03K 19/0013 |
| | | | 327/109 |
| 2014/0266379 A1* | 9/2014 | Inoue | H03K 5/249 |
| | | | 327/307 |
| 2015/0061742 A1* | 3/2015 | Maehashi | H03K 3/012 |
| | | | 327/213 |
| 2015/0077162 A1* | 3/2015 | Yamazaki | H03K 19/096 |
| | | | 327/109 |
| 2015/0263725 A1* | 9/2015 | Onuki | H01L 27/0207 |
| | | | 327/108 |
| 2015/0380451 A1* | 12/2015 | Kurokawa | H01L 27/14616 |
| | | | 257/43 |
| 2016/0352312 A1* | 12/2016 | Yang | H03K 3/356104 |
| 2017/0141776 A1* | 5/2017 | Kozuma | H03K 19/1774 |
| 2017/0186373 A1* | 6/2017 | Nishikawa | G11C 19/28 |
| 2018/0040274 A1* | 2/2018 | Kurokawa | G09G 3/3275 |
| 2018/0144711 A1* | 5/2018 | Noh | G09G 3/3266 |
| 2019/0033675 A1* | 1/2019 | Umezaki | H01L 27/15 |
| 2021/0134240 A1 | 5/2021 | Kimura et al. | |
| 2021/0233475 A1 | 7/2021 | Umezaki | |

FOREIGN PATENT DOCUMENTS

| | | |
|---|---|---|
| JP | 2002-251174 A | 9/2002 |
| JP | 2003-179479 A | 6/2003 |
| JP | 2004-222256 A | 8/2004 |
| JP | 2008-225381 A | 9/2008 |
| JP | 2009-128825 A | 6/2009 |
| JP | 2010-152347 A | 7/2010 |
| TW | 469701 | 12/2001 |
| TW | 546615 | 8/2003 |
| TW | 200515703 | 5/2005 |
| WO | WO-2007/041150 | 4/2007 |
| WO | WO-2010/061723 | 6/2010 |
| WO | WO-2015/190407 | 12/2015 |

OTHER PUBLICATIONS

Inoue.H et al., "An Oxide-Semiconductor (OS) FET-based Low-Power Level Shifter Combined with OS LSI Technology-based Display-Controller COG fora Low-Power OS Display System", SID Digest '17 : SID International Symposium Digest of Technical Papers, May 1, 2017, vol. 48, No. 1, pp. 1419-1422.

Taiwanese Office Action (Application No. 106139606) dated Oct. 14, 2021.

* cited by examiner

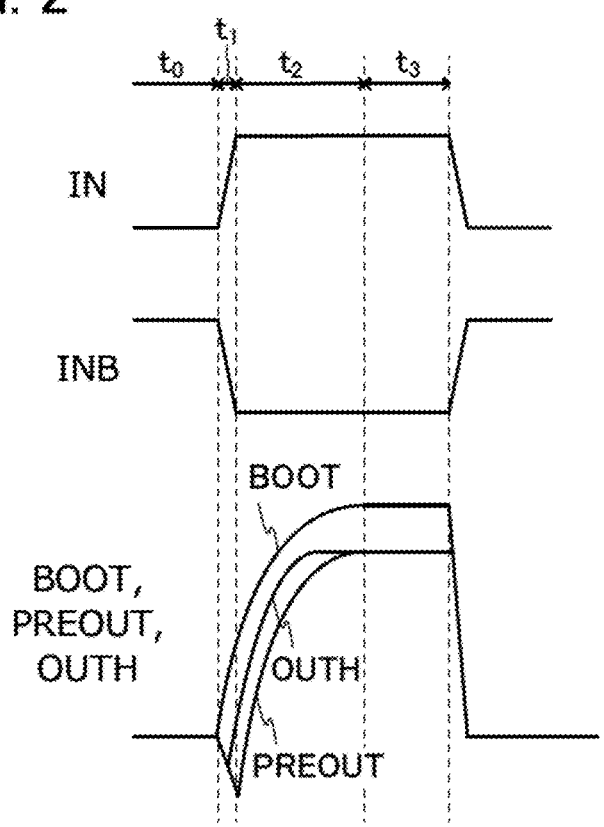

$t_1$ $t_3$

SRD

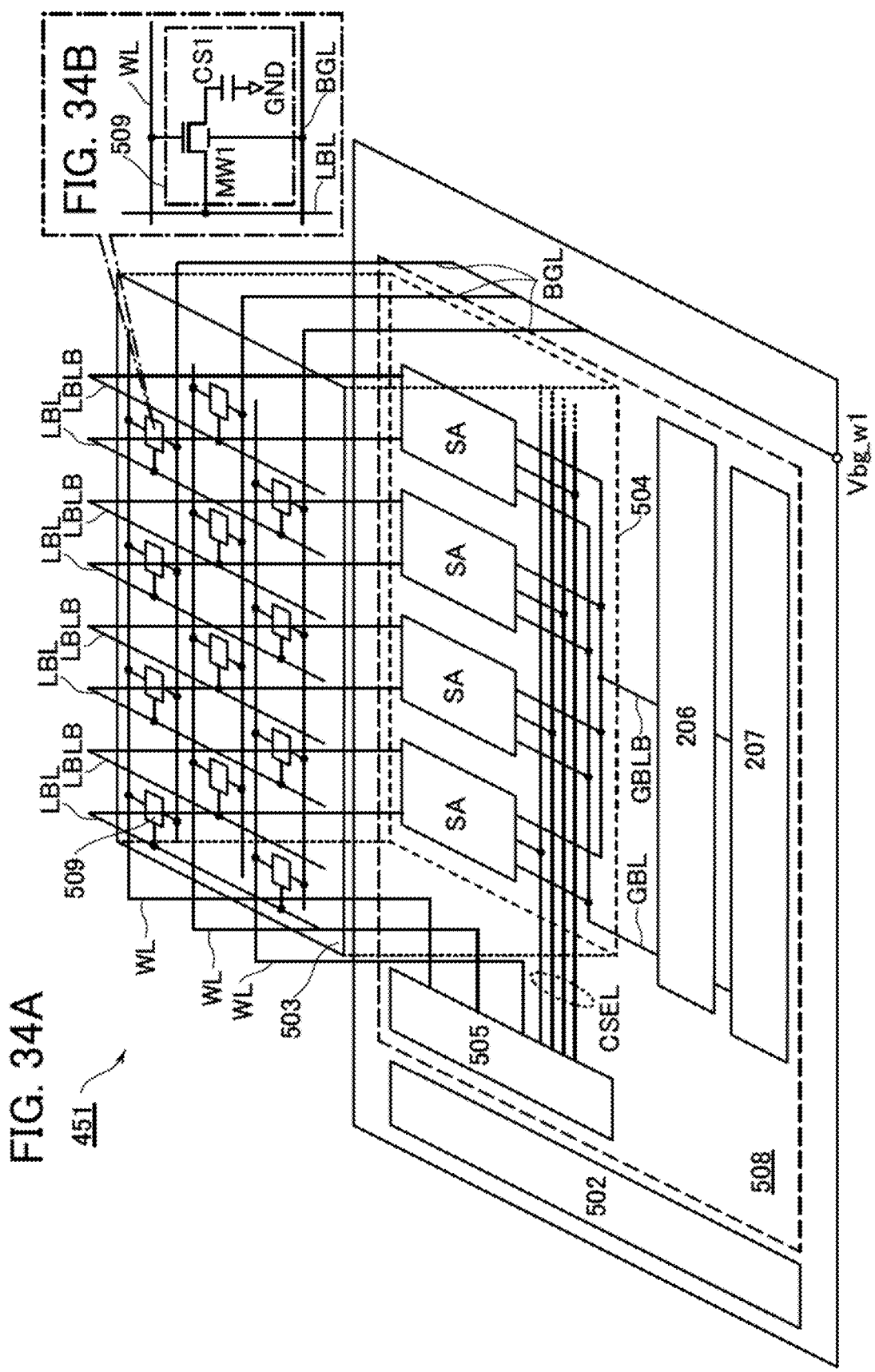

100A

SEMICONDUCTOR DEVICE, DISPLAY DEVICE, AND ELECTRONIC DEVICE

BACKGROUND OF THE INVENTION

1. Field of the Invention

Embodiments of the present invention relate to a semiconductor device, a display device, and an electronic device.

2. Description of the Related Art

Display devices included in mobile phones such as smartphones, tablet information terminals, and notebook personal computers (PC) have undergone various improvements in recent years. For example, there have been developed display devices with features such as higher resolution, higher color reproducibility (higher NTSC ratio), a smaller driver circuit, and lower power consumption.

As an example, an improved display device has a function of automatically adjusting the brightness of an image displayed on the display device in accordance with ambient light. An example of such a display device is a display device having a function of displaying an image by reflecting ambient light and a function of displaying an image by making a light-emitting element emit light. This structure enables the brightness of an image displayed on a display device to be adjusted in the following manner: the display device enters a display mode for displaying an image with the use of reflected light (hereinafter referred to as reflective mode) when ambient light is sufficiently strong, whereas the display device enters a display mode for displaying an image with light emitted from a light-emitting element (hereinafter referred to as transmissive mode or self-luminous mode) when ambient light is weak. In other words, the display device can display images in a display mode that is selected from the reflective mode, the self-luminous mode, and a mode using both the reflective and self-luminous modes in accordance with the intensity of ambient light sensed with an illuminometer (illuminance sensor).

As examples of a display device having a function of displaying an image by making a light-emitting element emit light and a function of displaying an image by reflecting ambient light, Patent Documents 1 to 3 each disclose a display device in which one pixel includes a pixel circuit for controlling a liquid crystal element and a pixel circuit for controlling a light-emitting element (hereinafter such a display device is referred to as a hybrid display device). In addition, a transistor including an oxide semiconductor in a channel formation region (an OS transistor) can be effectively used in a pixel circuit of a hybrid display device. An OS transistor has an extremely low off-state current; hence, the refresh frequency in displaying a still image by a display portion can be reduced. In this specification and the like, the aforementioned technique for reducing the refresh frequency is referred to as idling stop or IDS driving.

Patent Document

[Patent Document 1] United States Patent Application Publication No. 2003/0107688
[Patent Document 2] PCT International Publication No. WO2007/041150
[Patent Document 3] Japanese Published Patent Application No. 2008-225381

SUMMARY OF THE INVENTION

One way to further reduce the power consumption of the hybrid display device is so-called chip on glass (COG), in which a controller IC (including a frame memory, a timing controller, and the like) necessary for refreshing an image is mounted on a substrate (e.g., a glass substrate).

When COG is employed, IDS driving can be performed only by a circuit on a panel without supplying data from a host through a flexible printed circuit (FPC). In addition to COG, a structure in which a low-voltage timing signal output from the controller IC to a gate driver on the panel is boosted by a level shifter is effective at performing IDS driving only by the circuit on the panel. However, an increase in the number of transistors included in the level shifter and the number of voltages for operating the level shifter is a problem.

An object of one embodiment of the present invention is to provide a novel semiconductor device that can serve as a level shifter and a display device, an electronic device, and the like including the semiconductor device.

Another object of one embodiment of the present invention is to provide a semiconductor device or the like with a novel structure that can be formed over a panel as well as a transistor in a display portion. Another object of one embodiment of the present invention is to provide a semiconductor device or the like with a novel structure in which the number of transistors in a circuit serving as a level shifter is reduced.

Another object of one embodiment of the present invention is to provide a semiconductor device or the like with a novel structure in which the number of voltages for operating a circuit serving as a level shifter is reduced.

One embodiment of the present invention is a semiconductor device to which a first voltage, a second voltage, an input signal, and an inverted input signal are supplied and which generates an output signal by boosting the amplitude voltage of the input signal. The semiconductor device includes first to fourth transistors, a first capacitor, and a second capacitor. A wiring to which the input signal is supplied is electrically connected to a gate and one of a source and a drain of the first transistor. A wiring to which the inverted input signal is supplied is electrically connected to a gate of the second transistor, a gate of the fourth transistor, and a first electrode of the second capacitor. A wiring to which the first voltage is supplied is electrically connected to one of a source and a drain of the third transistor. A wiring to which the second voltage is supplied is electrically connected to one of a source and a drain of the second transistor and one of a source and a drain of the fourth transistor. A first electrode of the first capacitor is electrically connected to the other of the source and the drain of the first transistor, a gate of the third transistor, and the other of the source and the drain of the second transistor. A second electrode of the first capacitor is electrically connected to a second electrode of the second capacitor, the other of the source and the drain of the third transistor, and the other of the source and the drain of the fourth transistor.

In the above embodiment of the present invention, the semiconductor device in which the first capacitor and the second capacitor are each a stack including metal, an insulator, and a semiconductor is preferable.

In the above embodiment of the present invention, the semiconductor device in which semiconductor layers having channel formation regions of the first to fourth transistors and the semiconductor of each of the first capacitor and the second capacitor is an oxide semiconductor is preferable.

In the above embodiment of the present invention, the semiconductor device including a fifth transistor and a sixth transistor and in which the first electrode of the first capacitor is electrically connected to a gate of the fifth transistor, the wiring to which the inverted input signal is supplied is electrically connected to a gate of the sixth transistor, the wiring to which the first voltage is supplied is electrically connected to one of a source and a drain of the fifth transistor, the wiring to which the second voltage is supplied is electrically connected to one of a source and a drain of the sixth transistor, and a wiring for outputting the output signal is electrically connected to the other of the source and the drain of the fifth transistor and the other of the source and the drain of the sixth transistor is preferable.

One embodiment of the present invention is preferably a semiconductor device to which a first voltage, a second voltage, a third voltage, an input signal, and an inverted input signal are supplied, which generates an output signal by boosting the amplitude voltage of the input signal, which includes first to third transistors, a first capacitor, and a second capacitor, and in which a wiring to which the input signal is supplied is electrically connected to one of a source and a drain of the first transistor, a wiring to which the third voltage is supplied is electrically connected to a gate of the first transistor, a wiring to which the inverted input signal is supplied is electrically connected to a gate of the third transistor and a first electrode of the second capacitor, a wiring to which the first voltage is supplied is electrically connected to one of a source and a drain of the second transistor, a wiring to which the second voltage is supplied is electrically connected to one of a source and a drain of the third transistor, a first electrode of the first capacitor is electrically connected to the other of the source and the drain of the first transistor and a gate of the second transistor, and a second electrode of the first capacitor is electrically connected to a second electrode of the second capacitor, the other of the source and the drain of the second transistor, and the other of the source and the drain of the third transistor.

In the above embodiment of the present invention, the semiconductor device in which the first capacitor and the second capacitor are each a stack including metal, an insulator, and a semiconductor is preferable.

In the above embodiment of the present invention, the semiconductor device in which semiconductor layers having channel formation regions of the first to third transistors and the semiconductor of each of the first capacitor and the second capacitor is an oxide semiconductor is preferable.

In the above embodiment of the present invention, the semiconductor device in which the third voltage is lower than the first voltage is preferable.

In the above embodiment of the present invention, the semiconductor device including a fourth transistor and a fifth transistor and in which the first electrode of the first capacitor is electrically connected to a gate of the fourth transistor, the wiring to which the inverted input signal is supplied is electrically connected to a gate of the fifth transistor, the wiring to which the first voltage is supplied is electrically connected to one of a source and a drain of the fourth transistor, the wiring to which the second voltage is supplied is electrically connected to one of a source and a drain of the fifth transistor, and the wiring for outputting the output signal is electrically connected to the other of the source and the drain of the fourth transistor and the other of the source and the drain of the fifth transistor is preferable.

One embodiment of the present invention is a display device including a level shifter including the semiconductor device, a gate driver, a source driver IC, a controller IC, and a display portion.

One embodiment of the present invention is an electronic device including a display module including the display device and a housing.

Note that other embodiments of the present invention will be described in the following embodiments with reference to the drawings.

One embodiment of the present invention can provide a novel semiconductor device that can serve as a level shifter and a display device, an electronic device, and the like including the semiconductor device.

One embodiment of the present invention can provide a semiconductor device or the like with a novel structure that can be formed over a panel as well as a transistor in a display portion. One embodiment of the present invention can provide a semiconductor device or the like with a novel structure in which the number of transistors in a circuit serving as a level shifter is reduced. One embodiment of the present invention can provide a semiconductor device or the like with a novel structure in which the number of voltages for operating a circuit serving as a level shifter is reduced.

BRIEF DESCRIPTION OF THE DRAWINGS

In the accompanying drawings:

FIG. 2 is a timing chart showing an operation example of a semiconductor device;

FIGS. 34A and 34B are a block diagram and a circuit diagram illustrating a configuration example of a frame memory;

DETAILED DESCRIPTION OF THE INVENTION

Figure 1A:
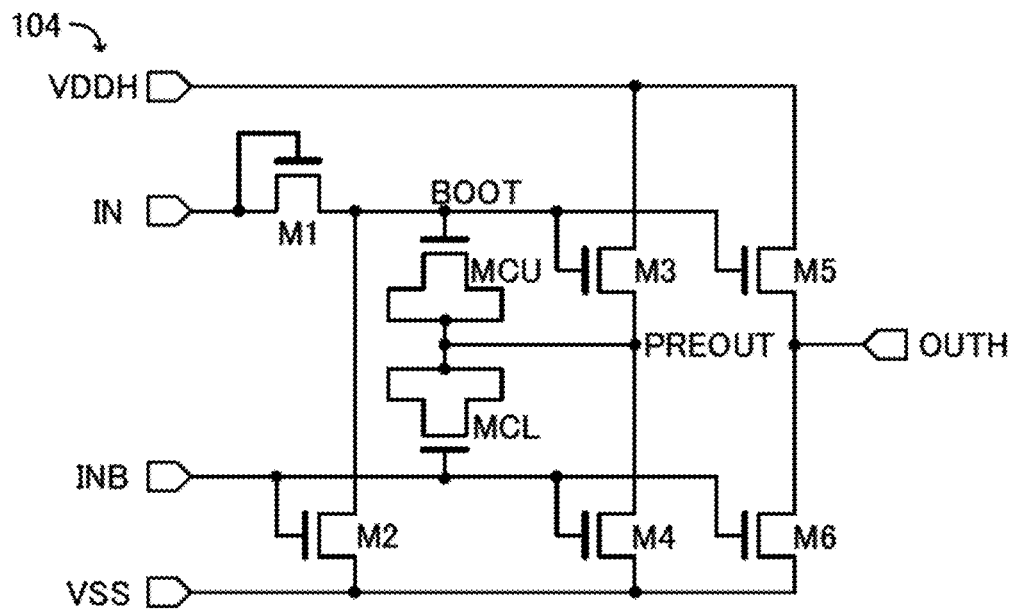
FIGS. 1A and 1B are a circuit diagram of a semiconductor device and a block diagram of a display device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as "first", "second", and "third" are used in order to avoid confusion among components. Thus, the terms do not limit the number or order of components.

The same elements or elements having similar functions, elements formed using the same material, elements formed at the same time, or the like in the drawings are denoted by the same reference numerals, and the description thereof is not repeated in some cases.

In this specification and the like, terms for explaining arrangement, such as "over" and "under", are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, blocks in a block diagram do not necessarily show components described in the specification, which can be explained with another term as appropriate depending on the situation.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes, values, or the like shown in the drawings. For example, the following can be included: variation in signal, voltage, or current due to noise or difference in timing.

In drawings such as top views (also referred to as plan views or layout views) and perspective views, some of components might not be illustrated for clarity of the drawings.

In this specification and the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of the component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential.

When the reference potential is a ground potential, for example, "voltage" can be replaced with "potential". The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification and the like, a switch is conducting (on state) or not conducting (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

In this specification and the like, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

Embodiment 1

In this embodiment, a semiconductor device of one embodiment of the present invention will be described. The semiconductor device has a function of boosting the amplitude voltage of an input signal and outputting the resulting signal as an output signal. Thus, the semiconductor device is referred to as a boosting circuit or a level shifter in some cases. Note that a device including an element that can utilize semiconductor characteristics, such as a circuit including a transistor or a capacitor, is a semiconductor device.

<Structure Example 1>

FIG. 1A is a circuit diagram of a level shifter 104 that is a semiconductor device of one embodiment of the present invention.

The level shifter 104 includes transistors M1 to M6, a capacitor MCU, and a capacitor MCL. FIG. 1A illustrates an input signal IN, an inverted input signal INB, an output signal OUTH, a voltage VDDH, a voltage VSS, a node BOOT, and a node PREOUT.

A wiring to which the input signal IN is supplied is connected to a gate and one of a source and a drain of the transistor M1. A wiring to which the inverted input signal INB is supplied is connected to a gate of the transistor M2, a gate of the transistor M4, a gate of the transistor M6, and a first electrode of the capacitor MCL. A wiring to which the voltage VDDH is supplied is connected to one of a source and a drain of the transistor M3 and one of a source and a drain of the transistor M5. A wiring to which the voltage VSS is supplied is connected to one of a source and a drain of the transistor M2, one of a source and a drain of the transistor M4, and one of a source and a drain of the transistor M6. A first electrode of the capacitor MCU is connected to the other of the source and the drain of the transistor M1, a gate of the transistor M3, a gate of the transistor M5, and the other of the source and the drain of the transistor M2. A second electrode of the capacitor MCU is connected to a second electrode of the capacitor MCL, the other of the source and the drain of the transistor M3, and the other of the source and the drain of the transistor M4. A wiring for outputting the output signal OUTH is connected to the other of the source and the drain of the transistor M5 and the other of the source and the drain of the transistor M6.

The input signal IN and the inverted input signal INB at H level each correspond to a voltage VDD and those at L level each correspond to the voltage VSS (<VDD). The voltage VSS is a reference potential, for example, a ground potential or a potential of 0 V. The input signal IN is a digital signal. The inverted input signal INB is a signal whose logic is the inverted logic of the input signal IN. The output signal OUTH is a signal having the same logic as the input signal IN. The output signal OUTH at H level corresponds to the voltage VDDH (>VDD) and that at L level corresponds to the voltage VSS. That is, the level shifter 104 is a circuit having a function of generating the output signal OUTH that is obtained by boosting the amplitude voltage of the input signal IN.

With the structure of FIG. 1A, a signal can be generated by boosting the voltages of the input signal IN and the inverted input signal INB by the voltage VDDH and the voltage VSS. In other words, a voltage other than the voltage VDDH and the voltage VSS, such as the voltage VDD, is unnecessary. Thus, a semiconductor device serving as a level shifter in which the number of wirings for supplying voltages to elements can be reduced can be formed.

The node BOOT corresponds to a node to which the first electrode of the capacitor MCU is connected, that is, a node to which the other of the source and the drain of the transistor M1, the gate of the transistor M3, the gate of the transistor M5, and the other of the source and the drain of the transistor M2 are connected. The node PREOUT corresponds to a node to which the second electrode of the capacitor MCU is connected, that is, a node to which the second electrode of the capacitor MCL, the other of the source and the drain of the transistor M3, and the other of the source and the drain of the transistor M4 are connected.

The transistors M1 to M6 can have the same conductivity type. Although the transistors M1 to M6 are n-channel transistors in the example illustrated in FIG. 1A, p-channel transistors can also be used by inverting the logic of each signal. The n-channel transistors used as the transistors M1 to M6 in FIG. 1A are preferably transistors each including an oxide semiconductor in a channel formation region (hereinafter referred to as OS transistors).

Each of the capacitor MCU and the capacitor MCL can be a so-called metal insulator semiconductor (MIS) capacitor in which metal, an insulator, and a semiconductor are stacked. When the insulator is an oxide, the capacitor may be referred to as a MOS capacitor. Therefore, as illustrated in FIG. 1A, a source and a drain of a transistor are connected to each other and whether the transistor serves as the capacitor or not can be switched depending on a voltage applied to a gate of the transistor.

With the structure, the capacitance value of the capacitor MCL and the capacitance value of the capacitor MCU can be different in a period in which the voltage of the input signal IN and the voltage of the inverted input signal INB are changed. Specifically, the capacitance value of the capacitor MCL can be larger than that of the capacitor MCU. Thus, the capacitor MCL having a larger capacitance value causes strong capacitive coupling between the wiring to which the inverted input signal INB is supplied and the node PREOUT when the level of the inverted input signal INB is changed from H level to L level, so that the voltage of the node PREOUT can be decreased. When the level of the input signal IN is changed from L level to H level, owing to the small capacitance value of the capacitor MCU, capacitive coupling between the node PREOUT and the node BOOT can be weak and the level shifter 104 can operate with little decrease in the voltage of the node BOOT. As a result, a current flowing between the source and the drain of the transistor M1 can be higher than a current flowing between the source and the drain of the transistor M3. Moreover, when the voltage of the node BOOT is increased, the capacitance value of the capacitor MCL can be larger than that of the capacitor MCU. A strong bootstrap effect can be produced owing to the increase in the voltage of the node PREOUT; thus, the voltage of the node BOOT can be more likely to increase. As a result, the voltage of the node BOOT is boosted at a higher rate than that of the node PREOUT, so that boosting operation can be performed with the gate-source voltage $V_{gs}$ of the transistor M3 set high. Accordingly, the time required for boosting operation can be reduced.

The capacitor MCU and the capacitor MCL are preferably formed through the same process as the transistors M1 to M6. That is, an oxide semiconductor is preferably used as the semiconductor of the MIS capacitors. With the structure, the level shifter 104 can be formed through the same process as a transistor of a gate driver and a transistor of a pixel portion of a display portion that are formed on a glass substrate in a display device.

Figure 1B:
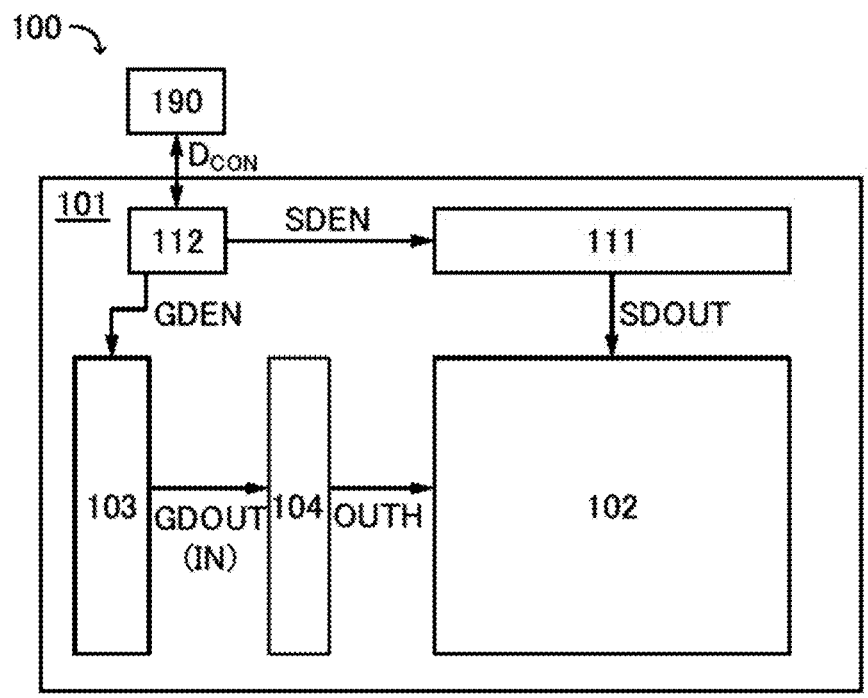

FIG. 1B is a block diagram of a display device including the level shifter 104 illustrated in FIG. 1A.

A display device 100 illustrated in FIG. 1B includes a controller IC 112, a source driver IC 111, the level shifter 104, a gate driver 103, and a display portion 102 over a base 101.

The controller IC 112 can transmit and receive data $D_{CON}$ to/from a host 190 that is not provided over the base 101 through a high-speed communication interface such as low voltage differential signaling (LVDS). The controller IC 112 is effective when including a frame memory, an image processing circuit (a circuit performing image processing such as dimming, toning, and gamma correction), a timing controller, and the like.

In the case where the controller IC 112 is formed by stacking an OS transistor and a transistor formed using single crystal silicon (hereinafter referred to as a Si transistor), an OS transistor can be used for a memory cell of the frame memory. Since the OS transistor has an extremely low off-state current (a leakage current in an off state), power consumption in retaining data can be extremely low by using the OS transistor for the memory cell. Thus, the power consumption of the controller IC can be reduced in IDS driving. The structure in which an OS transistor and a Si transistor are stacked is also effective for the image processing circuit, and the structure can be applied to a scan register composed of a nonvolatile register composed of an OS transistor. The content and algorithm of image processing can be easily changed in the scan register with the above structure by setting a parameter. The timing controller generates a control signal GDEN for controlling operation of the gate driver 103 and a control signal SDEN for controlling operation of the source driver IC 111.

The display portion 102 includes a plurality of pixels. The pixels each include a display element and a pixel circuit for driving the display element. The pixel circuit includes a transistor and a capacitor. Note that, in some cases, description is made on the assumption that the pixel circuit includes the display element.

The source driver IC 111 includes a shift register, a level shifter, an A/D converter circuit, a D/A converter circuit, an amplifier, a buffer, and the like. A transistor included in the source driver IC 111 can be formed over the base 101; however, the transistor needs to operate at high speed. Therefore, it is favorable that the source driver IC 111 is separately formed as an integrated circuit and attached to the base 101. The source driver IC 111 outputs a video signal SDOUT that allows the display element included in the pixel of the display portion 102 to control the luminance in accordance with a grayscale. A high voltage is required for the video signal SDOUT depending on a grayscale.

The gate driver 103 includes a shift register and the like. The gate driver 103 controls on or off of a selection transistor included in the pixel of the display portion 102, and the selection transistor serves as a switch. A high amplitude voltage is required for a scan signal GDOUT output from the gate driver 103.

The level shifter 104 uses the scan signal GDOUT as the input signal IN and inputs the scan signal GDOUT as the output signal OUTH to the display portion 102. The output signal OUTH is a signal having a high amplitude voltage and obtained by boosting the scan signal GDOUT. The transistor of the level shifter 104 can be formed over the substrate as well as the transistor of the pixel of the display portion 102 and can be provided between the gate driver 103 and the display portion 102. Accordingly, providing leading wirings excessively, for example, can be inhibited unlike in the structure in which the scan signal GDOUT is boosted by utilizing the level shifter in the source driver IC. As a result, power consumption, signal delay, or a malfunction can be reduced.

The pixel circuit of the display portion 102, the gate driver 103, and the level shifter 104 that are illustrated in FIG. 1B include transistors formed through the same process over the base 101, and the controller IC 112 and the source driver IC 111 are mounted on the base 101 as integrated circuits. When the structure is employed, IDS driving can be performed only by a circuit on the base 101 without supplying the data $D_{CON}$ from the host 190 through a flexible printed circuit (FPC). In addition to COG, a structure in which a low-voltage timing signal output from the controller IC to the gate driver on the panel is boosted by the level shifter 104 is effective at performing IDS driving only by the circuit on the panel.

<Operation in Structure Example 1>

FIG. 2 is a timing chart for describing operation of the level shifter illustrated in FIG. 1B. FIG. 2 shows signal waveforms of the input signal IN, the inverted input signal INB, the node BOOT, the node PREOUT, and the output signal OUTH. In FIG. 2, a period is divided into periods $t_0$ to $t_3$ in accordance with a change in the voltages of the signals.

Operation in each of the periods $t_0$ to $t_3$ shown in FIG. 2 is illustrated in circuit diagrams and timing charts in FIGS. 3A and 3B, FIGS. 4A and 4B, FIGS. 5A and 5B, and FIGS. 6A and 6B. The period to is a period before the input signal IN is boosted. The period $t_1$ is a period in which the input signal IN is boosted. The period $t_2$ is a period after the input signal IN is boosted. The period $t_3$ is a period after the voltages of the node PREOUT and the wiring for supplying the output signal OUTH are boosted.

For easy understanding, the amplitude voltage of each of the input signal IN and the inverted input signal INB is assumed to be 5 V. That is, description is made on the assumption that each signal is 5 V at H level and 0 V at L level. Moreover, description is made on the assumption that each transistor and each MIS capacitor are of an enhancement type, that is, a normally-off type. The voltage VSS is higher than 0 V and the voltage VDDH is higher than 5 V. Furthermore, description is made on the assumption that an initial voltage of each of the node BOOT, the node PREOUT, and the like is 0 V. In the description of each operation in FIGS. 3A and 3B, FIGS. 4A and 4B, FIGS. 5A and 5B, and FIGS. 6A and 6B, a transistor in an off state or a MIS capacitor not functioning as a capacitor (having a small capacitance value) is marked with a cross mark, and a transistor in an on state or a MIS capacitor functioning as a capacitor (having a large capacitance value) is not marked with a cross mark.

Figure 3A:
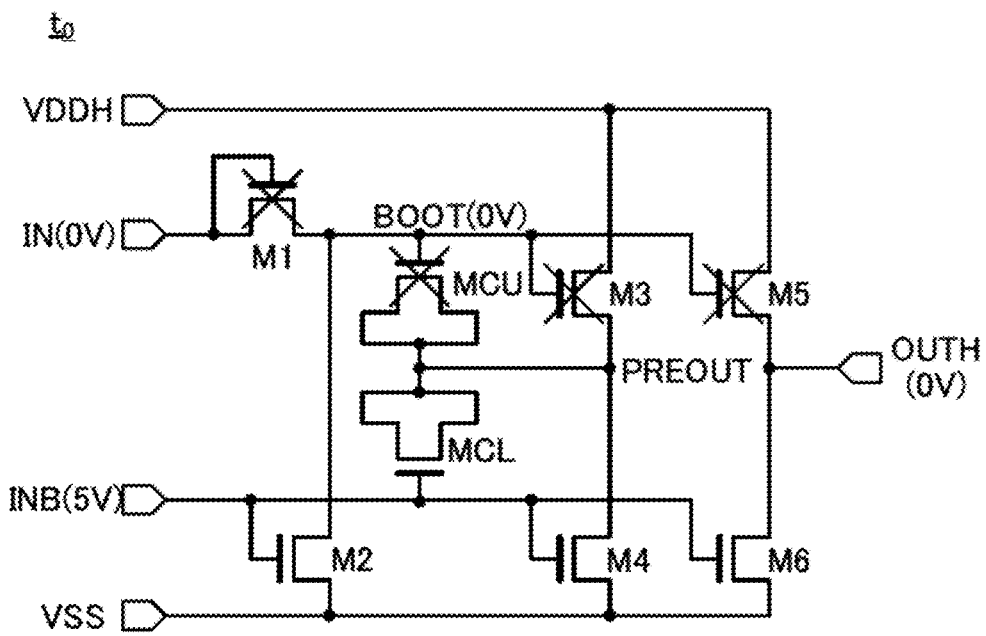
FIGS. 3A and 3B are a circuit diagram and a timing chart illustrating an operation example of a semiconductor device.
Figure 3B:
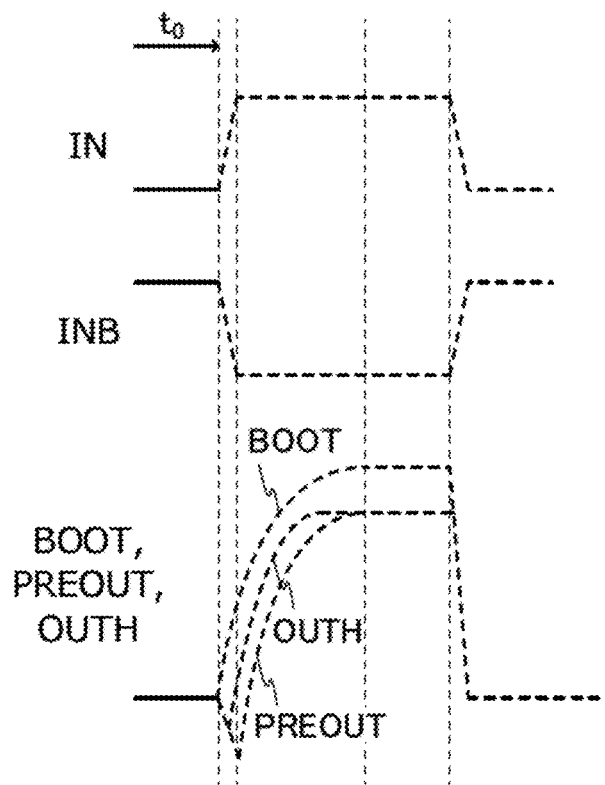

First, the operation in the period to is described with reference to the circuit diagram and the timing chart of FIGS. 3A and 3B. In the period to, the input signal IN is 0 V and the inverted input signal INB is assumed to be 5 V. Accordingly, the transistors M1, M3, and M5 are in an off state and the transistors M2, M4, and M6 are in an on state. The capacitor MCU has a small capacitance value and the capacitor MCL has a large capacitance value. Therefore, the voltages of the node BOOT, the node PREOUT, and the output signal OUTH are 0 V.

Figure 4A:
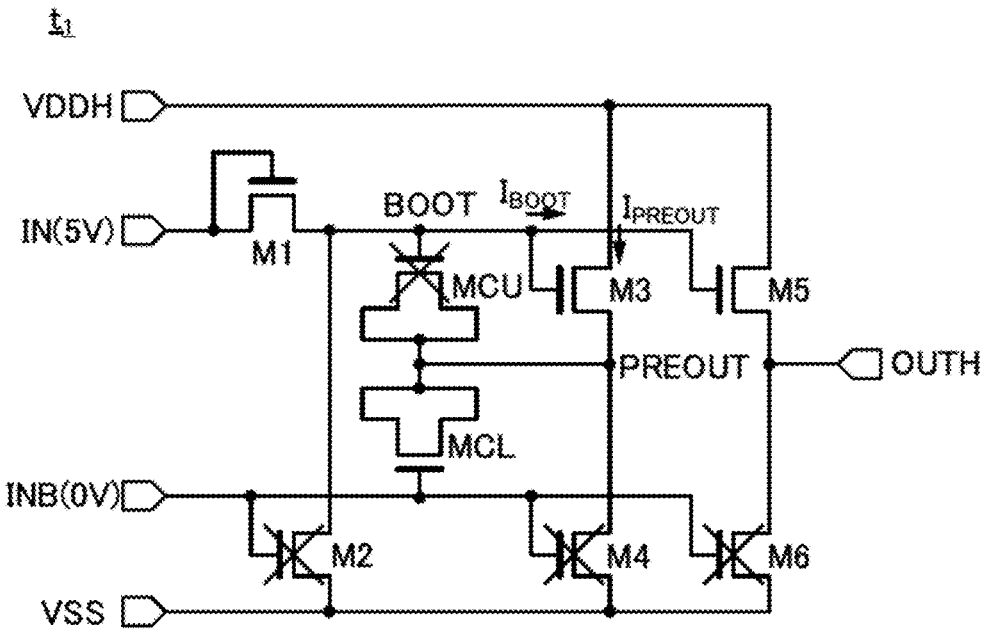
FIGS. 4A and 4B are a circuit diagram and a timing chart illustrating an operation example of a semiconductor device.
Figure 4B:
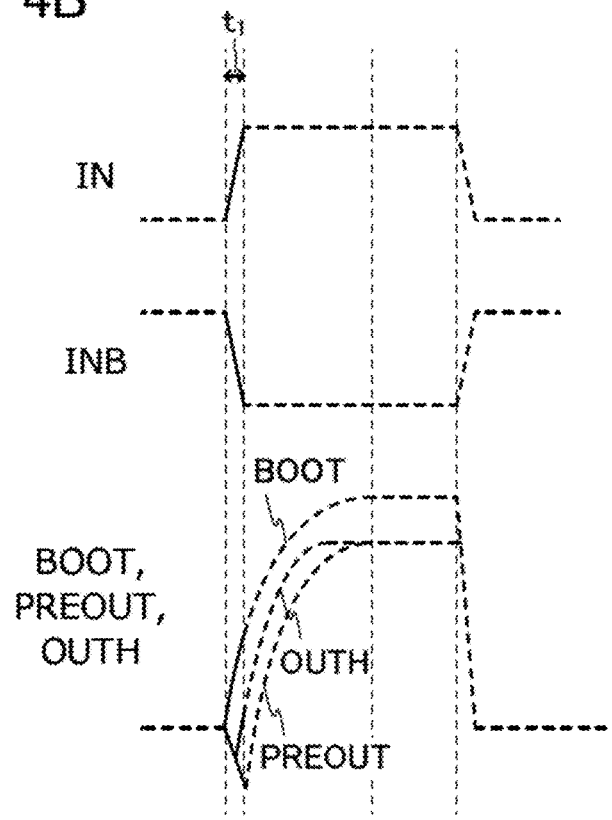

Next, the operation in the period $t_1$ is described with reference to the circuit diagram and the timing chart of FIGS. 4A and 4B. In the period $t_1$, the input signal IN is changed from 0 V to 5 V and the inverted input signal INB is changed from 5 V to 0 V. Accordingly, the transistors M1, M3, and M5 are shifted from an off state to an on state and the transistors M2, M4, and M6 are shifted from an on state to an off state.

At the time when the period $t_1$ starts, the capacitance value of the capacitor MCL is large and the capacitance value of the capacitor MCU is small. Thus, the capacitor MCL having a larger capacitance value causes strong capacitive coupling between the wiring to which the inverted input signal INB is supplied and the node PREOUT when the inverted input signal INB is changed from 5 V to 0 V, so that the voltage of the node PREOUT is decreased. At the time when the voltage of the node PREOUT is decreased, the capacitance value of the capacitor MCU is small, so that the capacitive coupling between the node PREOUT and the node BOOT is weak and the voltage of the node BOOT is hardly decreased. When capacitive coupling is caused at the node PREOUT, the gate-source voltage $V_{gs}$ of the transistor M1 is approximately 5 V, so that a current ($I_{BOOT}$) flowing between the source and the drain is increased. The gate-source voltage $V_{gs}$ of the transistor M3 is slightly higher than the threshold voltage $V_{th}$, so that a current ($I_{PREOUT}$) flowing between the source and the drain is low. Accordingly, the voltage of the node BOOT is boosted at a higher rate than that of the node PREOUT and the gate-source voltage $V_{gs}$ of the transistor M3 is increased.

Figure 5A:
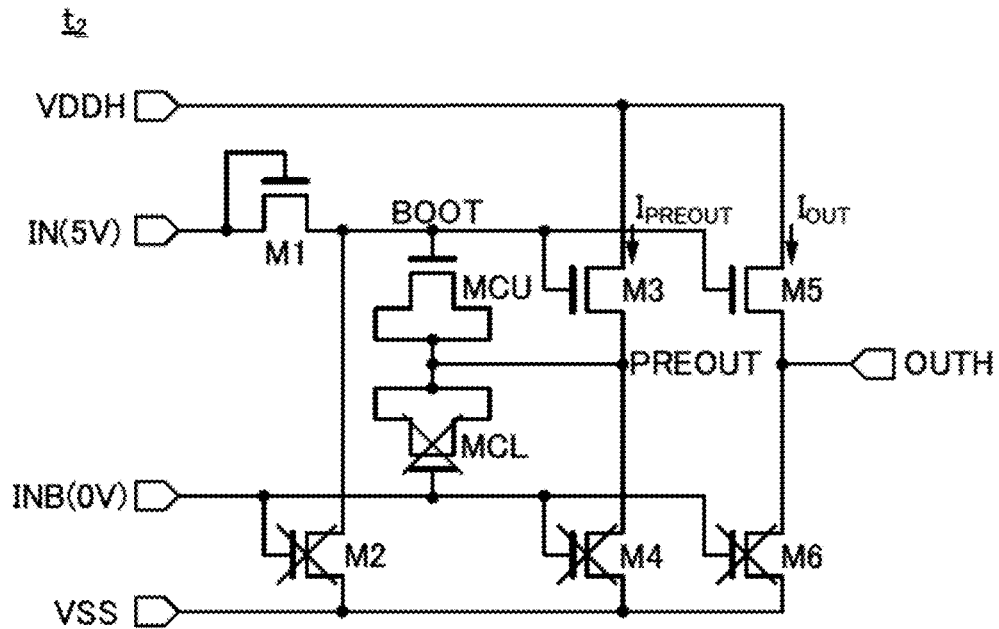
FIGS. 5A and 5B are a circuit diagram and a timing chart illustrating an operation example of a semiconductor device.
Figure 5B:
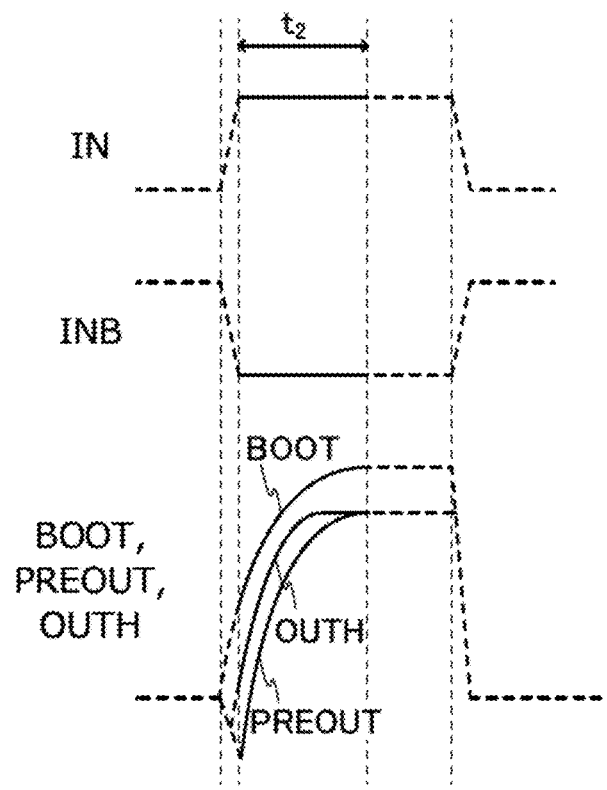

Then, the operation in the period $t_2$ is described using the circuit diagram and the timing chart of FIGS. 5A and 5B. The period $t_2$ is a period after the voltage is changed in the period $t_1$. Since the gate-source voltage $V_{gs}$ of the transistor M3 is increased after the above-described period $t_1$, a current ($I_{PREOUT}$) flowing into the node PREOUT is increased and the voltage of the node PREOUT is increased. The gate-source voltage $V_{gs}$ of the transistor M3 is also a voltage held in the capacitor MCU; thus, the capacitor MCU functions and the capacitance value of the capacitor MCU becomes large. When the voltage of the node PREOUT is increased and the voltage held in the capacitor MCL is decreased, or specifically, becomes smaller than the threshold voltage of the MIS capacitor, the capacitor MCL does not function and the capacitance value of the capacitor MCL becomes small. Thus, a strong bootstrap effect is produced owing to the increase in the voltage of the node PREOUT, so that the voltage of the node BOOT is increased. Furthermore, the currents ($I_{PREOUT}$ and $I_{OUT}$) flow between the source and the drain of each of the transistors M3 and M5, and the voltage of the node PREOUT and the voltage of a wiring for supplying the output signal OUTH are increased.

Figure 6A:
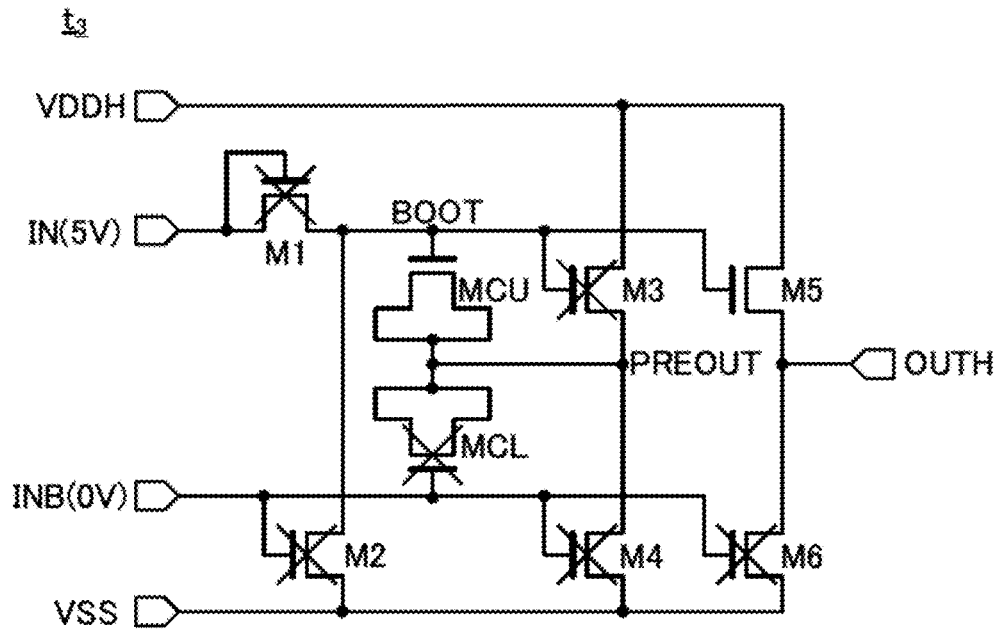
FIGS. 6A and 6B are a circuit diagram and a timing chart illustrating an operation example of a semiconductor device.
Figure 6B:
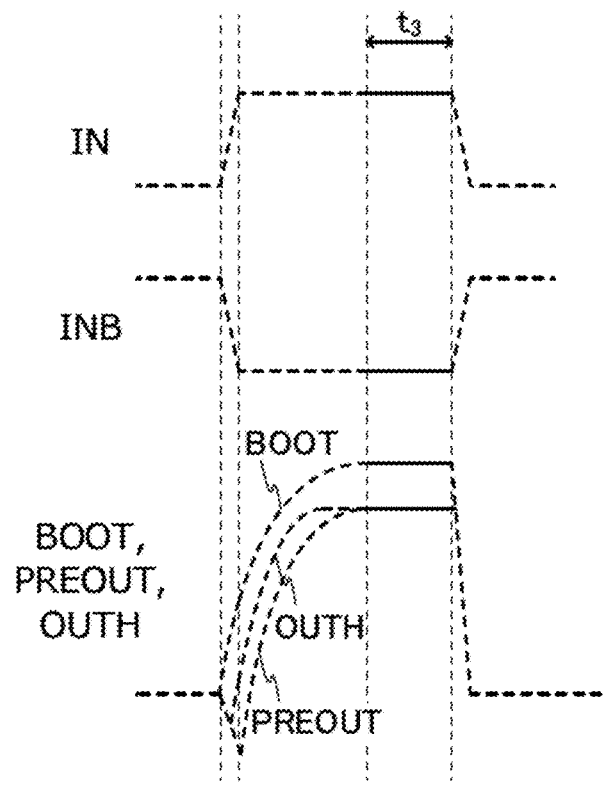

Next, the operation in the period $t_3$ is described using the circuit diagram and the timing chart of FIGS. 6A and 6B. The period $t_3$ is a period after the voltages of the node PREOUT and the wiring for supplying the output signal OUTH are boosted. In the period $t_3$, the bootstrap effect ceases when the voltage of the node PREOUT is increased to the voltage VDDH, and boosting operation is terminated when the voltage of the node PREOUT and the voltage of the wiring for supplying the output signal OUTH become the voltage VDDH.

<Modification Examples of Structure Example 1>

Figure 7A:
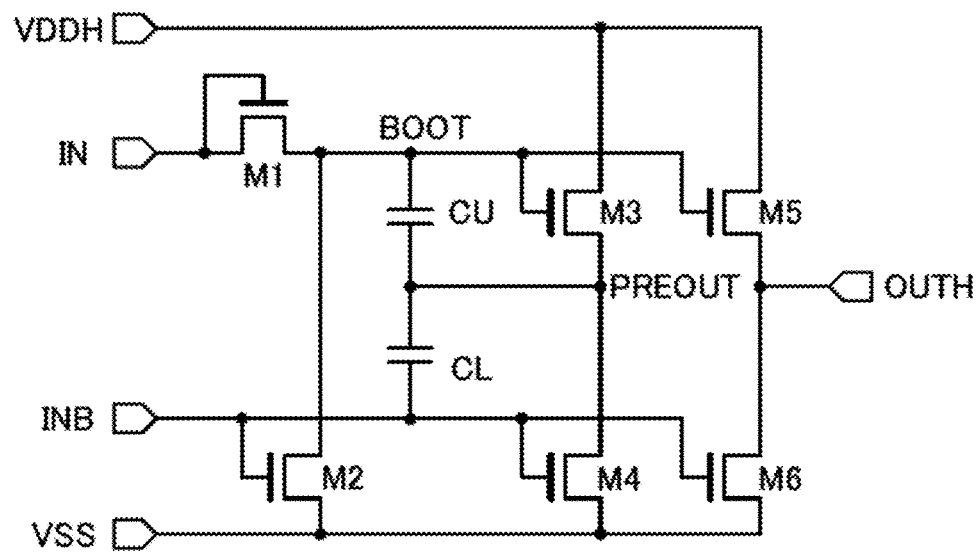
FIGS. 7A and 7B are circuit diagrams illustrating an operation example of a semiconductor device.

FIG. 7A illustrates a modification example of the semiconductor device in FIG. 1A that serves as a level shifter. In a circuit diagram of FIG. 7A, MIM capacitors in which metal, an insulator, and metal are stacked are used as the capacitor MCU and the capacitor MCL instead of the MIS capacitors, which are used in FIG. 1A. The capacitors in FIG. 7A are illustrated as a capacitor CU and a capacitor CL.

The capacitor CU and the capacitor CL illustrated in FIG. 7A are MIM capacitors. Therefore, the capacitance values of the capacitor CU and the capacitor CL are not changed in accordance with the voltages of the node BOOT, the node PREOUT, and the inverted input signal INB. Accordingly, the effect of bootstrap operation utilizing the difference between the capacitance value of the capacitor MCU and the capacitance value of the capacitor MCL as illustrated in FIG. 1A is small.

On the other hand, in the configuration of FIG. 7A, the capacitive coupling between the wiring to which the inverted input signal INB is supplied and the node PREOUT and the capacitive coupling between the node BOOT and the node PREOUT can be stronger than the capacitive coupling between the wiring to which the inverted input signal INB is supplied and the node BOOT. This is because the capacitance value between the wiring to which the inverted input signal INB is supplied and the node BOOT can be smaller than the capacitive value between the wiring to which the inverted input signal INB and the node PREOUT and the change in the capacitive coupling at the node BOOT can be small when the capacitance value of the capacitor CU and the capacitance value of the capacitor CL are the same. Thus, the semiconductor device having the configuration of FIG. 7A can have the same function as the semiconductor device of FIG. 1A.

Figure 7B:
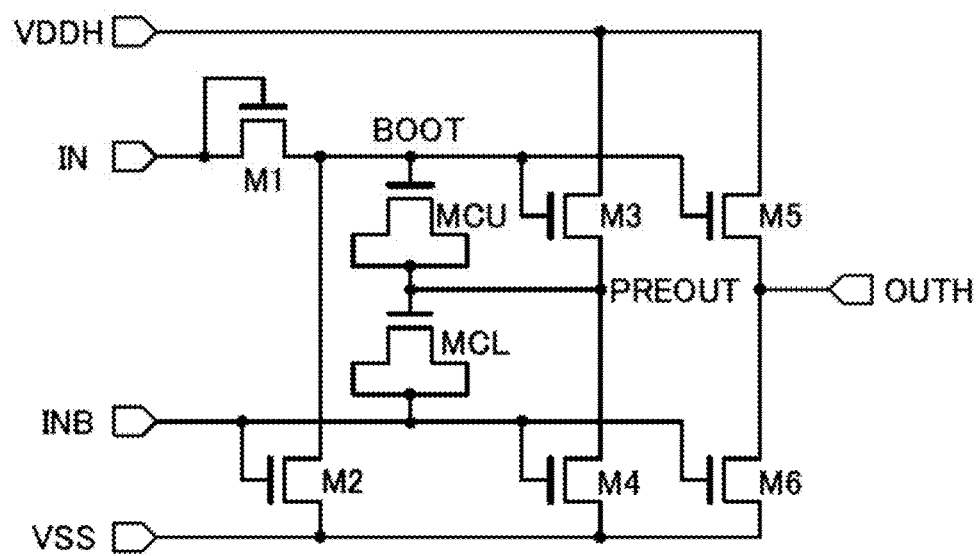

FIG. 7B is a modification example of the semiconductor device illustrated in FIG. 1A that serves as a level shifter. In a circuit diagram in FIG. 7B, the connection relation between the capacitor MCL and other elements in FIG. 1A is changed.

In the configuration illustrated in FIG. 7B, although the capacitance values of the capacitor MCU and the capacitor MCL are changed in accordance with the voltages of the node BOOT, the node PREOUT, and the inverted input signal INB, the change is smaller than the difference between the capacitance value of the capacitor MCU of FIG. 1A and the capacitance value of the capacitor MCL of FIG. 1A; thus, the effect of bootstrap operation is small.

On the other hand, the magnitude relationship among the voltages of the nodes and the wiring of the structure of FIG.

7B when the input signal IN is boosted is as follows: the voltage of the node BOOT>the voltage of the node PREOUT>the voltage of the wiring to which the inverted input signal INB is supplied. Therefore, the capacitive coupling between the wiring to which the inverted input signal INB is supplied and the node PREOUT and the capacitive coupling between the node BOOT and the node PREOUT can be higher than the capacitive coupling between the wiring to which the inverted input signal INB is supplied and the node BOOT. The change in the capacitive coupling is because that the capacitance value between the wiring to which the inverted input signal INB is supplied and the node BOOT is small when the capacitance value of the capacitor MCU and the capacitance value of the capacitor MCL are the same. Thus, the semiconductor device having the configuration of FIG. 7B can have the same function as the semiconductor device of FIG. 1A.

Figure 8A:
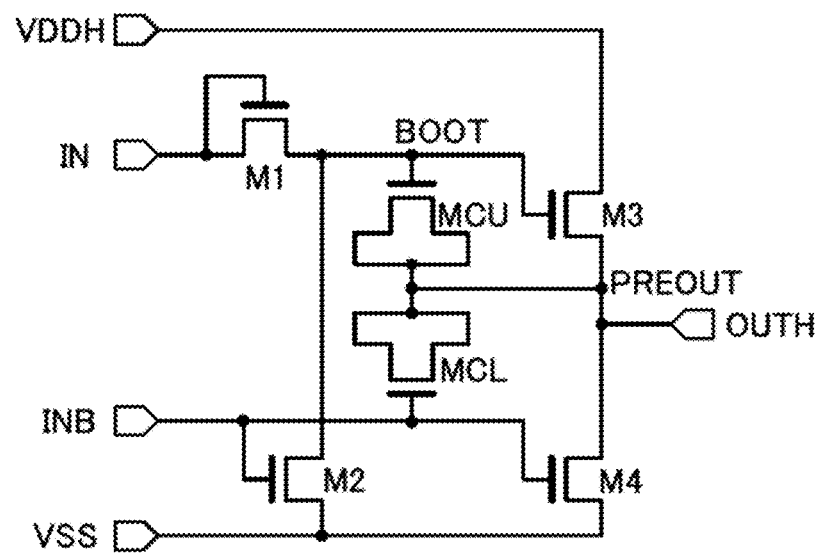
FIGS. 8A and 8B are circuit diagrams illustrating an operation example of a semiconductor device.

FIG. 8A is a modification example of the semiconductor device illustrated in FIG. 1A that serves as a level shifter. A circuit diagram in FIG. 8A illustrates a circuit in which the transistor M5 and the transistor M6 that are on an output stage of the circuit of FIG. 1A are not provided. With the circuit configuration, a semiconductor device in which the number of transistors is smaller than that of the semiconductor device of FIG. 1A by two can be provided. Note that in FIG. 8A, although the boosting rate may be changed by influence of the capacitor or the like connected to the wiring for supplying the output signal OUTH, the semiconductor device having the configuration of FIG. 8A can have the same function as the semiconductor device of FIG. 1A.

Figure 8B:
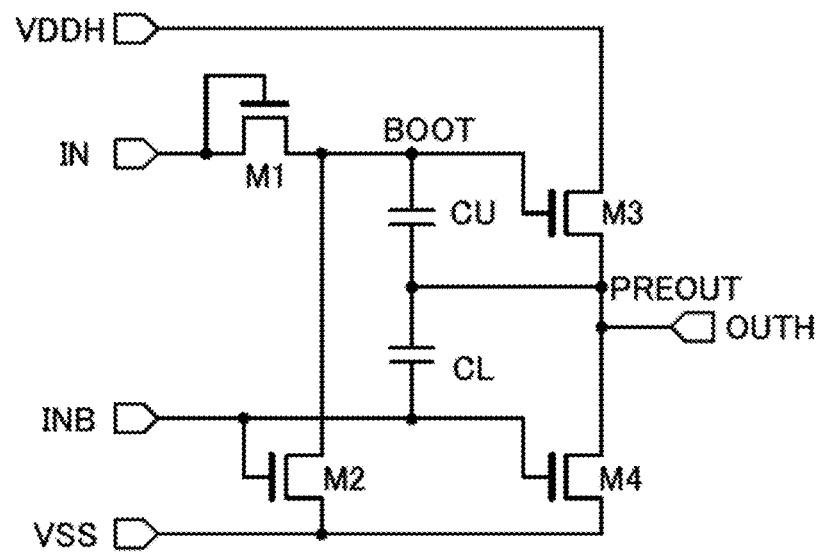

FIG. 8B is a modification example of the semiconductor device illustrated in FIG. 7A that serves as a level shifter. A circuit diagram in FIG. 8B illustrates a circuit in which the transistor M5 and the transistor M6 that are on an output stage of the circuit of FIG. 7A are not provided. With the circuit configuration, a semiconductor device in which the number of transistors is smaller than that of the semiconductor device of FIG. 7A by two can be provided. Note that in FIG. 8B, although the boosting rate may be changed by influence of the capacitor or the like connected to the wiring for supplying the output signal OUTH, the semiconductor device having the configuration of FIG. 8B can have the same function as the semiconductor device of FIG. 7A.

Figure 9:
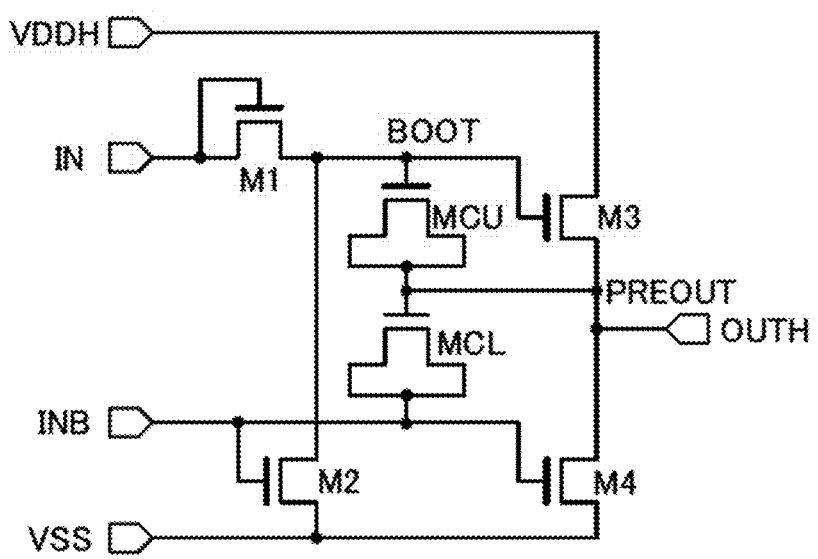
FIG. 9 is a circuit diagram illustrating an operation example of a semiconductor device.

FIG. 9 is a modification example of the semiconductor device illustrated in FIG. 7B that serves as a level shifter. A circuit diagram in FIG. 9 illustrates a circuit in which the transistor M5 and the transistor M6 that are on an output stage of the circuit of FIG. 7B are not provided. With the circuit configuration, a semiconductor device in which the number of transistors is smaller than that of the semiconductor device of FIG. 7B by two can be provided. Note that in FIG. 9, although the boosting rate may be changed by influence of the capacitor or the like connected to the wiring for supplying the output signal OUTH, the semiconductor device having the configuration of FIG. 9 can have the same function as the semiconductor device of FIG. 7B.

<Structure Example 2>

Figure 10A:
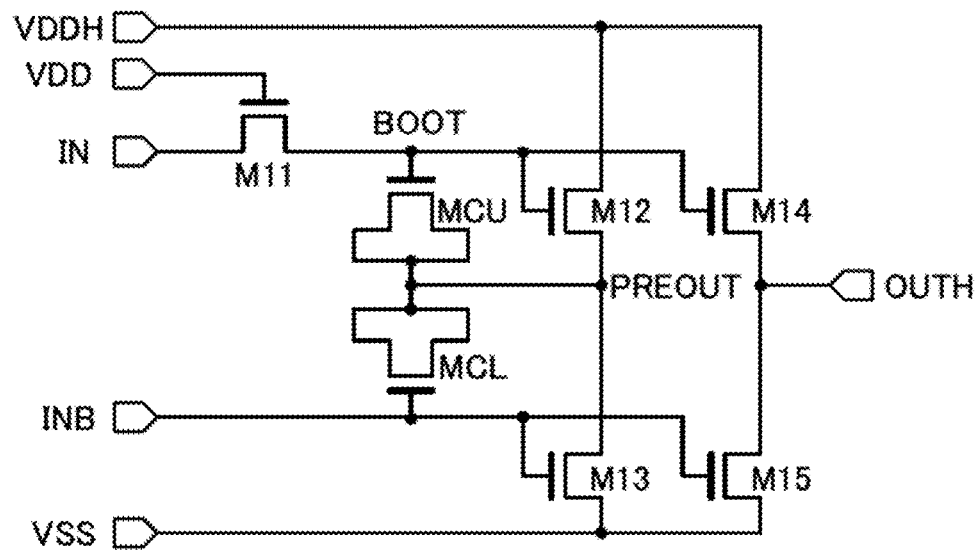
FIGS. 10A and 10B are a circuit diagram and a timing chart illustrating an operation example of a semiconductor device.

FIG. 10A is a circuit diagram of a level shifter 104A that is a semiconductor device of one embodiment of the present invention and having a different structure from that of FIG. 1A.

The level shifter 104A includes transistors M11 to M15, the capacitor MCU, and the capacitor MCL. FIG. 10A illustrates the input signal IN, the inverted input signal INB, the output signal OUTH, the voltage VDDH, the voltage VDD, the voltage VSS, the node BOOT, and the node PREOUT.

A wiring to which the input signal IN is supplied is connected to one of a source and a drain of the transistor M11. A wiring to which the voltage VDD is supplied is connected to a gate of the transistor M11. The wiring to which the inverted input signal INB is supplied is connected to a gate of the transistor M13, a gate of the transistor M15, and the first electrode of the capacitor MCL. The wiring to which the voltage VDDH is supplied is connected to one of a source and a drain of the transistor M12 and one of a source and a drain of the transistor M14. A wiring to which the voltage VSS is supplied is connected to one of a source and a drain of the transistor M13 and one of a source and a drain of the transistor M15. The first electrode of the capacitor MCU is connected to the other of the source and the drain of the transistor M11, a gate of the transistor M12, and a gate of the transistor M14. The second electrode of the capacitor MCU is connected to the second electrode of the capacitor MCL, the other of the source and the drain of the transistor M12, and the other of the source and the drain of the transistor M13. The wiring for outputting the output signal OUTH is connected to the other of the source and the drain of the transistor M14 and the other of the source and the drain of the transistor M15.

The input signal IN and the inverted input signal INB at H level each correspond to a voltage VDD and those at L level each correspond to the voltage VSS (<VDD). The voltage VDD is a potential higher than the threshold voltage of the transistor M11. The voltage VSS is a reference potential, for example, a ground potential or a potential of 0 V. The input signal IN is a digital signal. The inverted input signal INB is a signal whose logic is the inverted logic of the input signal IN. The output signal OUTH is a signal having the same logic as the input signal IN. The output signal OUTH at H level corresponds to the voltage VDDH (>VDD) and that at L level corresponds to the voltage VSS. That is, the level shifter 104A is a circuit having a function of generating the output signal OUTH that is obtained by boosting the amplitude voltage of the input signal IN.

With the structure of FIG. 10A, a signal can be generated by boosting the voltages of the input signal IN and the inverted input signal INB by the voltage VDDH, the voltage VDD, and the voltage VSS. Therefore, although the number of required voltages is larger than that for the structure of FIG. 1A, a semiconductor device serving as a level shifter can be formed using a small number of transistors.

The node BOOT corresponds to the node to which the first electrode of the capacitor MCU is connected, that is, a node to which the other of the source and the drain of the transistor M11, the gate of the transistor M12, and the gate of the transistor M14 are connected. The node PREOUT corresponds to the node to which the second electrode of the capacitor MCU is connected, that is, a node to which the second electrode of the capacitor MCL, the other of the source and the drain of the transistor M12, and the other of the source and the drain of the transistor M13 are connected.

The transistors M11 to M15 can have the same conductivity type. Although the transistors M11 to M15 are n-channel transistors in the example illustrated in FIG. 10A, p-channel transistors can also be used by inverting the logic of each signal. The n-channel transistors used as the transistors M11 to M15 in FIG. 10A are preferably OS transistors.

Each of the capacitor MCU and the capacitor MCL can be a so-called MIS capacitor in which metal, an insulator, and a semiconductor are stacked. When the insulator is an oxide, the capacitor may be referred to as a MOS capacitor. Therefore, as illustrated in FIG. 10A, a source and a drain of a transistor are connected to each other and whether the transistor serves as the capacitor or not can be switched depending on a voltage applied to a gate of the transistor.

With the structure, the capacitance value of the capacitor MCL and the capacitance value of the capacitor MCU can be different in a period in which the voltage of the input signal IN and the voltage of the inverted input signal INB are changed. Specifically, the capacitance value of the capacitor MCL can be larger than that of the capacitor MCU. Thus, the capacitor MCL having a larger capacitance value causes strong capacitive coupling between the wiring to which the inverted input signal INB is supplied and the node PREOUT when the level of the inverted input signal INB is changed from H level to L level, so that the voltage of the node PREOUT can be decreased. When the level of the input signal IN is changed from L level to H level, owing to the small capacitance value of the capacitor MCU, the capacitive coupling between the node PREOUT and the node BOOT can be weak and the level shifter 104A can operate with little decrease in the voltage of the node BOOT. As a result, a current flowing between the source and the drain of the transistor M11 can be higher than a current flowing between the source and the drain of the transistor M13. As a result, the voltage of the node BOOT is boosted at a higher rate than the node PREOUT, so that boosting operation can be performed with the gate-source voltage $V_{gs}$ of the transistor M12 set high. Accordingly, the time required for boosting operation can be reduced.

The capacitor MCU and the capacitor MCL are preferably formed through the same process as the transistors M11 to M15. That is, an oxide semiconductor is preferably used as the semiconductor of the MIS capacitors. With the structure, the level shifter 104A can be formed through the same process as a transistor of a gate driver and a transistor of a pixel portion of a display portion that are formed on a glass substrate in a display device.

The level shifter 104A illustrated in FIG. 10A can be used for the level shifter 104 illustrated in FIG. 1B.

<Operation in Structure Example 2>

Figure 10B:
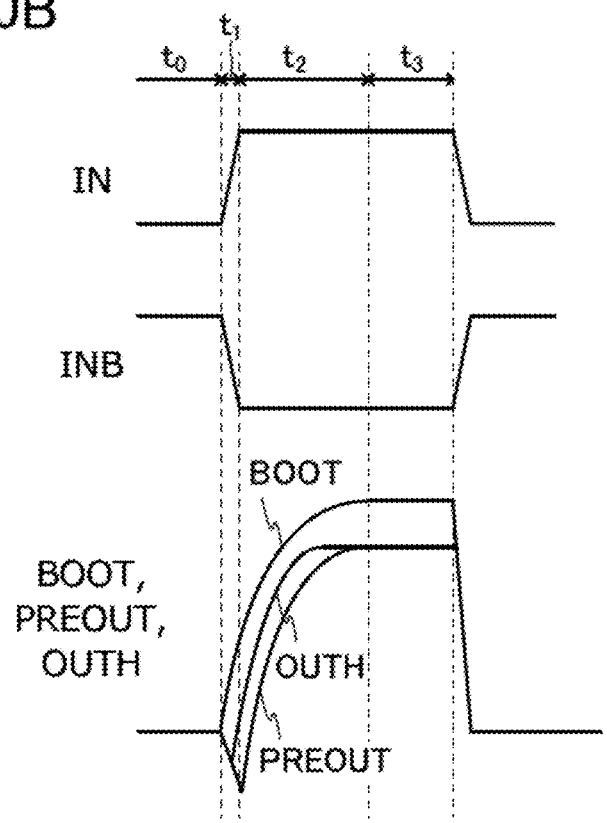

FIG. 10B is a timing chart for describing operation of the level shifter illustrated in FIG. 10A. FIG. 10B shows signal waveforms of the input signal IN, the inverted input signal INB, the node BOOT, the node PREOUT, and the output signal OUTH. In FIG. 10B, as in FIG. 2, a period is divided into the periods $t_0$ to $t_3$ in accordance with a change in voltages of the signals.

Operation in each of the periods $t_0$ to $t_3$ shown in FIG. 10B is illustrated in circuit diagrams and timing charts in FIGS. 11A and 11B, FIGS. 12A and 12B, FIGS. 13A and 13B, and FIGS. 14A and 14B. The period to is a period before the input signal IN is boosted. The period $t_1$ is a period in which the input signal IN is boosted. The period $t_2$ is a period after the input signal IN is boosted. The period $t_3$ is a period after the voltages of the node PREOUT and the wiring for supplying the output signal OUTH are boosted.

For easy understanding, as in FIG. 2, the amplitude voltage of each of the input signal IN and the inverted input signal INB is assumed to be 5 V. That is, description is made on the assumption that each signal is 5 V at H level and 0 V at L level. Moreover, description is made on the assumption that each transistor and each MIS capacitor are of an enhancement type, that is, a normally-off type. The voltage VSS is higher than 0 V and the voltage VDD and the voltage VDDH are higher than 5 V. Furthermore, description is made on the assumption that an initial voltage of each of the node BOOT, the node PREOUT, and the like is 0 V. In the description of each operation in FIGS. 11A and 11B, FIGS.

12A and 12B, FIGS. 13A and 13B, and FIGS. 14A and 14B, a transistor in an off state or a MIS capacitor not functioning as a capacitor (having a small capacitance value) is marked with a cross mark, and a transistor in an on state or a MIS capacitor functioning as a capacitor (having a large capacitance value) is not marked with a cross mark.

Figure 11A:
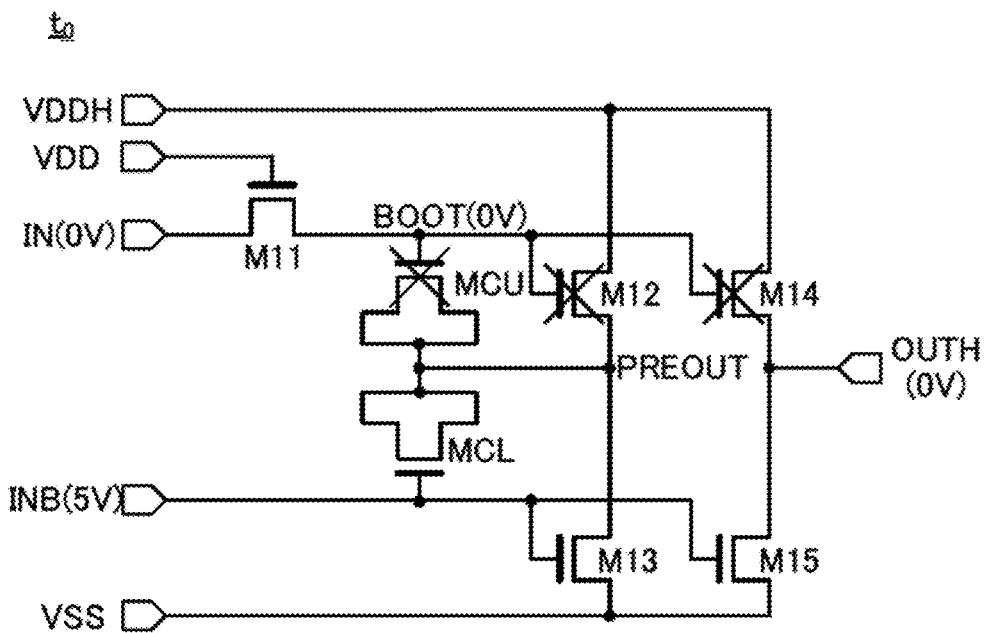
FIGS. 11A and 11B are a circuit diagram and a timing chart illustrating an operation example of a semiconductor device.
Figure 11B:
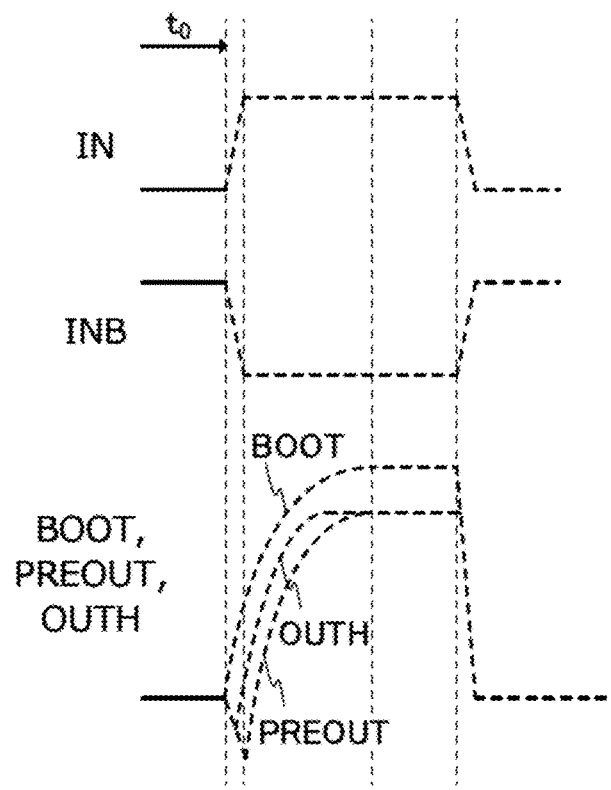

First, the operation in the period to is described with reference to the circuit diagram and the timing chart of FIGS. 11A and 11B. In the period to, the input signal IN is 0 V and the inverted input signal INB is assumed to be 5 V. Accordingly, the transistors M12 and M14 are in an off state and the transistors M11, M13, and M15 are in an on state. The capacitor MCU has a small capacitance value and the capacitor MCL has a large capacitance value. Therefore, the voltages of the node BOOT, the node PREOUT, and the output signal OUTH are 0 V.

Figure 12A:
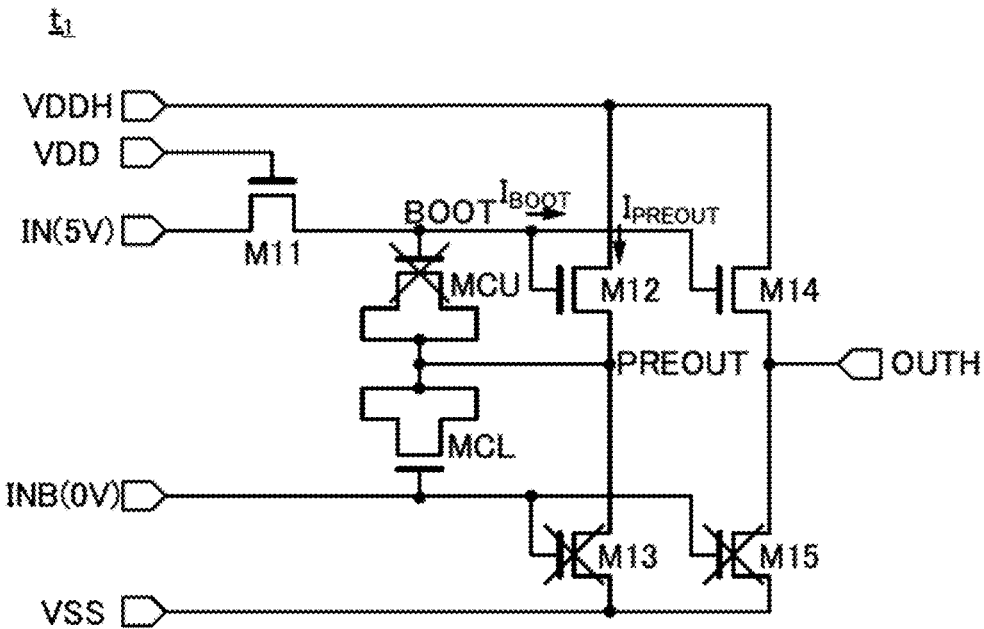
FIGS. 12A and 12B are a circuit diagram and a timing chart illustrating an operation example of a semiconductor device.
Figure 12B:
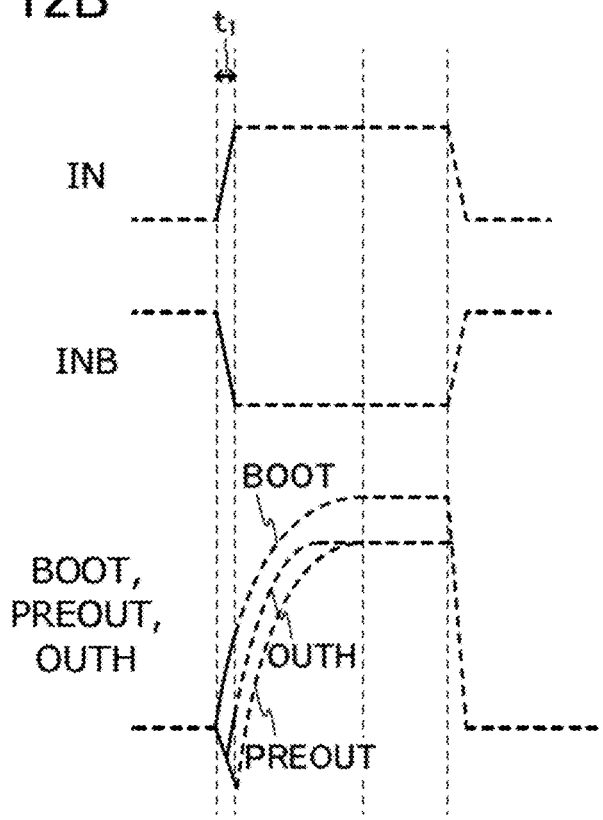

Next, the operation in the period $t_1$ is described using the circuit diagram and the timing chart of FIGS. 12A and 12B. In the period $t_1$, the input signal IN is changed from 0 V to 5 V and the inverted input signal INB is changed from 5 V to 0 V. Accordingly, the transistor M11 is kept in an on state, the transistors M12 and M14 are shifted from an off state to an on state and the transistors M13 and M15 are shifted from an on state to an off state.

At the time when the period $t_1$ starts, the capacitance value of the capacitor MCL is large and the capacitance value of the capacitor MCU is small. Thus, the capacitor MCL having a larger capacitance value causes strong capacitive coupling between the wiring to which the inverted input signal INB is supplied and the node PREOUT when the inverted input signal INB is changed from 5 V to 0 V, so that the voltage of the node PREOUT is decreased. At the time when the voltage of the node PREOUT is decreased, the capacitance value of the capacitor MCU is small, so that the capacitive coupling between the node PREOUT and the node BOOT is weak and the voltage of the node BOOT is hardly decreased. When capacitive coupling is caused at the node PREOUT, the gate-source voltage $V_{gs}$ of the transistor M11 is approximately 5 V, so that a current ($I_{BOOT}$) flowing between the source and the drain is increased. The gate-source voltage $V_{gs}$ of the transistor M12 is slightly higher than the threshold voltage $V_{th}$, so that a current ($I_{PREOUT}$) flowing between the source and the drain is low. Accordingly, the voltage of the node BOOT is boosted at a higher rate than that of the node PREOUT and the gate-source voltage $V_{gs}$ of the transistor M12 is increased.

Figure 13A:
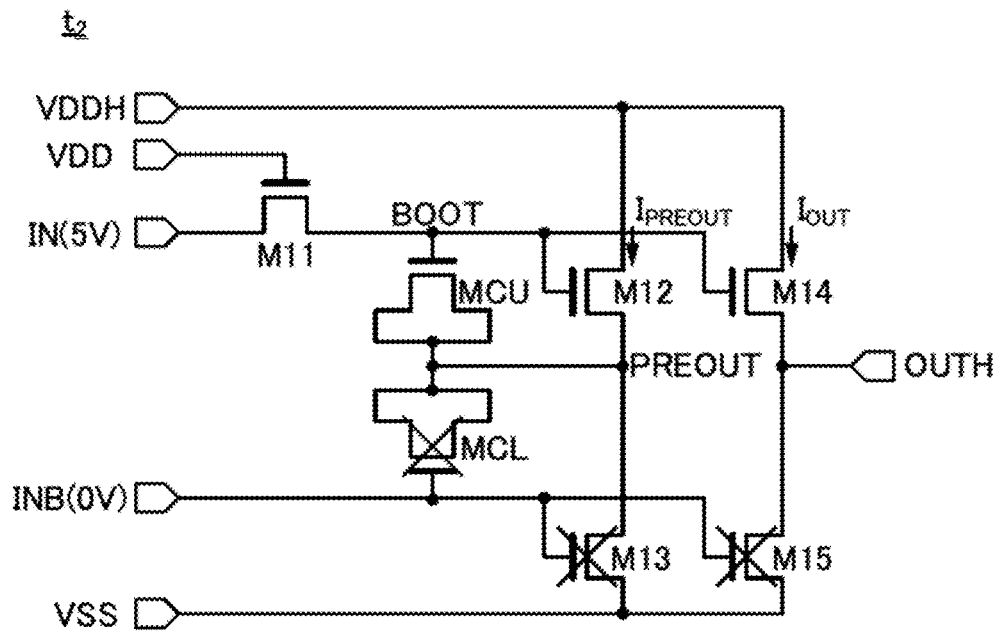
FIGS. 13A and 13B are a circuit diagram and a timing chart illustrating an operation example of a semiconductor device.
Figure 13B:
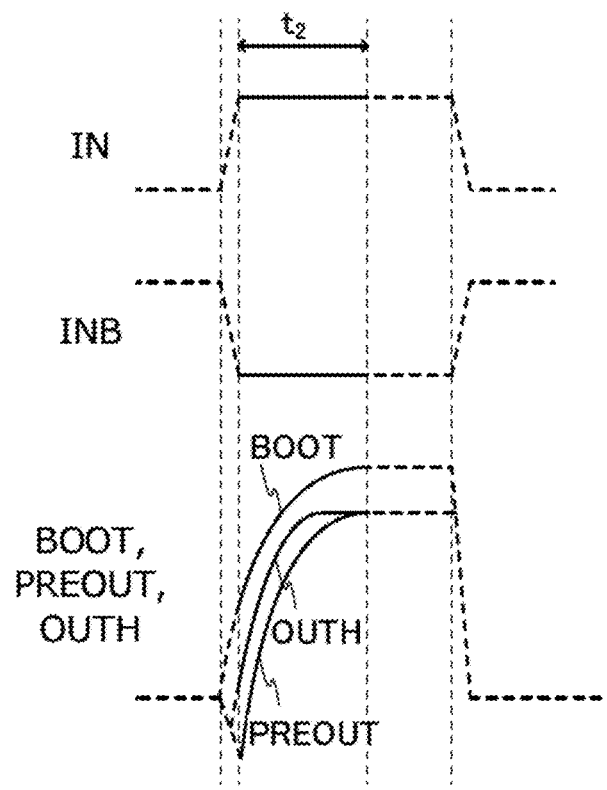

Then, the operation in the period $t_2$ is described using the circuit diagram and the timing chart of FIGS. 13A and 13B. The period $t_2$ is a period after the voltage is changed in the period $t_1$. Since the gate-source voltage $V_{gs}$ of the transistor M12 is increased after the above-described period $t_1$, a current ($I_{PREOUT}$) flowing into the node PREOUT is increased and the voltage of the node PREOUT is increased. The gate-source voltage $V_{gs}$ of the transistor M12 is also a voltage held in the capacitor MCU; thus, the capacitor MCU functions and the capacitance value of the capacitor MCU becomes large. When the voltage of the node PREOUT is increased and the voltage held in the capacitor MCL is decreased, or specifically, becomes smaller than the threshold voltage of the MIS capacitor, the capacitor MCL does not function and the capacitance value of the capacitor MCU becomes small. Thus, a strong bootstrap effect is produced owing to the increase in the voltage of the node PREOUT, so that the voltage of the node BOOT is increased. Furthermore, the currents ($I_{PREOUT}$ and $I_{OUT}$) flow between the source and the drain of each of the transistors M12 and M14, and the voltage of the node PREOUT and the voltage of a wiring for supplying the output signal OUTH are increased.

Figure 14A:
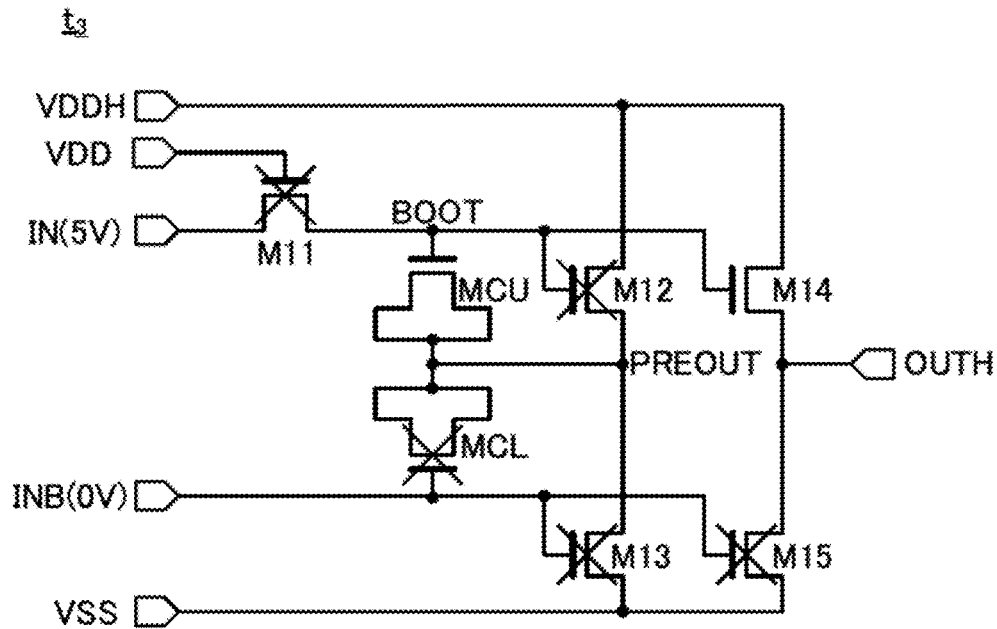
FIGS. 14A and 14B are a circuit diagram and a timing chart illustrating an operation example of a semiconductor device.
Figure 14B:
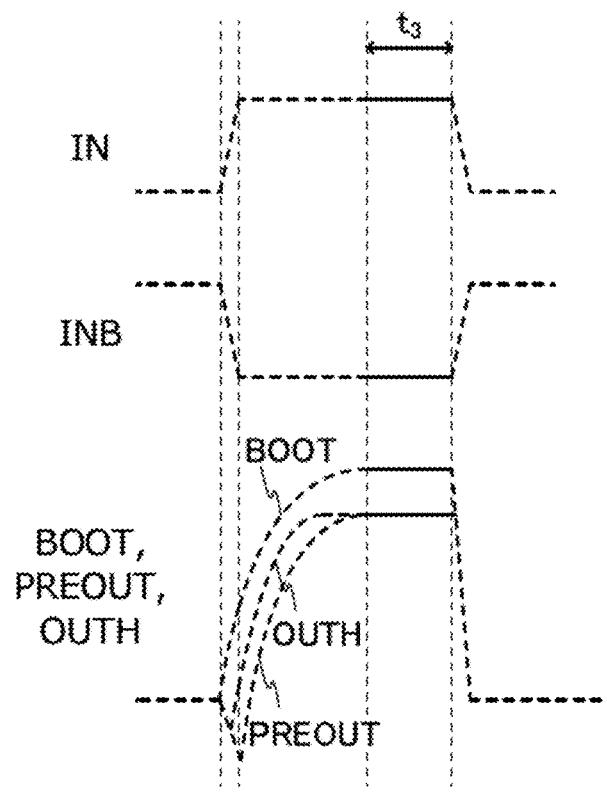

Next, the operation in the period $t_3$ is described using the circuit diagram and the timing chart of FIGS. 14A and 14B. The period $t_3$ is a period after the voltages of the node PREOUT and the wiring for supplying the output signal OUTH are boosted. In the period $t_3$, the bootstrap effect ceases when the voltage of the node PREOUT is increased to the voltage VDDH, and boosting operation is terminated when the voltage of the node PREOUT and the voltage of the wiring for supplying the output signal OUTH become the voltage VDDH.

<Modification Examples of Structure Example 2>

Figure 15A:
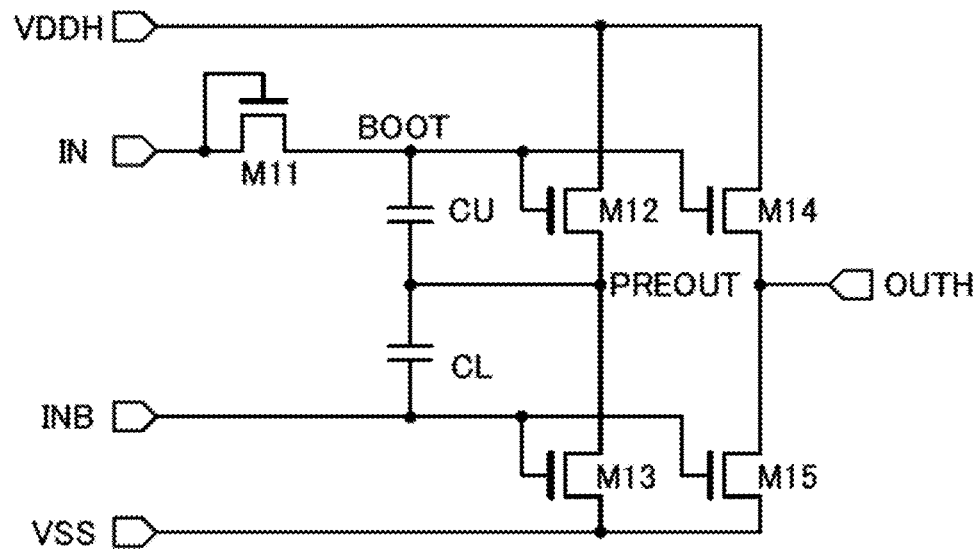
FIGS. 15A and 15B are circuit diagrams illustrating an operation example of a semiconductor device.

FIG. 15A illustrates a modification example of the semiconductor device in FIG. 10A that serves as a level shifter. In a circuit diagram of FIG. 15A, MIM capacitors are used as the capacitor MCU and the capacitor MCL instead of the MIS capacitors, which are used in FIG. 10A. The capacitors in FIG. 15A are illustrated as a capacitor CU and a capacitor CL.

The capacitor CU and the capacitor CL illustrated in FIG. 15A are MIM capacitors. Therefore, the capacitance values of the capacitor CU and the capacitor CL are not changed in accordance with the voltages of the node BOOT, the node PREOUT, and the inverted input signal INB. Accordingly, the effect of bootstrap operation utilizing the difference between the capacitance value of the capacitor MCU and the capacitance value of the capacitor MCL as illustrated in FIG. 15A is small.

On the other hand, in the configuration of FIG. 15A, the capacitive coupling between the wiring to which the inverted input signal INB is supplied and the node PREOUT and the capacitive coupling between the node BOOT and the node PREOUT can be stronger than the capacitive coupling between the wiring to which the inverted input signal INB is supplied and the node BOOT. The change in the capacitive coupling is because that the capacitance value between the wiring to which the inverted input signal INB is supplied and the node BOOT becomes small when the capacitance value of the capacitor CU and the capacitance value of the capacitor CL are the same. Thus, the semiconductor device having the configuration of FIG. 15A can have the same function as the semiconductor device of FIG. 10A.

Figure 15B:
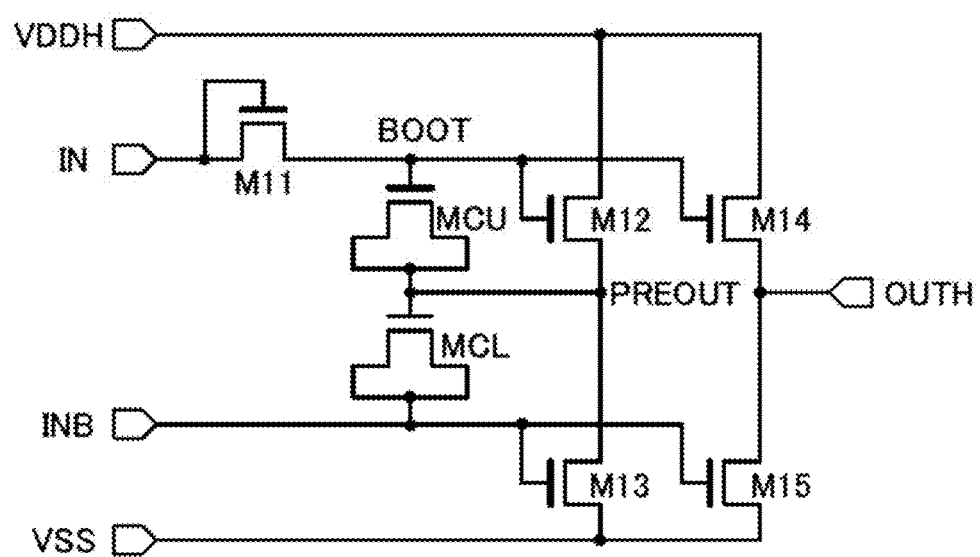

FIG. 15B is a modification example of the semiconductor device illustrated in FIG. 10A that serves as a level shifter. In a circuit diagram in FIG. 15B, the connection relation between the capacitor MCL and other elements in FIG. 10A is changed.

In the configuration in FIG. 15B, although the capacitance values of the capacitor MCU and the capacitor MCL are changed in accordance with the voltages of the node BOOT, the node PREOUT, and the inverted input signal INB, the change is smaller than the difference between the capacitance value of the capacitor MCU of FIG. 10A and the capacitance value of the capacitor MCL of FIG. 10A; thus, the effect of bootstrap operation is small.

On the other hand, the magnitude relationship among the voltages of the nodes and the wiring of the structure of FIG. 15B when the input signal IN is boosted is as follows: the voltage of the node BOOT>the voltage of the node PREOUT>the voltage of the wiring to which the inverted input signal INB is supplied. Therefore, the capacitive coupling between the wiring to which the inverted input signal INB is supplied and the node PREOUT and the capacitive coupling between the node BOOT and the node PREOUT can be higher than the capacitive coupling between the wiring to which the inverted input signal INB is supplied and the node BOOT. The change in the capacitive coupling is because that the capacitance value between the wiring to which the inverted input signal INB is supplied and the node BOOT is small when the capacitance value of the capacitor MCU and the capacitance value of the capacitor MCL are the same. Thus, the semiconductor device having the configuration of FIG. 15B can have the same function as the semiconductor device of FIG. 10A.

Figure 16A:
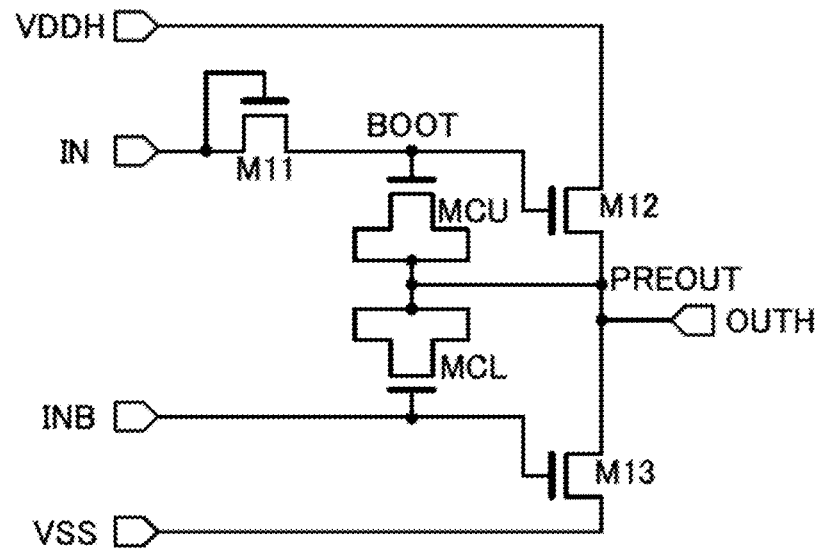
FIGS. 16A and 16B are circuit diagrams illustrating an operation example of a semiconductor device.

FIG. 16A is a modification example of the semiconductor device illustrated in FIG. 15B that serves as a level shifter. A circuit diagram in FIG. 16A illustrates a circuit in which the transistor M14 and the transistor M15 that are on an output stage of the circuit of FIG. 15B are not provided. With the circuit configuration, a semiconductor device in which the number of transistors is smaller than that of the semiconductor device of FIG. 15B by two can be provided. Note that in FIG. 16A, although the boosting rate may be changed by influence of the capacitor or the like connected to the wiring for supplying the output signal OUTH, the semiconductor device having the configuration of FIG. 16A can have the same function as the semiconductor device of FIG. 15B.

Figure 16B:
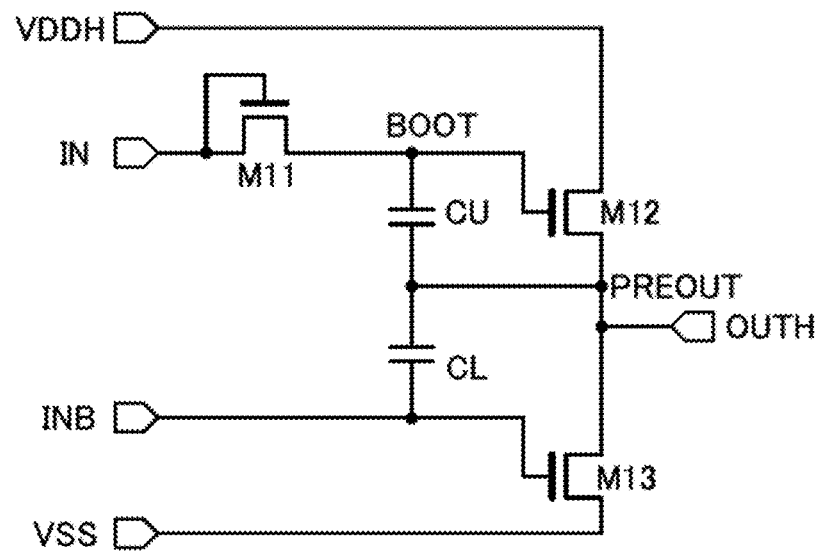

FIG. 16B is a modification example of the semiconductor device illustrated in FIG. 15A that serves as a level shifter. A circuit diagram in FIG. 16B illustrates a circuit in which the transistor M14 and the transistor M15 that are on an output stage of the circuit of FIG. 15A are not provided. With the circuit configuration, a semiconductor device in which the number of transistors is smaller than that of the semiconductor device of FIG. 15A by two can be provided. Note that in FIG. 16B, although the boosting rate may be changed by influence of the capacitor or the like connected to the wiring for supplying the output signal OUTH, the semiconductor device having the configuration of FIG. 16B can have the same function as the semiconductor device of FIG. 15A.

Figure 17:
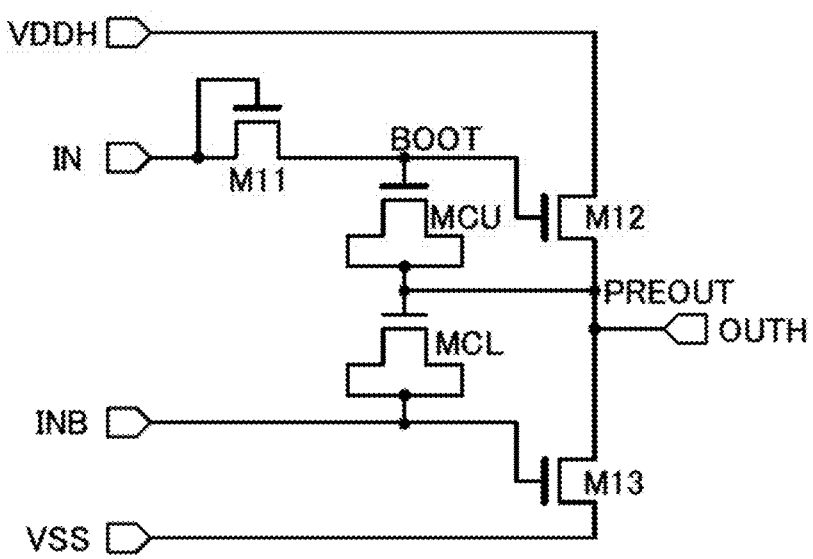
FIG. 17 is a circuit diagram illustrating an operation example of a semiconductor device.

FIG. 17 is a modification example of the semiconductor device illustrated in FIG. 15B that serves as a level shifter. A circuit diagram in FIG. 17 illustrates a circuit in which the transistor M14 and the transistor M15 that are on an output stage of the circuit of FIG. 15B are not provided. With the circuit configuration, a semiconductor device in which the number of transistors is smaller than that of the semiconductor device of FIG. 15B by two can be provided. Note that in FIG. 17, although the boosting rate may be changed by influence of the capacitor or the like connected to the wiring for supplying the output signal OUTH, the semiconductor device having the configuration of FIG. 17 can have the same function as the semiconductor device of FIG. 15B.

The operation speed of the above-described semiconductor device of one embodiment of the present invention can be increased. In addition, the number of wirings of the semiconductor device of one embodiment of the present invention can be reduced. Furthermore, the number of transistors of the semiconductor device of one embodiment of the present invention can be reduced.

At least part of this embodiment can be implemented in combination with any of the other embodiments described in this specification as appropriate.

Embodiment 2

In this embodiment, an appearance of the display device 100 described in Embodiment 1 and a structure example that can be applied to the base 101 will be described.

<External View of Display Device>

Figure 18A:
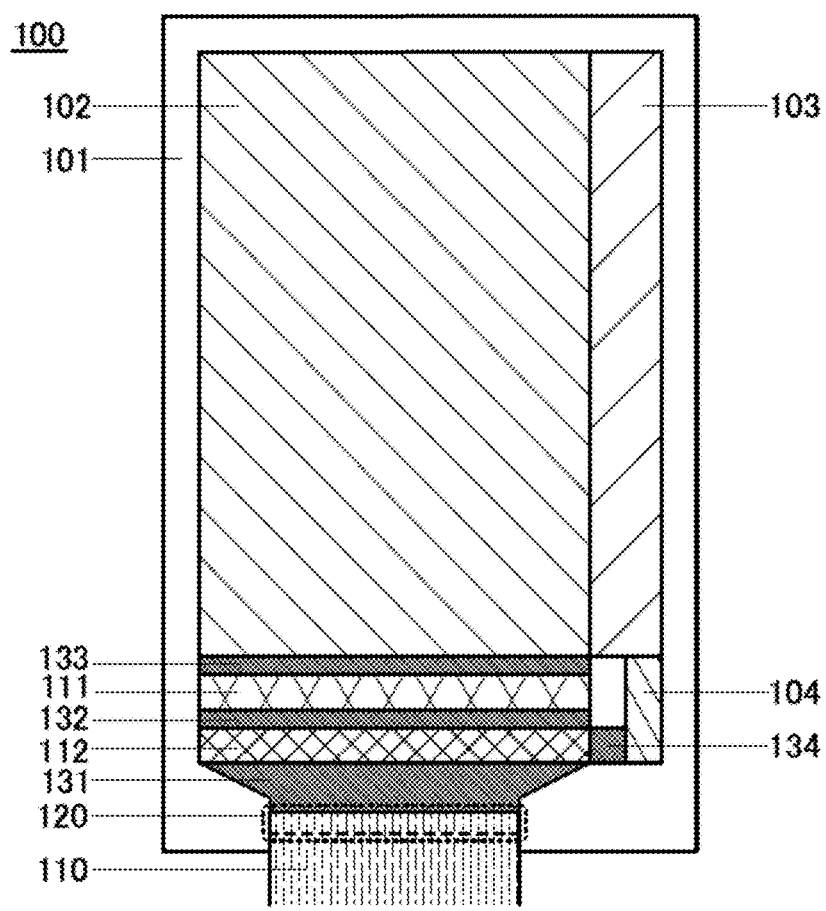
FIGS. 18A and 18B are a top view and a perspective view illustrating an example of a display device.

FIG. 18A illustrates an example of an appearance of the display device described in aforementioned Embodiment 1 on which the level shifter can be mounted. The display device 100 is a display device including one of a liquid crystal element, a light-emitting element, and the like as a display element, and the display element is included in a display portion 102.

Figure 18B:
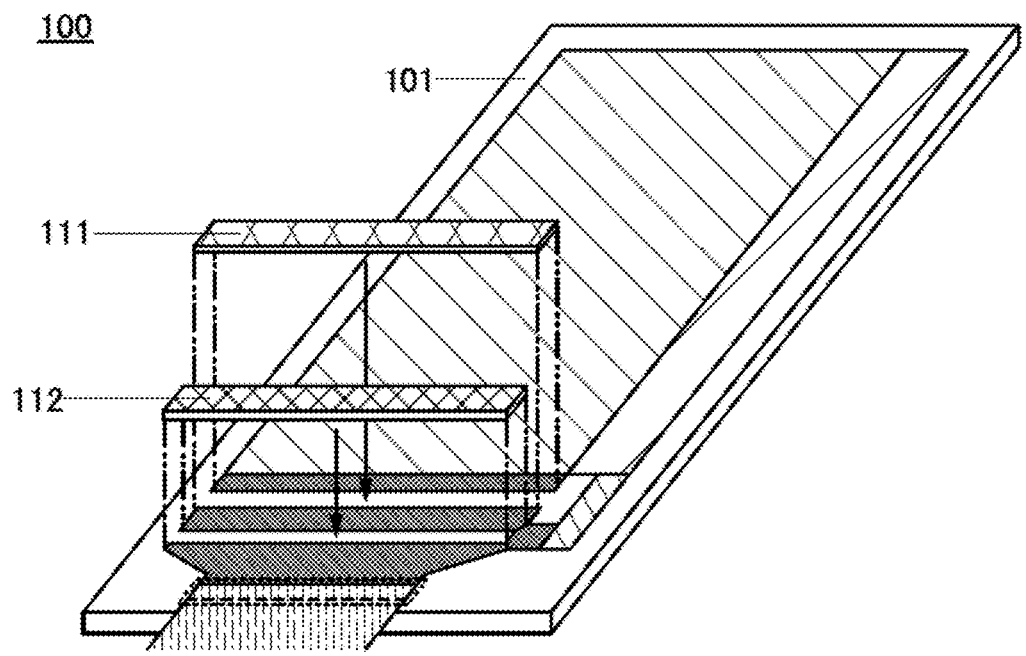

The display device 100 includes the display portion 102, a gate driver 103, a level shifter 104, a source driver IC 111, and a controller IC 112 over the base 101. The display portion 102, the gate driver 103, and the level shifter 104 are formed over the base 101. The source driver IC 111 and the controller IC 112 are mounted as components of an IC chip or the like, over the base 101 with use of an anisotropic conductive adhesive or an anisotropic conductive film by a chip on glass (COG) method. FIG. 18B illustrates a state where the source driver IC 111 and the controller IC 112 are mounted. The display device 100 is electrically connected to a flexible printed circuit (FPC) 110 as a unit for inputting a signal or the like from the outside.

In addition, wirings 131 to 134 are formed over the base 101 so that the circuits are electrically connected to each other. In the display device 100, the controller IC 112 is electrically connected to the FPC 110 through the wiring 131, and the source driver IC 111 is electrically connected to the controller IC 112 through the wiring 132. The display portion 102 is electrically connected to the source driver IC 111 through the wiring 133. The level shifter 104 is electrically connected to the controller IC 112 through the wiring 134.

The gate driver 103 is electrically connected to the display portion 102, and the level shifter 104 is electrically connected to the gate driver 103.

A connection portion 120 between the wiring 131 and the FPC 110 has an anisotropic conductive adhesive or the like, whereby electrical conduction between the FPC 110 and the wiring 131 can be obtained.

The gate driver 103 has a function of selecting a plurality of pixel circuits in the display portion 102, and the source driver IC 111 has a function of transmitting image data to the pixel circuits in the display portion 102.

The display portion 102, the gate driver 103, and the level shifter 104 can be formed, for example, using OS transistors, over the base 101. In other words, a step of forming OS transistors over the base 101 is performed, whereby the display portion 102, the gate driver 103, and the level shifter 104 can be formed.

The source driver IC 111 and the controller IC 112 can be formed, for example, using Si transistors, over the base 101. In the case where IC chips (integrated circuits) for the source driver IC 111 and the controller IC 112 are formed using Si transistors, a Si wafer is preferably used for a base where the Si transistors are formed. Thus, Si transistors are formed over the Si wafer, whereby the source driver IC 111 or the controller IC 112 can be formed.

Although the controller IC 112 will be described in detail in Embodiment 4, the controller IC 112 includes a frame memory, a register, and the like. Such circuits are preferably formed using Si transistors with a logic process (hereinafter referred to as logic Si transistors).

Furthermore, when a circuit storing data, such as a frame memory or a register, is formed, an OS transistor with an extremely low off-state current is preferably used as a transistor holding a potential corresponding to the data. In other words, it is further preferable that the controller IC 112 include a logic Si transistor and an OS transistor. As a specific example, the logic Si transistor is formed on the Si wafer, an interlayer film is formed over the logic Si transistor, and then the OS transistor is formed over the interlayer film.

Although the source driver IC 111 will be described in detail in Embodiment 4, the source driver IC 111 includes a shift register, a level shifter, a digital analog conversion circuit, a buffer, and the like. Such circuits are preferably formed using Si transistors with a process for a driver IC (high withstand-voltage process) (such a Si transistor is hereinafter referred to as a high withstand-voltage Si transistor).

The high withstand-voltage Si transistor has lower resistance to heat treatment than the logic Si transistor in some cases. When the source driver IC 111 is formed using the high withstand-voltage Si transistors and the OS transistors for which heat treatment is necessary, it is difficult to exert the potential performance in some cases. Thus, the source driver IC 111 is preferably formed using only high withstand-voltage Si transistors.

As described above, the controller IC 112 including the logic Si transistors and the OS transistors and the source driver IC 111 including the high withstand-voltage Si transistors are mounted on the base 101 where the OS transistors are formed, so that the transistors having different levels of resistance to heat treatment, i.e., the logic Si transistors, the high withstand-voltage Si transistors, and the OS transistors, can be provided in the display device 100. With such a structure, degradation of transistor characteristics, caused by a difference in heat treatment conditions, can be prevented, and all of the logic Si transistor, the high withstand-voltage Si transistor, and the OS transistor, which have favorable transistor characteristics, can be used in one device. As a result, a display device with high driving performance can be achieved.

Figure 19A:
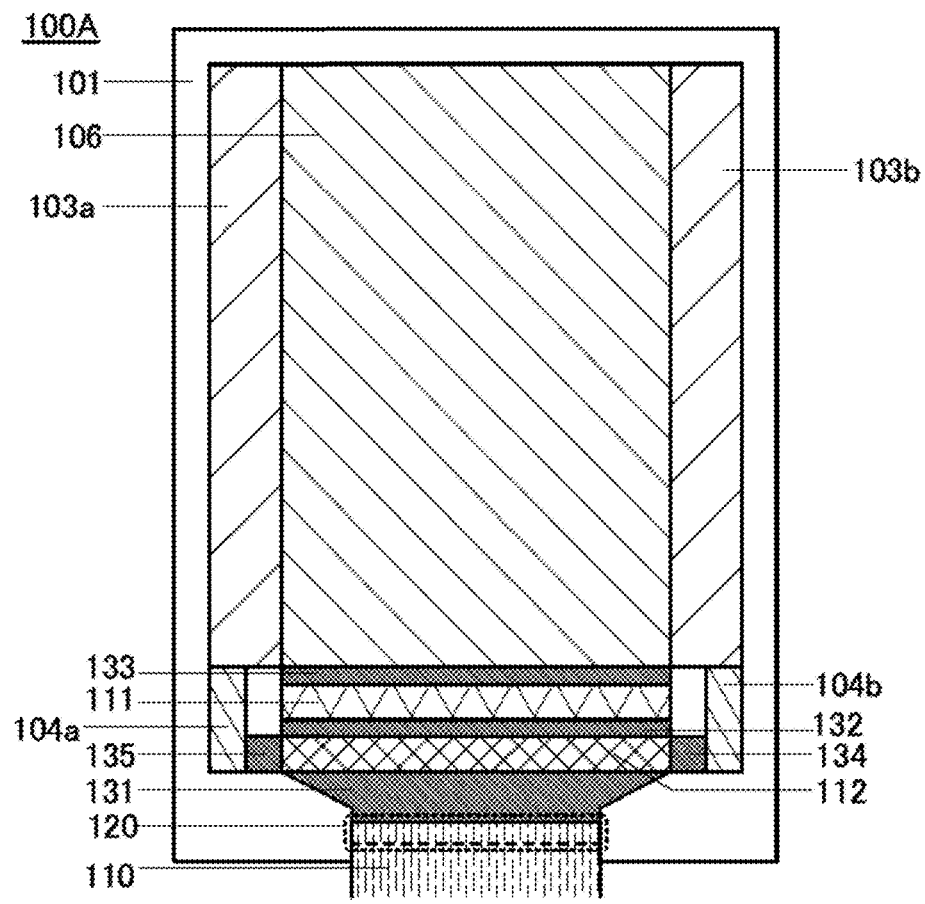
FIGS. 19A and 19B are a top view and a perspective view illustrating an example of a display device.

FIG. 19A illustrates a display device having another structure of the display device 100 in FIG. 18A. A display device 100A is a hybrid display device including a reflective element and a light-emitting element as display elements. The reflective element and the light-emitting element are included in a display portion 106.

Figure 19B:
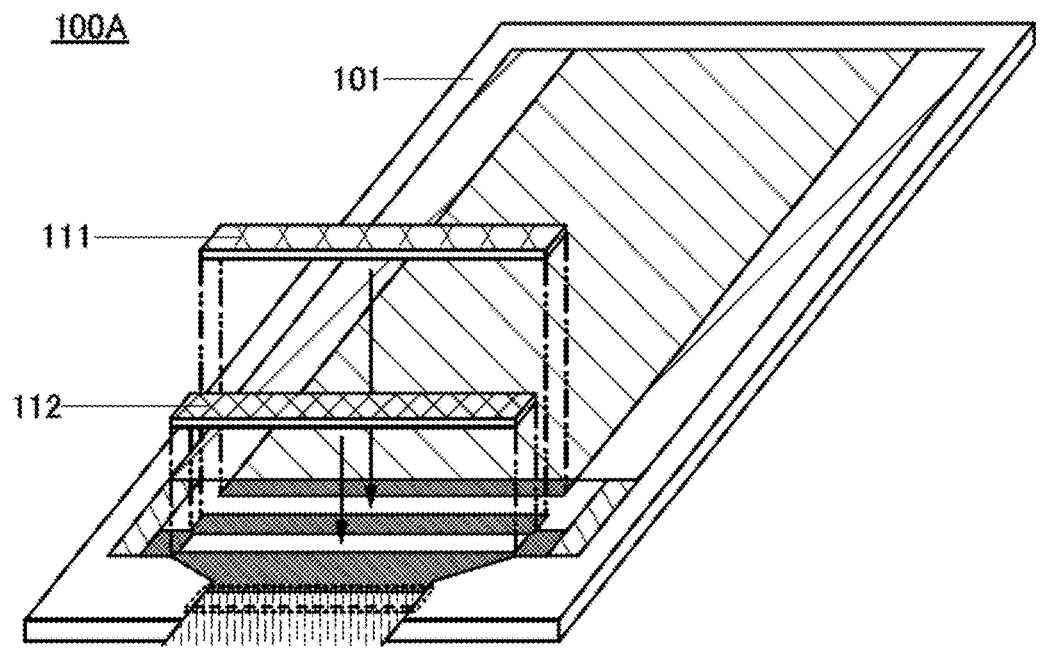

The display device 100A includes the display portion 106, a gate driver 103a, a gate driver 103b, a level shifter 104a, a level shifter 104b, the source driver IC 111, and the controller IC 112 over the base 101. The display portion 106, the gate driver 103a, the gate driver 103b, the level shifter 104a, and the level shifter 104b are formed over the base 101. The source driver IC 111 and the controller IC 112 are mounted as components of an IC chip or the like, on the base 101, using an anisotropic conductive adhesive or an anisotropic conductive film by a COG method. FIG. 19B illustrates a state where the source driver IC 111 and the controller IC 112 are mounted. The display device 100A is electrically connected to the FPC 110 as a unit for inputting a signal or the like from the outside.

In addition, wirings 131 to 135 are formed over the base 101 so that the circuits are electrically connected to each other. In the display device 100, the controller IC 112 is electrically connected to the FPC 110 through the wiring 131, and the source driver IC 111 is electrically connected to the controller IC 112 through the wiring 132. The display portion 106 is electrically connected to the source driver IC 111 through the wiring 133. The level shifter 104a is electrically connected to the controller IC 112 through the wiring 135, and the level shifter 104b is electrically connected to the controller IC 112 through the wiring 134.

The connection portion 120 between the wiring 131 and the FPC 110 has an anisotropic conductive adhesive, whereby electrical conduction between the FPC 110 and the wiring 131 can be obtained.

The gate driver 103*a* has a function of selecting one of the reflective element and the light-emitting element in the display portion 106. The gate driver 103*b* has a function of selecting the other of the reflective element and the light-emitting element in the display portion 106. The source driver IC 111 has a function of transmitting image data to the reflective element or the light-emitting element in the display portion 106.

The display portion 106, the gate driver 103*a*, the gate driver 103*b*, the level shifter 104*a*, and the level shifter 104*b* can be formed, for example, using OS transistors, over the base 101. In other words, a step of forming OS transistors over the base 101 is performed, whereby the display portion 106, the gate driver 103*a*, the gate driver 103*b*, the level shifter 104*a*, and the level shifter 104*b* can be formed.

As for transistors included in the IC chips of the source driver IC 111 and the controller IC 112, the description of the display device 100 can be referred to. As in the case of the display device 100, the source driver IC 111 is preferably formed using high withstand-voltage Si transistors, and the controller IC 112 is preferably formed using logic Si transistors and OS transistors.

As described above, as in the case of the display device 100, the controller IC 112 including the logic Si transistors and the OS transistors and the source driver IC 111 including the high withstand-voltage Si transistor are mounted on the base 101 where the OS transistors are formed, so that the transistors having different levels of resistance to heat treatment, i.e., the logic Si transistors, the high withstand-voltage Si transistors, and the OS transistors, can be provided in the display device 100A. As a result, a display device with high driving performance can be achieved.

Figure 20B:
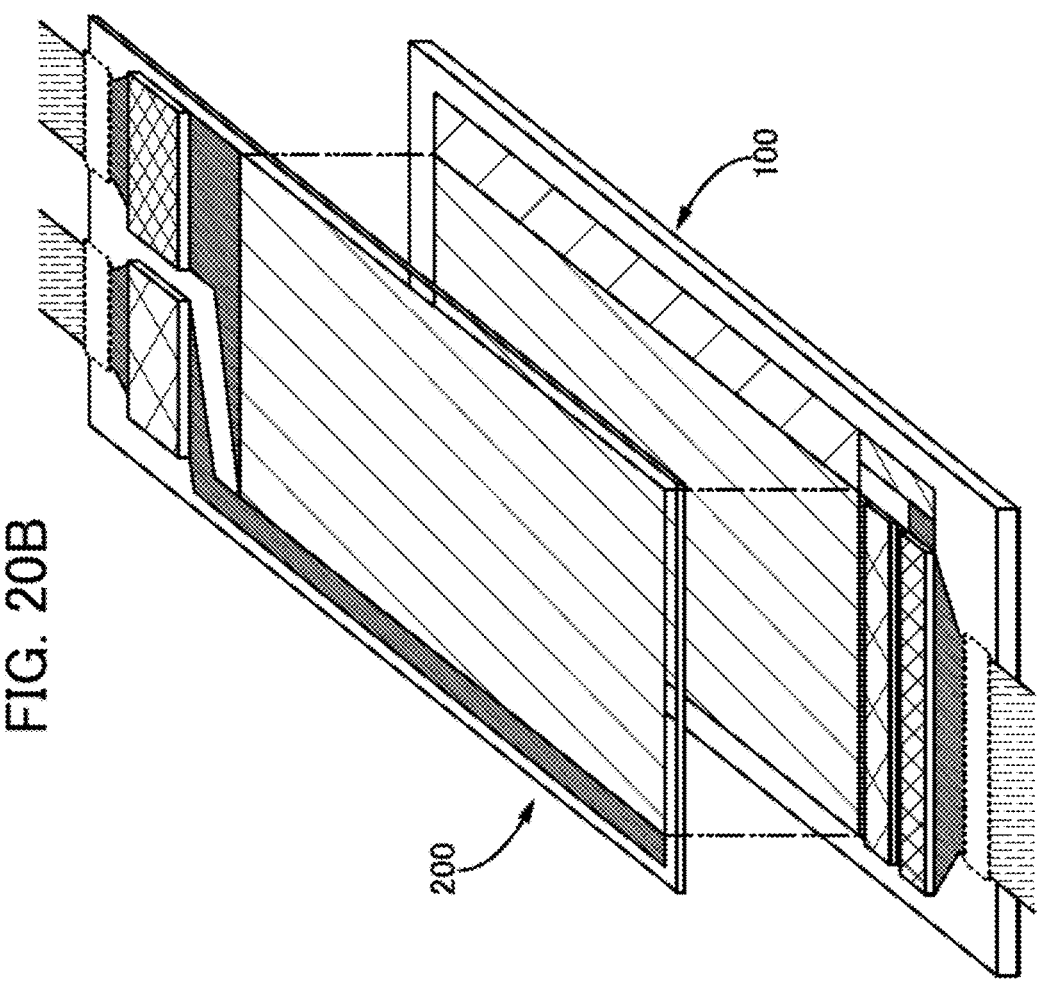
FIGS. 20A and 20B are a top view illustrating an example of a touch sensor unit and a perspective view illustrating an example in which the touch sensor unit is mounted on a display device.
Figure 20A:
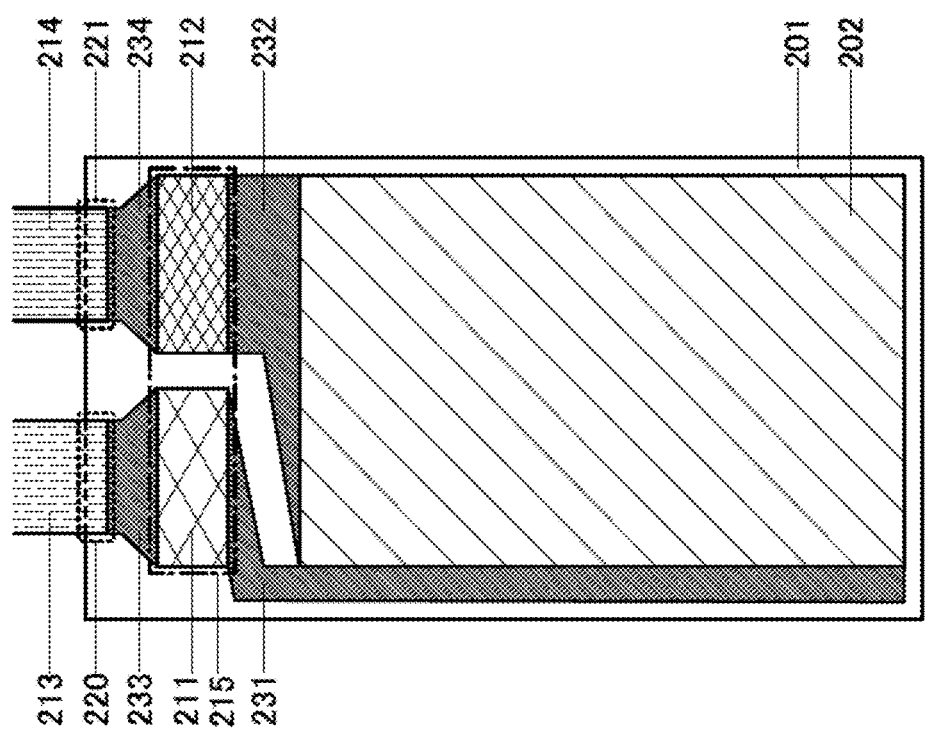

Furthermore, a touch sensor unit can be provided in the display device 100 or the display device 100A. FIG. 20A illustrates a touch sensor unit that can be provided in the display device 100 or the display device 100A. FIG. 20B illustrates an example in which the touch sensor unit is provided in the display device 100.

A touch sensor unit 200 includes a sensor array 202, a touch sensor (TS) driver IC 211, and a sense circuit 212 over a base 201. In FIG. 20A, the TS driver IC 211 and the sense circuit 212 are collectively illustrated as a peripheral circuit 215. The sensor array 202 is formed over the base 201. The TS driver IC 211 and the sense circuit 212 are mounted as components of an IC chip or the like, on the base 201, using an anisotropic conductive adhesive or an anisotropic conductive film by a COG (chip on glass) method. The touch sensor unit 200 is electrically connected to an FPC 213 and an FPC 214 as units for inputting/outputting a signal from/to the outside.

In addition, wirings 231 to 234 are formed over the base 201 so that the circuits are electrically connected to each other. In the touch sensor unit 200, the TS driver IC 211 is electrically connected to the sensor array 202 through the wiring 231, and the TS driver IC 211 is electrically connected to the FPC 213 through the wiring 233. The sense circuit 212 is electrically connected to the sensor array 202 through the wiring 232, and the sense circuit 212 is electrically connected to the FPC 214 through the wiring 234.

A connection portion 220 between the wiring 233 and the FPC 213 has an anisotropic conductive adhesive or the like, whereby electrical conduction between the FPC 213 and the wiring 233 can be obtained. Also, a connection portion 221 between the wiring 234 and the FPC 214 has an anisotropic conductive adhesive, whereby electrical conduction between the FPC 214 and the wiring 234 can be obtained.

The touch sensor unit 200 is provided to overlap with the display device 100 or the display device 100A, whereby the display device 100 or the display device 100A can have a function of a touch panel. FIG. 20B illustrates an example in which the touch sensor unit 200 overlaps with the display device 100 so that the display device 100 has a function of a touch panel.

<Base 101>

As the base 101, an insulator substrate or a conductor substrate can be used, for example. As the insulator substrate, a glass substrate, a quartz substrate, a sapphire substrate, a stabilized zirconia substrate (e.g., an yttria-stabilized zirconia substrate), or a resin substrate is used, for example. As the conductor substrate, for example, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Furthermore, as the base 101, a flexible substrate can be used. As a method for providing an element over a flexible substrate, an element is formed over a non-flexible substrate, and then the element is separated and transferred to a flexible substrate. In that case, a separation layer is preferably provided between the non-flexible substrate and the element. As the base 101, a sheet, a film, foil, or the like containing a fiber may be used. The base 101 may have elasticity. The base 101 may have a property of returning to its original shape when bending or pulling is stopped. Alternatively, the base 101 may have a property of not returning to its original shape. The thickness of the base 101 is, for example, greater than or equal to 5 μm and less than or equal to 700 μm, preferably greater than or equal to 10 μm and less than or equal to 500 μm, further preferably greater than or equal to 15 μm and less than or equal to 300 μm. When the base 101 has a small thickness, the weight of the display device 100 can be reduced. When the base 101 has a small thickness, even in the case of using glass or the like, the base 101 may have elasticity or a property of returning to its original shape when bending or pulling is stopped. Therefore, an impact applied to the semiconductor device over the base 101, which is caused by dropping or the like, can be reduced. That is, a durable semiconductor device can be provided.

For the flexible substrate, for example, metal, an alloy, a resin, glass, or fiber thereof can be used. The flexible substrate preferably has a lower coefficient of linear expansion because deformation due to an environment is suppressed. The flexible substrate is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate because of its low coefficient of linear expansion.

This embodiment can be combined with any of the other embodiments in this specification as appropriate.

Embodiment 3

In this embodiment, a circuit other than a level shifter that can be formed over the base 101 applicable to the display device 100 described in Embodiment 2 will be described.

<Pixel Circuit Included in Display Portion>

A pixel circuit included in the display portion 102 and a pixel circuit included in the display portion 106 are described.

The pixel circuit in the display portion 102 includes one kind of a display element such as a liquid crystal element or a light-emitting element. The configuration of the pixel circuit in the display portion 102 depends on the kind of display element.

Figure 21A:
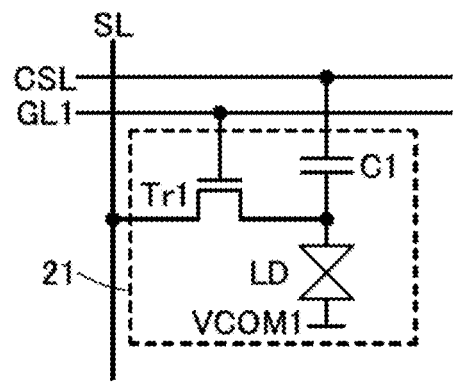
FIGS. 21A to 21E are circuit diagrams each illustrating a configuration example of a pixel.

FIG. 21A illustrates an example of a pixel circuit in which a liquid crystal element is used as a display element of the display portion 102. A pixel circuit 21 includes a transistor Tr1, a capacitor C1, and a liquid crystal element LD.

A first terminal of the transistor Tr1 is electrically connected to a wiring SL, a second terminal of the transistor Tr1 is electrically connected to a first terminal of the liquid crystal element LD, and a gate of the transistor Tr1 is electrically connected to a wiring GL1. A first terminal of the capacitor C1 is electrically connected to a wiring CSL, and a second terminal of the capacitor C1 is electrically connected to the first terminal of the liquid crystal element LD. A second terminal of the liquid crystal element LD is electrically connected to a wiring VCOM1.

The wiring SL functions as a signal line that supplies an image signal to the pixel circuit 21. The wiring GL1 functions as a scanning line that selects the pixel circuit 21. The wiring CSL functions as a capacitor wiring that holds a potential of the first terminal of the capacitor C1, i.e., a potential of the first terminal of the liquid crystal element LD. The wiring VCOM1 is a wiring that supplies a fixed potential such as 0 V or a GND potential as a common potential to the second terminal of the liquid crystal element LD.

In the case where a liquid crystal element is used as a display element of the display portion 102, the pixel circuit 21 is employed in the display portion 102, whereby an image can be displayed on the display portion 102.

Figure 21B:
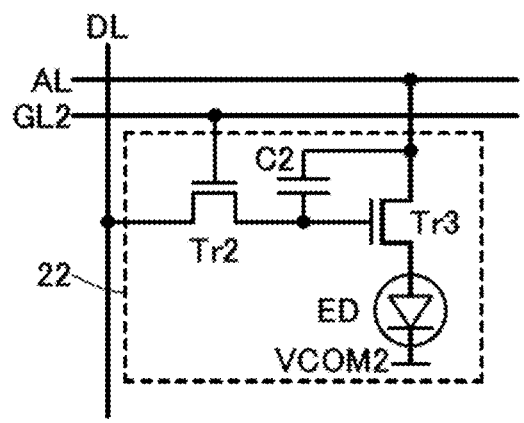

FIG. 21B illustrates an example of a pixel circuit in which a light-emitting element is used as a display element of the display portion 102. Note that the light-emitting element is an organic electroluminescence (EL) element. A pixel circuit 22 includes a transistor Tr2, a transistor Tr3, a capacitor C2, and a light-emitting element ED.

A first terminal of the transistor Tr2 is electrically connected to a wiring DL, a second terminal of the transistor Tr2 is electrically connected to a gate of the transistor Tr3, and a gate of the transistor Tr2 is electrically connected to the wiring GL2. A first terminal of the transistor Tr3 is electrically connected to a first terminal of the light-emitting element ED, and a second terminal of the transistor Tr3 is electrically connected to a wiring AL. A first terminal of the capacitor C2 is electrically connected to the second terminal of the transistor Tr3, and a second terminal of the capacitor C2 is electrically connected to the gate of the transistor Tr3. A second terminal of the light-emitting element ED is electrically connected to a wiring VCOM2.

The wiring DL functions as a signal line that supplies an image signal to the pixel circuit 22. The wiring GL2 functions as a scanning line that selects a pixel circuit 22. The wiring AL functions as a current supply line that supplies a current to the light-emitting element ED. The wiring VCOM2 is a wiring that supplies a fixed potential such as 0 V or a GND potential as a common potential to the second terminal of the light-emitting element ED.

The capacitor C2 has a function of holding a voltage between the second terminal of the transistor Tr3 and the gate of the transistor Tr3. Thus, the on-state current flowing through the transistor Tr3 can be kept constant. In the case where parasitic capacitance between the second terminal of the transistor Tr3 and the gate of the transistor Tr3 is large, the capacitor C2 is not necessarily provided.

Figure 21C:
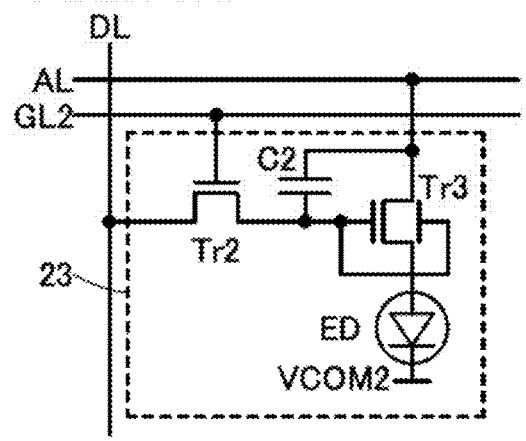

In the case where a light-emitting element is used as a display element of the display portion 102, a pixel circuit 23 illustrated in FIG. 21C, which has a different configuration from the pixel circuit 22, may be employed.

The pixel circuit 23 has a configuration where a back gate is provided for the transistor Tr3 in the pixel circuit 22, and the back gate of the transistor Tr3 is electrically connected to the gate of the transistor Tr3. Such a configuration enables an increase in the amount of on-state current flowing through the transistor Tr3.

Figure 21D:
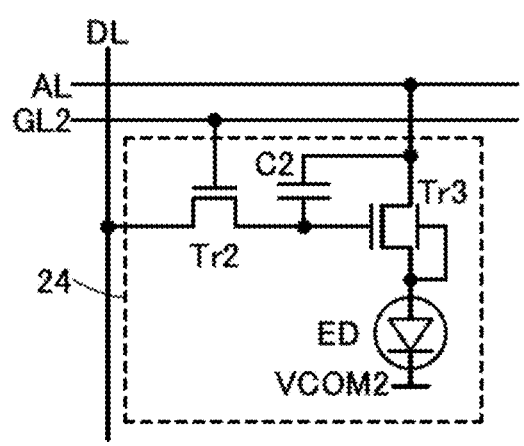

In the case where a light-emitting element is used as a display element of the display portion 102, a pixel circuit 24 illustrated in FIG. 21D, which has a different configuration from the pixel circuit 22 and the pixel circuit 23, may be used.

The pixel circuit 24 has a configuration where a back gate is provided for the transistor Tr3 in the pixel circuit 22, and the back gate of the transistor Tr3 is electrically connected to the first terminal of the transistor Tr3. Such a configuration enables suppression of a shift of the threshold voltage of the transistor Tr3. For this reason, the reliability of the transistor Tr3 can be improved.

Figure 21E:
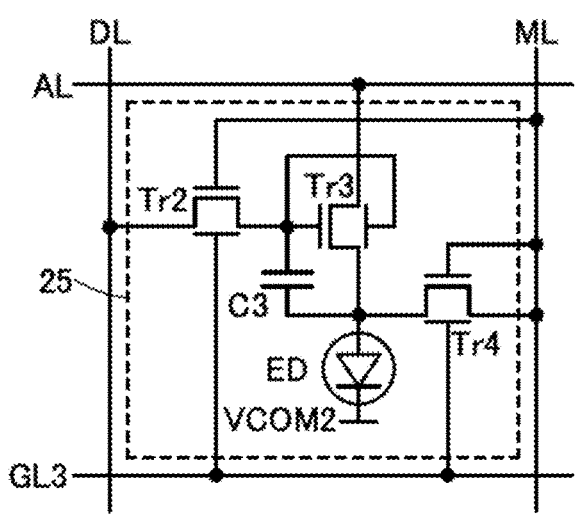

In the case where a light-emitting element is used as a display element of the display portion 102, a pixel circuit 25 illustrated in FIG. 21E, which is a different configuration from the pixel circuits 22 to 24, may be used.

The pixel circuit 25 includes the transistor Tr2, the transistor Tr3, and a transistor Tr4, a capacitor C3, and the light-emitting element ED.

The first terminal of the transistor Tr2 is electrically connected to the wiring DL, the second terminal of the transistor Tr2 is electrically connected to the gate of the transistor Tr3, the gate of the transistor Tr2 is electrically connected to a wiring ML, and the back gate of the transistor Tr2 is electrically connected to a wiring GL3. The first terminal of the transistor Tr3 is electrically connected to the first terminal of the light-emitting element ED, the second terminal of the transistor Tr3 is electrically connected to the wiring AL, and the gate of the transistor Tr3 is electrically connected to the back gate of the transistor Tr3. A first terminal of the transistor Tr4 is electrically connected to the first terminal of the light-emitting element ED, a second terminal of the transistor Tr4 is electrically connected to the wiring ML, a gate of the transistor Tr4 is electrically connected to the wiring ML, and a back gate of the transistor Tr4 is electrically connected to the wiring GL3. A first terminal of the capacitor C3 is electrically connected to the gate of the transistor Tr3, and the second terminal of the capacitor C3 is electrically connected to the first terminal of the transistor Tr3. The second terminal of the light-emitting element ED is electrically connected to the wiring VCOM2.

The wiring DL functions as a signal line that supplies an image signal to the pixel circuit 25. The wiring GL3 functions as a wiring which applies a fixed potential to control threshold voltages of the transistor Tr2 and the transistor Tr4. The wiring ML is a wiring that applies a fixed potential to the gate of the transistor Tr2, the second terminal of the transistor Tr4, and the gate of the transistor Tr4, which functions as a scanning line that selects the pixel circuit 22. For the wiring AL and the wiring VCOM2, the description of the wiring AL and the wiring VCOM2 for the pixel circuit 22 is referred to.

With such a configuration, the threshold voltages of the transistor Tr2 and the transistor Tr4 are controlled, whereby a variation in luminance of a plurality of light-emitting elements ED in the display portion 106 can be corrected. Thus, when the pixel circuit 25 is used in the display portion 102, the display device 100 with favorable display quality can be provided.

Next, a pixel circuit of the display portion 106 is described. As described above, the display portion 106 is provided in a hybrid display device, and thus both a reflective element and a light-emitting element are provided. In other words, a pixel configuration in the display portion 106 is different from the pixel configuration in the display portion 102. Here, a case in which a liquid crystal element and an organic EL element are used as the reflective element and the light-emitting element, respectively, is considered. In this case, a pixel circuit used in the display portion 106 is described.

Figure 22A:
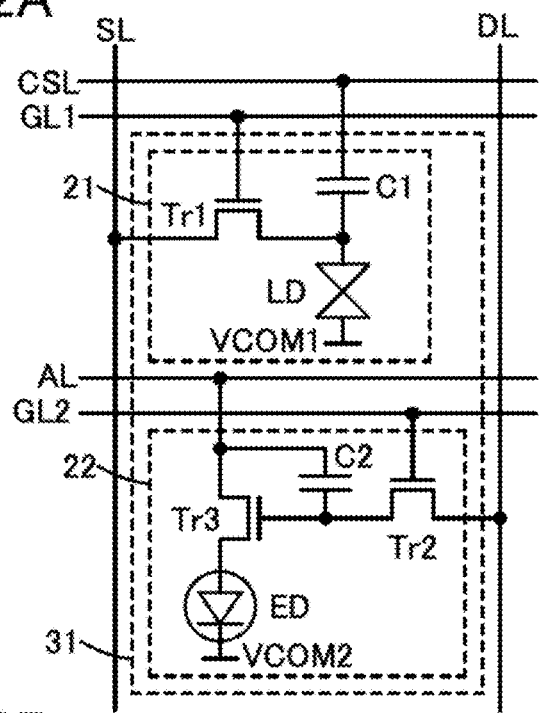
FIGS. 22A and 22B are circuit diagrams each illustrating a configuration example of a pixel.

FIG. 22A illustrates an example of a pixel circuit used in the display portion 106. A pixel circuit 31 includes the pixel circuit 21 and the pixel circuit 22. In the pixel circuit 31, the pixel circuit 21 is supplied with an image signal from the wiring SL, and the pixel circuit 22 is supplied with an image signal from the wiring DL, whereby a luminance expressed by the liquid crystal element LD and a luminance expressed by the light-emitting element ED can be controlled independently.

FIG. 22A illustrates an example of a pixel circuit including one pixel circuit 21 and one pixel circuit 22; however, the configuration of the pixel circuit in the display portion 106 is not limited thereto. The pixel circuit in the display portion 106 may include a plurality of pixel circuits 21 and/or a plurality of pixel circuits 22.

Figure 22B:
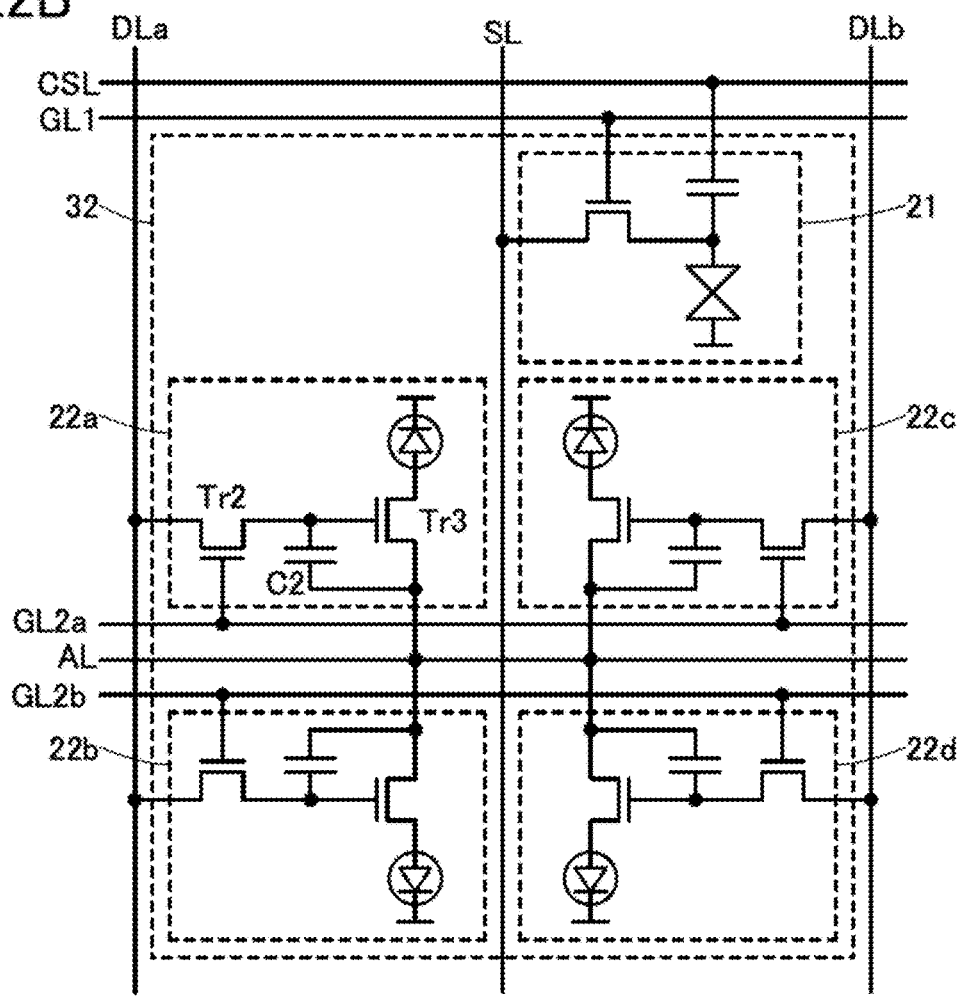

As an example, FIG. 22B illustrates a pixel circuit including one pixel circuit 21 and four pixel circuits 22. A pixel circuit 32 includes the pixel circuit 21 and pixel circuits 22a to 22d. Each of the pixel circuits 22a to 22d has the same configuration as the pixel circuit 22.

The gate of the transistor Tr2 included in each of the pixel circuits 22a and 22c is electrically connected to a wiring GL2a. The gate of the transistor Tr2 included in each of the pixel circuits 22b and 22d is electrically connected to a wiring GL2b.

The first terminal of the transistor Tr2 included in each of the pixel circuits 22a and 22b is electrically connected to a wiring DLa. The first terminal of the transistor Tr2 included in each of the pixel circuits 22c and 22d is electrically connected to a wiring DLb.

The second terminal of the transistor Tr3 included in each of the pixel circuits 22a to 22d is electrically connected to the wiring AL.

Each of the wiring GL2a and the wiring GL2b has a function similar to that of the wiring GL2 for the pixel circuit 22. Each of the wiring DLa and the wiring DLb has a function similar to that of the wiring DL for the pixel circuit 22.

As described above, in the pixel circuits 22a to 22d, the wiring GL2a is shared between the pixel circuit 22a and the pixel circuit 22c, and the wiring GL2b is shared between the pixel circuit 22b and the pixel circuit 22d. However, such a configuration that one wiring GL2 is shared between all of the pixel circuits 22a to 22d may be employed. In this case, it is preferable that the pixel circuits 22a to 22d be electrically connected to respective four wirings DL.

The light-emitting elements ED included in the pixel circuits 22a to 22d emit light having wavelengths in different ranges; thus, the display device including the display portion 106 can display a color image.

For example, light emitted from the light-emitting element ED included in the pixel circuit 22a is red light, light emitted from the light-emitting element ED included in the pixel circuit 22b is green light, and light emitted from the light-emitting element ED included in the pixel circuit 22c is blue light. Accordingly, the pixel circuit 32 can emit light of three primary colors. Thus, the pixel circuit 32 can express a variety of colors in accordance with a supplied image signal.

In addition to the above, for example, when light emitted from the light-emitting element ED included in the pixel circuit 22d is white light, the emission luminance of the display portion 106 can be improved. Furthermore, the color temperature of the white light is adjusted, whereby display quality of the display device including the display portion 106 can be improved.

Figure 23A:
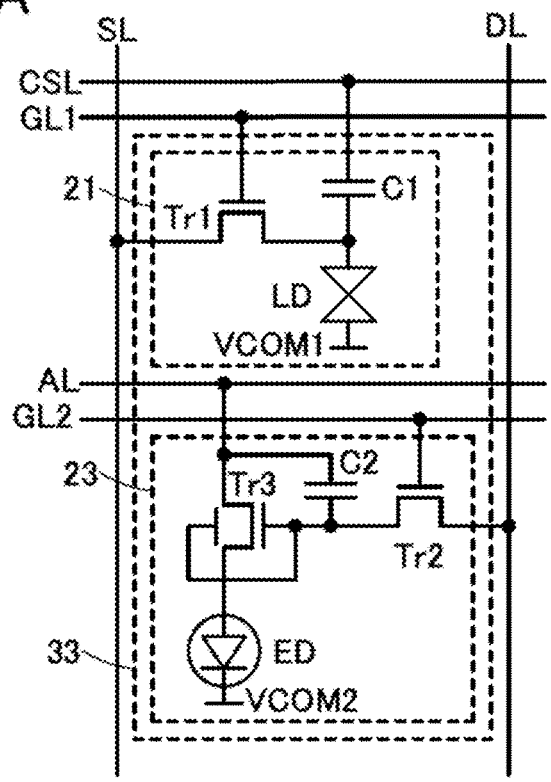
FIGS. 23A and 23B are circuit diagrams each illustrating a configuration example of a pixel.

FIG. 23A illustrates a pixel circuit that can be used in the display portion 106 and is a different from the pixel circuit 31 and the pixel circuit 32. A pixel circuit 33 includes the pixel circuit 21 and the pixel circuit 23. As in the pixel circuit 31, in the pixel circuit 33, the pixel circuit 21 is supplied with an image signal from the wiring SL, and the pixel circuit 23 is supplied with an image signal from the wiring DL, whereby a luminance expressed by the liquid crystal element LD and a luminance expressed by the light-emitting element ED can be controlled independently.

As described above, in the pixel circuit 23, the gate of the transistor Tr3 is electrically connected to the back gate of the transistor Tr3, so that the on-state current of the transistor Tr3 can be increased.

Although the pixel circuit 33 in FIG. 23A includes one pixel circuit 21 and one pixel circuit 23, a configuration of a pixel circuit in the display portion 106 is not limited thereto. The pixel circuit included in the display portion 106 may include a plurality of pixel circuits 21 and/or a plurality of pixel circuits 23. For example, the pixel circuit in the display portion 106 may include one pixel circuit 21 and four pixel circuits 23 as in the pixel circuit 32 illustrated in FIG. 22B. Such a circuit configuration (not illustrated) is obtained by electrically connecting the gates of the transistors Tr3 to the respective back gates of the transistors Tr3 in the pixel circuits 22a to 22d in the pixel circuit 32 illustrated in FIG. 22B.

Figure 23B:
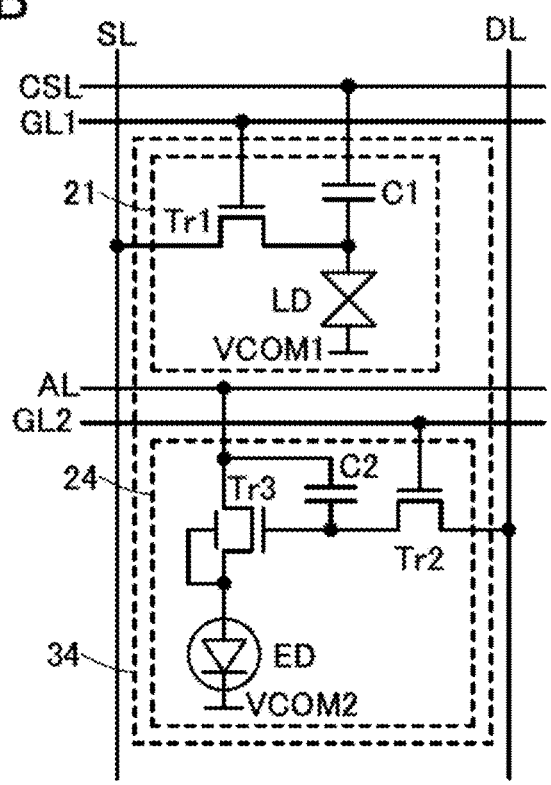

FIG. 23B illustrates a pixel circuit that can be used in the display portion 106 and is different from the pixel circuits 31 to 33. A pixel circuit 34 includes the pixel circuit 21 and the pixel circuit 24. In the pixel circuit 34, as in the pixel circuit 31 and the pixel circuit 33, the pixel circuit 21 is supplied with an image signal from the wiring SL, and the pixel circuit 24 is supplied with an image signal from the wiring DL, whereby a luminance expressed by the liquid crystal element LD and a luminance expressed by the light-emitting element ED can be controlled independently.

As described above, in the pixel circuit 24, the first terminal of the transistor Tr3 is electrically connected to the back gate of the transistor Tr3, so that a shift of the threshold voltage of the transistor Tr3 can be suppressed.

Although the pixel circuit 34 in FIG. 23B includes one pixel circuit 21 and one pixel circuit 23, a configuration of a pixel circuit in the display portion 106 is not limited thereto. The pixel circuit included in the display portion 106 may include a plurality of pixel circuits 21 and/or a plurality of pixel circuits 24. For example, the pixel circuit in the display portion 106 may one pixel circuit 21 and four pixel circuits 24 as in the pixel circuit 32 illustrated in FIG. 22B. Such a circuit configuration (not illustrated) is obtained by electrically connecting the first terminals of the transistors Tr3 to the respective back gates of the transistors Tr3 in the pixel circuits 22a to 22d in the pixel circuit 32 illustrated in FIG. 22B.

Figure 24:
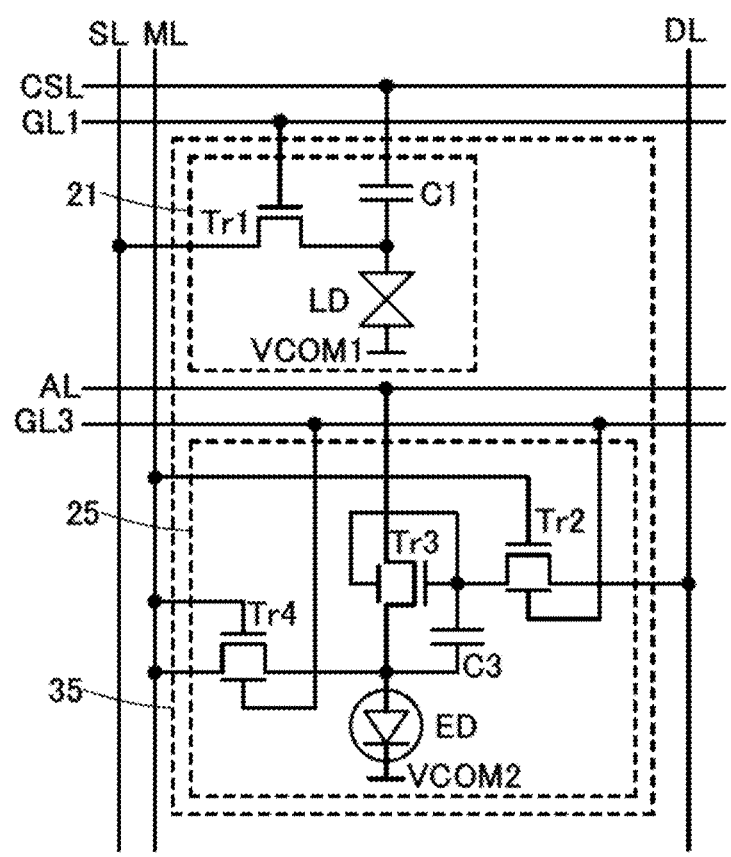
FIG. 24 is a circuit diagram illustrating a configuration example of a pixel.

FIG. 24 illustrates a pixel circuit that can be used in the display portion 106 and is different from the pixel circuits 31 to 34. A pixel circuit 35 includes the pixel circuit 21 and the pixel circuit 25. In the pixel circuit 35, as in the pixel circuit 31 and the pixel circuit 34, the pixel circuit 21 is supplied with an image signal from the wiring SL, and the pixel circuit 25 is supplied with an image signal from the wiring DL, whereby a luminance expressed by the liquid crystal element LD and a luminance expressed by the light-emitting element ED can be controlled independently.

As described above, in the pixel circuit 25, the back gate of the transistor Tr2 and the back gate of the transistor Tr4 are electrically connected to the wiring GL3, so that the threshold voltages of the transistor Tr2 and the transistor Tr4 can be controlled. Thus, a variation in luminance of a plurality of light-emitting elements ED in the display portion 106 can be corrected.

Figure 25:
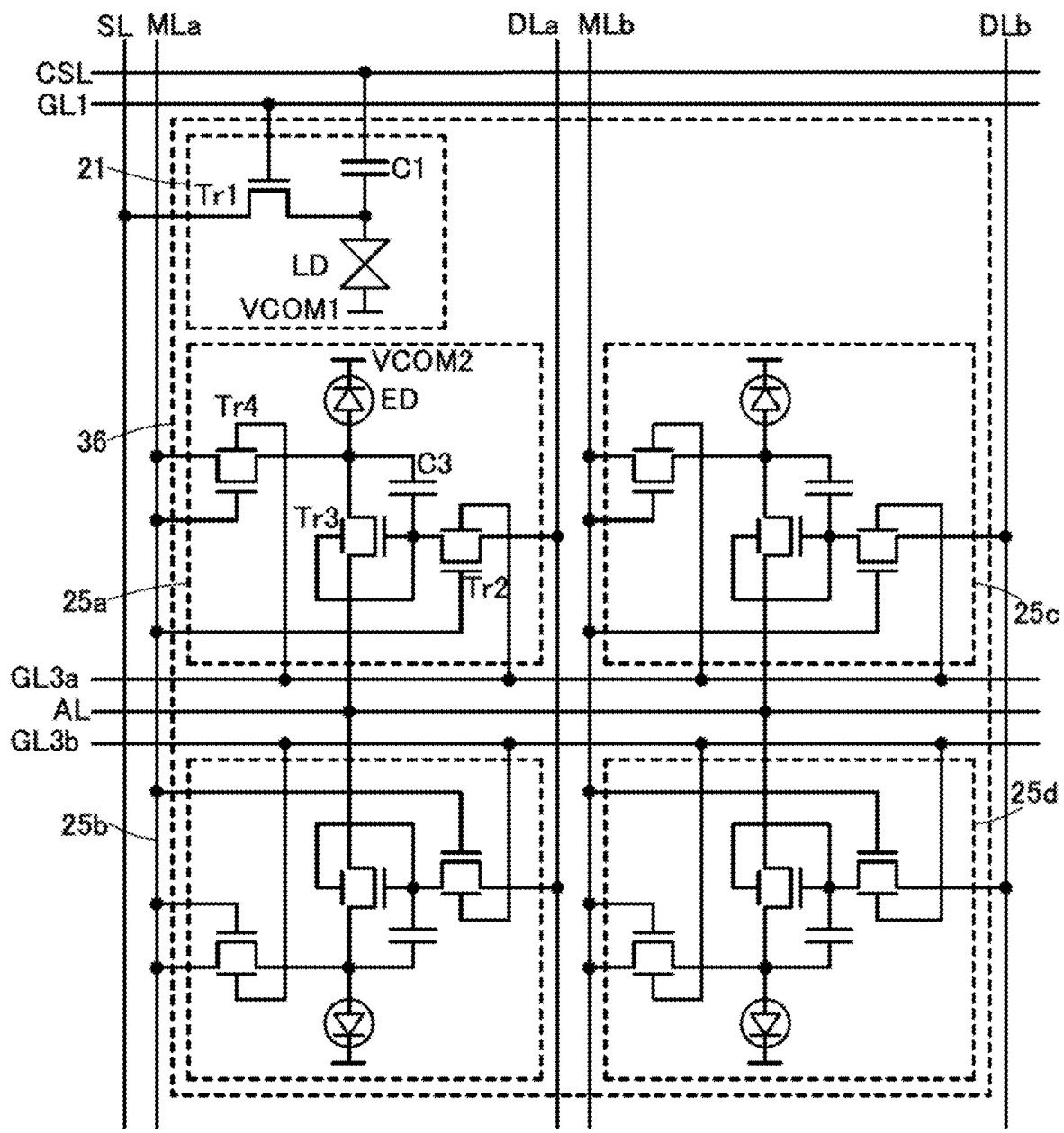
FIG. 25 is a circuit diagram illustrating a configuration example of a pixel.

Although the pixel circuit 35 in FIG. 24 includes one pixel circuit 21 and one pixel circuit 25, a configuration of a pixel circuit in the display portion 106 is not limited thereto. The pixel circuit included in the display portion 106 may include a plurality of pixel circuits 21 and/or a plurality of pixel circuits 25. For example, the pixel circuit in the display portion 106 may one pixel circuit 21 and four pixel circuits 25 as in the pixel circuit 32 illustrated in FIG. 22B. A configuration example in such a case is illustrated in FIG. 25. A pixel circuit 36 includes the pixel circuit 21 and pixel circuits 25a to 25d. Each of the pixel circuits 25a to 25d has the same configuration as the pixel circuit 25.

The back gate of the transistor Tr2 and the back gate of the transistor Tr4 included in each of the pixel circuits 25a and 25c are electrically connected to a wiring GL3a. The back gate of the transistor Tr2 and the back gate of the transistor Tr4 included in each of the pixel circuits 25b and 25d are electrically connected to a wiring GL3b.

The first terminal of the transistor Tr2 included in each of the pixel circuits 25a and 25b is electrically connected to the wiring DLa. The first terminal of the transistor Tr2 included in each of the pixel circuits 25c and 25d is electrically connected to the wiring DLb.

The second terminal of the transistor Tr4 included in each of the pixel circuits 25a and 25b is electrically connected to a wiring MLa. The second terminal of the transistor Tr4 included in each of the pixel circuits 25c and 25d is electrically connected to a wiring MLb.

The second terminal of the transistor Tr3 included in each of the pixel circuits 25a to 25d is electrically connected to the wiring AL.

The wiring GL3a and the wiring GL3b have a function similar to that of the wiring GL3 of the pixel circuit 25. The wiring DLa and the wiring DLb have a function similar to that of the wiring DL of the pixel circuit 25. The wiring MLa and the wiring MLb have a function similar to that of the wiring ML of the pixel circuit 25.

As described above, in the pixel circuits 25a to 25d, the wiring GL3a is shared between the pixel circuit 25a and the pixel circuit 25c, and the wiring GL3b is shared between the pixel circuit 25b and the pixel circuit 25d. However, such a configuration that one wiring GL3 is shared between all of the pixel circuits 25a to 25d may be employed. In this case, it is preferable that the pixel circuits 25a to 25d be electrically connected to respective four wirings DL.

When the light-emitting elements ED included in the pixel circuits 25a to 25d emit light having wavelengths in different ranges as in the case of the pixel circuit 32, the display device including the display portion 106 can display a color image. For this configuration, the description of the pixel circuit 32 is referred to.

<Gate Driver>

Next, an example of the gate driver 103 that can be formed over the base 101 is described.

<<Circuit Configuration of Gate Driver>>

Figure 26A:
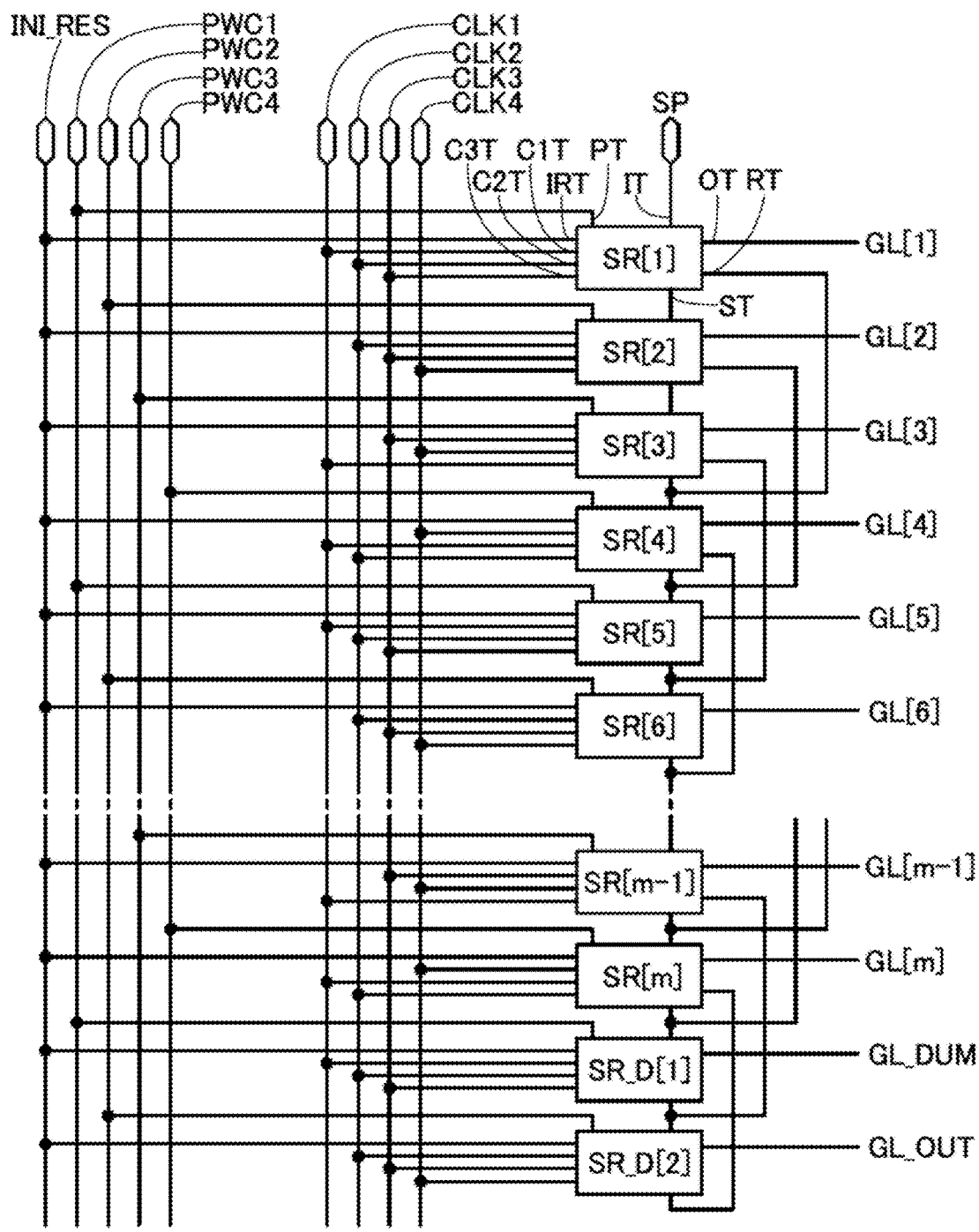
FIGS. 26A to 26C are a block diagram illustrating a configuration example of a gate driver and diagrams illustrating circuits included in the gate driver.

FIG. 26A is a circuit diagram illustrating an example of the gate driver 103. The gate driver 103 includes circuits SR[1] to SR[m], a circuit SR_D[1], and a circuit SR_D[2]. In the gate driver 103, a shift register is composed of the circuits SR[1] to SR[m], the circuit SR_D[1], and the circuit SR_D[2]. Note that m is an integer greater than or equal to 1, which indicates the number of pixel circuits in one column of the display portion 102 or the display portion 106.

Figure 26B:
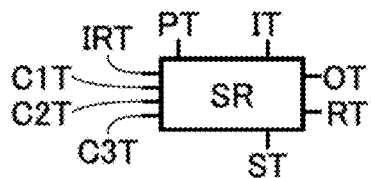
Figure 26C:
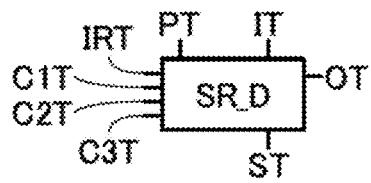

With use of FIGS. 26B and 26C, terminals provided for the circuits SR[1] to SR[m], the circuit SR_D[1], and the circuit SR_D[2] are described. In FIG. 26B, a circuit SR represents one of the circuits SR[1] to SR[m]. In FIG. 26C, a circuit SR_D represents either the circuit SR_D[1] or the circuit SR_D[2].

The circuit SR includes a terminal IT, a terminal OT, a terminal RT, a terminal ST, a terminal PT, a terminal IRT, a terminal C1T, a terminal C2T, and a terminal C3T. The circuit SR_D includes the terminal IT, the terminal OT, the terminal ST, the terminal PT, the terminal IRT, the terminal C1T, the terminal C2T, and the terminal C3T.

The terminal IT is an input terminal to which a start pulse signal or a signal output from the terminal ST of the circuit SR in the previous stage is input. The terminal OT is an output terminal that is electrically connected to a pixel circuit in the display portion 102. The terminal ST is an output terminal that transmits a signal to the circuit SR in a next stage. To the terminal RT, a signal from the terminal ST of the circuit SR in a stage that follows the next stage is input.

A start pulse signal SP is a signal that is input when the gate driver 103 is driven. The start pulse signal SP is input to the gate driver 103 from the controller IC 112 through the level shifter 104 every time an image for one frame is displayed on the display device 100.

To the terminal PT, a signal (pulse width control signal) that controls the pulse width of a signal output from the terminal OT is input. Pulse width control signals PWC1 to PWC4 are signals controlling widths of pulse signals output to wirings GL[1] to GL[m], a wiring GL_DUM, and a wiring GL_OUT.

To the terminal IRT, an initialization reset signal INI_RES is input. Clock signals different from each other are input to the terminal C1T, the terminal C2T, and the terminal C3T.

A clock signal CLK2 has the same wavelength and the same cycle as the clock signal CLK1, and the transmission of the clock signal CLK2 is delayed from that of the clock signal CLK1 by a ¼ cycle. A clock signal CLK3 is an inverted signal of the clock signal CLK1, and a clock signal CLK4 is an inverted signal of the clock signal CLK2.

Next, a specific circuit configuration of the gate driver 103 will be described. The start pulse signal SP is input to the terminal IT of the circuit SR[1]. The terminal ST of the circuit SR[i] (i is an integer greater than or equal to 1 and less than or equal to (m−1)) is electrically connected to the terminal IT of the circuit SR[i+1]. The terminal ST of the circuit SR[m] is electrically connected to the terminal IT of the circuit SR_D[1], and the terminal ST of the circuit SR_D[1] is electrically connected to the terminal IT of the circuit SR_D[2].

The terminal RT of the circuit SR[p] (p is an integer greater than or equal to 1 and less than or equal to (m−2)) is electrically connected to the terminal ST of the circuit SR[p+2]. The terminal RT of the circuit SR[m−1] is electrically connected to the terminal ST of the circuit SR_D[1], and the terminal RT of the circuit SR[m] is electrically connected to the terminal ST of the circuit SR_D[2].

The terminal OT of the circuit SR[x] (x is an integer greater than or equal to 1 and less than or equal to m) is electrically connected to a wiring GL[x]. The terminal OT of the circuit SR_D[1] is electrically connected to the wiring GL_DUM, and the terminal OT of the circuit SR_D[2] is electrically connected to the wiring GL_OUT. The wiring GL_DUM functions as a dummy wiring, and the wiring GL_OUT has a function of transmitting a data signal informing that the start pulse signal reaches the circuit SR_D[2] (the last stage of the shift register of the gate driver 103).

To the terminal IRT of the circuit SR[x], the initialization reset signal INI_RES is input.

To the terminal C1T of the circuit SR[s] (s is an integer greater than or equal to 1 and less than or equal to m, where the relation, s=4a+1, is satisfied, and a is an integer greater than or equal to 0), the clock signal CLK1 is input. To the terminal C2T of the circuit SR[s], the clock signal CLK2 is input. To the terminal C3T of the circuit SR[s], the clock signal CLK3 is input. To the terminal PT of the circuit SR[s], the pulse width control signal PWC1 is input.

To the terminal C1T of the circuit SR[s+1], the clock signal CLK2 is input. To the terminal C2T of the circuit SR[s+1], the clock signal CLK3 is input. To the terminal C3T of the circuit SR[s+1], the clock signal CLK4 is input. To the terminal PT of the circuit SR[s+1], the pulse width control signal PWC2 is input.

To the terminal C1T of the circuit SR[s+2], the clock signal CLK3 is input. To the terminal C2T of the circuit SR[s+2], the clock signal CLK4 is input. To the terminal C3T of the circuit SR[s+2], the clock signal CLK1 is input. To the terminal PT of the circuit SR[s+2], the pulse width control signal PWC3 is input.

To the terminal C1T of the circuit SR[s+3], the clock signal CLK4 is input. To the terminal C2T of the circuit SR[s+3], the clock signal CLK1 is input. To the terminal C3T of the circuit SR[s+3], the clock signal CLK2 is input. To the terminal PT of the circuit SR[s+3], the pulse width control signal PWC4 is input.

Note that in the gate driver 103 in FIG. 26A, the input of the clock signal and the pulse width control signal to the circuit SR[m−1] is performed in a manner similar to that of the input of the clock signal and the pulse width control signal to the circuit SR[s+2]. Furthermore, the input of the clock signal and the pulse width control signal to the circuit SR[m] is performed in a manner similar to that of the input of the clock signal and the pulse width control signal to the circuit SR[s+3]. Furthermore, the input of the clock signal and the pulse width control signal to the circuit SR_D[1] is performed in a manner similar to that of the input of the clock signal and the pulse width control signal to the circuit SR[s]. The input of the clock signal and the pulse width control signal to the circuit SR_D[2] is performed in a manner similar to that of the input of the clock signal and the pulse width control signal to the circuit SR[s+1].

Note that in this specification, the clock signal CLK1, the clock signal CLK2, the clock signal CLK3, the clock signal CLK4, the pulse width control signal PWC1, the pulse width control signal PWC2, the pulse width control signal PWC3, the pulse width control signal PWC4, and the start pulse signal SP are collectively referred to as a timing signal in some cases. In a display device of one embodiment of the present invention, the timing signal is generated by the controller IC 112.

Note that in the gate driver 103 in FIG. 26A, only the following components are illustrated: the circuit SR[1], the circuit SR[2], the circuit SR[3], the circuit SR[4], the circuit SR[5], the circuit SR[6], the circuit SR[m−1], the circuit SR[m], the circuit SR_D[1], the circuit SR_D[2], the wiring GL[1], the wiring GL[2], the wiring GL[3], the wiring GL[4], the wiring GL[5], the wiring GL[6], the wiring GL[m−1], the wiring GL[m], the wiring GL_DUM, the wiring GL_OUT, the terminal IT, the terminal OT, the terminal RT, the terminal ST, the terminal PT, the terminal IRT, the terminal C1T, the terminal C2T, the terminal C3T, the clock signal CLK1, the clock signal CLK2, the clock signal CLK3, the clock signal CLK4, the pulse width control signal PWC1, the pulse width control signal PWC2, the pulse width control signal PWC3, the pulse width control signal PWC4, and the initialization reset signal INI_RES. Description of the other circuits, wirings, and numerals are omitted.

Figure 27:
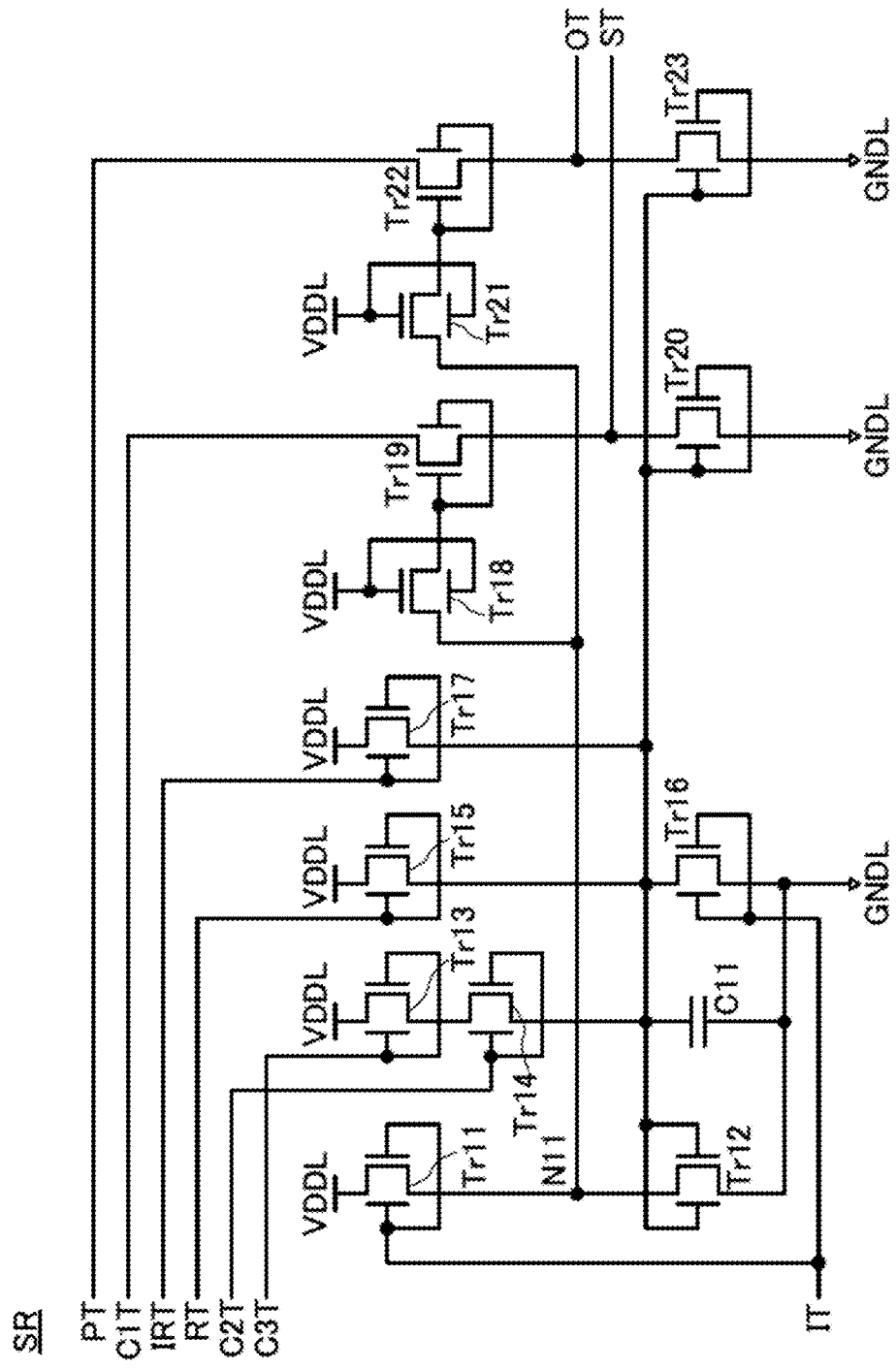
FIG. 27 is a circuit diagram illustrating a circuit included in a gate driver.

Next, circuit configurations of the circuits SR[1] to SR[m] are described. FIG. 27 illustrates a configuration of the circuit SR in FIG. 26B.

The circuit SR is formed not using a p-channel transistor but using an n-channel transistor. The circuit SR includes transistors Tr11 to Tr23 and a capacitor C11. Note that each of the transistors Tr11 to Tr23 is provided with a back gate.

A wiring VDDL illustrated in the circuit SR in FIG. 27 is a wiring for applying a potential VDD that is a high-level potential. A wiring GNDL illustrated in the circuit SR in FIG. 27 is a wiring for applying a GND potential.

A first terminal of the transistor Tr11 is electrically connected to the wiring VDDL, a second terminal of the transistor Tr11 is electrically connected to a first terminal of the transistor Tr21, and a gate and the back gate of the transistor Tr11 are electrically connected to the terminal IT. A first terminal of the transistor Tr12 is electrically connected to the first terminal of the transistor Tr21, a second terminal of the transistor Tr12 is electrically connected to the wiring GNDL, and a gate and a back gate of the transistor Tr12 are electrically connected to a gate and the back gate of the transistor Tr23. A connection portion between the second terminal of the transistor Tr11 and the first terminal of the transistor Tr12 is referred to as a node N11.

A first terminal of the transistor Tr13 is electrically connected to the wiring VDDL, a second terminal of the transistor Tr13 is electrically connected to a first terminal of the transistor Tr14, and a gate and the back gate of the transistor Tr13 are electrically connected to the terminal C3T. A second terminal of the transistor Tr14 is electrically connected to the gate and the back gate of the transistor Tr23, and a gate and the back gate of the transistor Tr14 are electrically connected to the terminal C2T. A first terminal of the capacitor C11 is electrically connected to the gate and the back gate of the transistor Tr23, and a second terminal of the capacitor C11 is electrically connected to the wiring GNDL.

A first terminal of the transistor Tr15 is electrically connected to the wiring VDDL, a second terminal of the transistor Tr15 is electrically connected to the gate and the back gate of the transistor Tr23, and a gate and the back gate of the transistor Tr15 are electrically connected to the terminal RT. A first terminal of the transistor Tr16 is electrically connected to the gate and the back gate of the transistor Tr23, a second terminal of the transistor Tr16 is electrically connected to the wiring GNDL, and a gate and the back gate of the transistor Tr16 are electrically connected to the terminal IT.

A first terminal of the transistor Tr17 is electrically connected to the wiring VDDL, a second terminal of the transistor Tr17 is electrically connected to the gate and the back gate of the transistor Tr23, and a gate and the back gate of the transistor Tr17 is electrically connected to the terminal IRT.

A first terminal of the transistor Tr18 is electrically connected to the first terminal of the transistor Tr21, a second terminal of the transistor Tr18 is electrically connected to a gate and the back gate of the transistor Tr19, and a gate and the back gate of the transistor Tr18 is electrically connected to the wiring VDDL. A first terminal of the transistor Tr19 is electrically connected to the terminal C1T, and a second terminal of the transistor Tr19 is electrically connected to the terminal ST. A first terminal of the transistor Tr20 is electrically connected to the terminal ST, a second terminal of the transistor Tr20 is electrically connected to the wiring GNDL, and a gate and the back gate of the transistor Tr20 are electrically connected to the gate and the back gate of the transistor Tr23.

A second terminal of the transistor Tr21 is electrically connected to a gate and the back gate of the transistor Tr22, and a gate and the back gate of the transistor Tr21 is electrically connected to the wiring VDDL. A first terminal of the transistor Tr22 is electrically connected to the terminal PT, and a second terminal of the transistor Tr22 is electrically connected to the terminal OT. A first terminal of the transistor Tr23 is electrically connected to the terminal OT, and a second terminal of the transistor Tr23 is electrically connected to the wiring GNDL.

Figure 28:
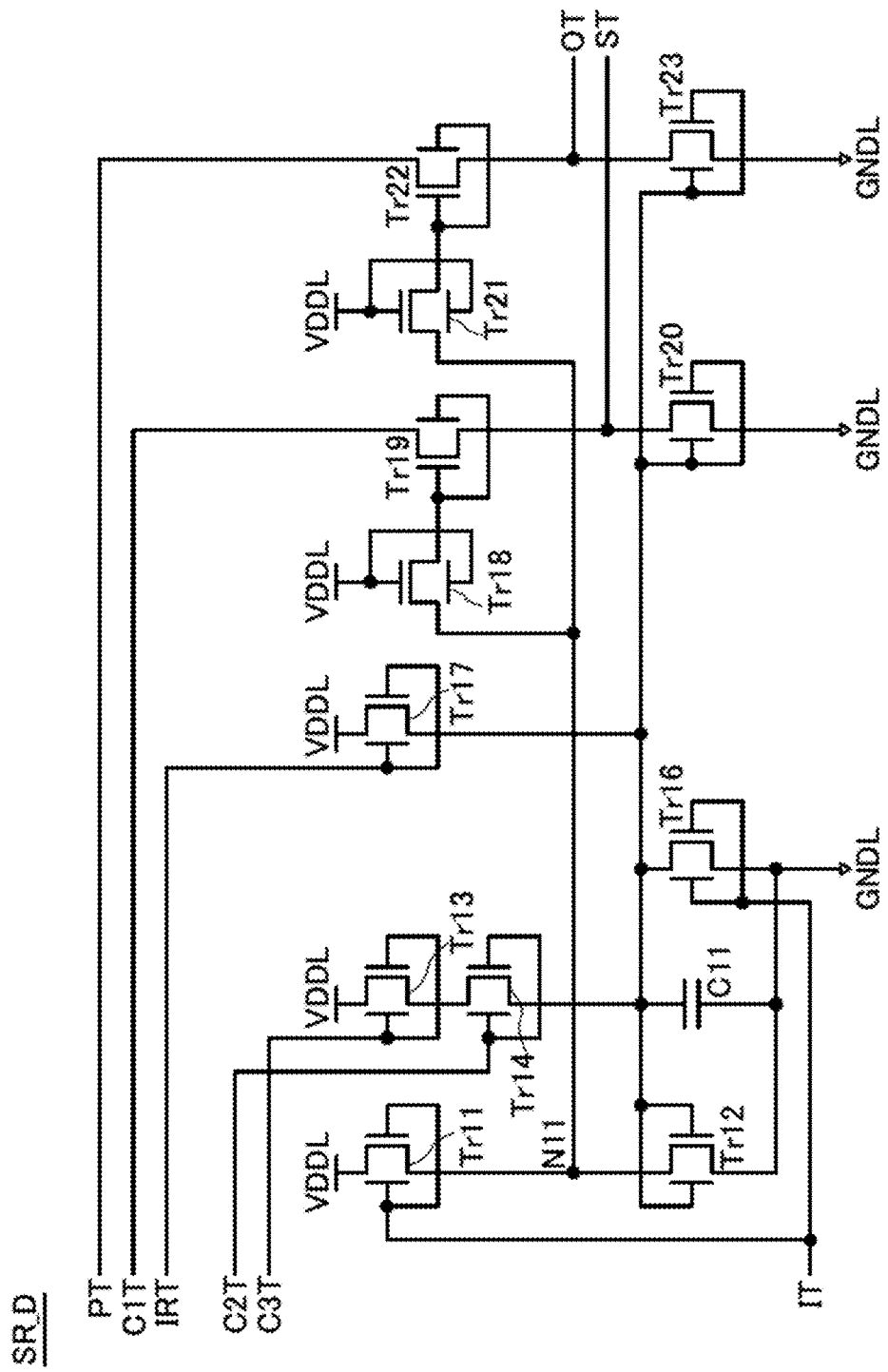
FIG. 28 is a circuit diagram illustrating a circuit included in a gate driver.

Next, circuit configurations of the circuit SR_D[1] and the circuit SR_D[2] are described. FIG. 28 illustrates a circuit configuration of the circuit SR_D in FIG. 26C.

The circuit SR_D has a configuration in which the terminal RT is removed from the circuit SR. Thus, the circuit SR_D has a configuration in which the transistor Tr15 is removed from the circuit SR.

Note that all of the transistors included in the circuit SR in FIG. 27 and the circuit SR_D in FIG. 28 is provided with a back gate, and the back gates are electrically connected to respective gates. This configuration enables an increase in the amount of on-state current flowing through the transistors.

Although all of the transistors included in the circuit SR in FIG. 27 and the circuit SR_D in FIG. 28 is provided with a back gate, the circuit SR and the circuit SR_D may include a transistor without a back gate. In this case, only the gate may be electrically connected to a predetermined element or a predetermined wiring because the gate and the back gate are electrically connected to each other in each of the transistors in the circuit SR and the circuit SR_D.

<<Operation of Gate Driver>>

Figure 29:
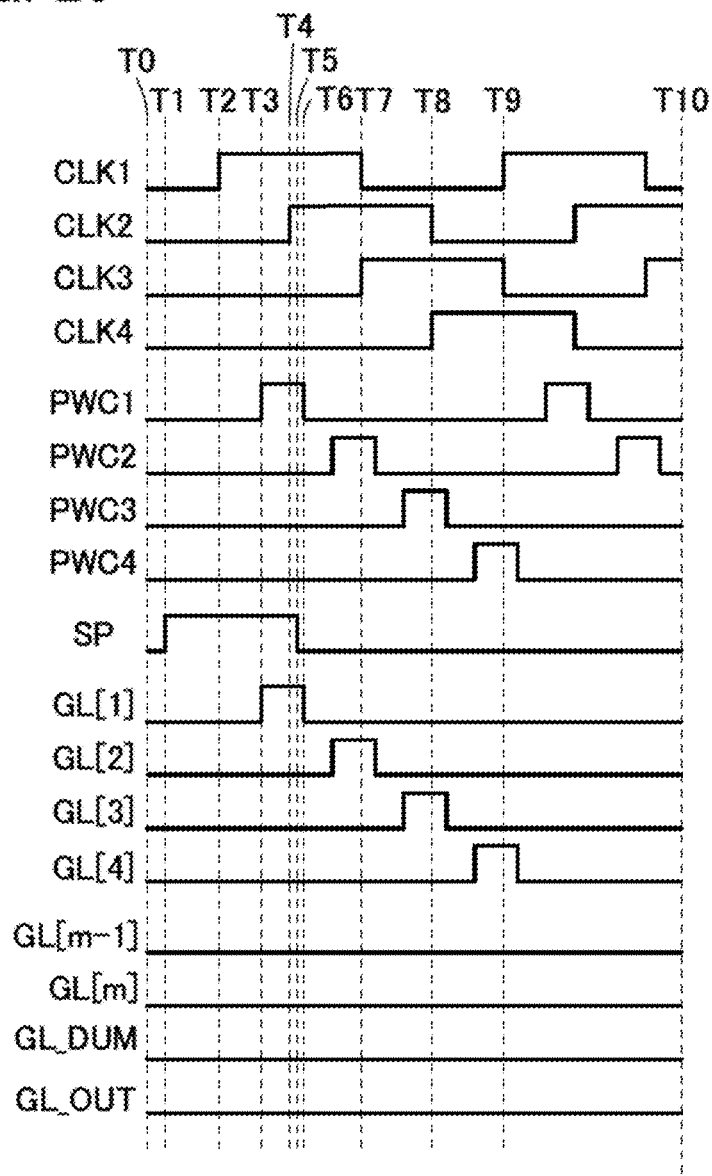
FIG. 29 is a timing chart showing an operation example of a gate driver.

Next, operation of the gate driver 103 is described. FIG. 29 is a timing chart showing an operation example of the gate driver 103, which shows changes in potentials of the clock signal CLK1, the clock signal CLK2, the clock signal CLK3, the clock signal CLK4, the pulse width control signal PWC1, the pulse width control signal PWC2, the pulse width control signal PWC3, the pulse width control signal PWC4, and the start pulse signal SP, from time T0 to time T10. In addition, the timing chart shows changes in potentials of the wiring GL[1], the wiring GL[2], the wiring GL[3], the wiring GL[4], the wiring GL[m−1], the wiring GL[m], the wiring GL_DUM, and the wiring GL_OUT each of which serves as an output wiring of the gate driver 103.

[Circuit SR[1]]

As shown in FIGS. 26A to 26C, the clock signal CLK1 is input to the terminal C1T of the circuit SR[1], the clock signal CLK2 is input to the terminal C2T of the circuit SR[1], the clock signal CLK3 is input to the terminal C3T of the circuit SR[1], and the pulse width control signal PWC1 is input to the terminal PT of the circuit SR[1].

At the time T1, a high-level potential is input as a start pulse signal to the terminal IT of the circuit SR[1] in the gate driver 103. Thus, the transistor Tr11 and the transistor Tr16 are turned on.

When the transistor Tr11 is turned on, the potential VDD is applied to the first terminal of the transistor Tr12, the first terminal of the transistor Tr18, and the first terminal of the transistor Tr21. Note that the transistor Tr18 and the transistor Tr21 are always in an on state for the circuit configuration. Accordingly, the potential VDD is applied to the gate and the back gate of the transistor Tr19 and the gate and the back gate of the transistor Tr22, and the transistor Tr19 and the transistor Tr22 are turned on.

Thus, the terminal PT and the terminal OT are electrically connected to each other, and the terminal C1T and the terminal ST are electrically connected to each other.

When the transistor Tr16 is turned on, the GND potential is applied to the gate and the back gate of the transistor Tr12, the gate and the back gate of the transistor Tr20, and the gate and the back gate of the transistor Tr23. Thus, the transistor Tr12, the transistor Tr20, and the transistor Tr23 are in an off state.

At the time T2, a high-level potential is input as the clock signal CLK1 to the gate driver 103. Thus, the high-level potential is input from the terminal C1T through the transistor Tr19 to the terminal ST in the circuit SR[1].

At the time T3, a high-level potential is input as the pulse width control signal PWC1 to the gate driver 103. Thus, the high-level potential is input from the terminal PT through the transistor Tr22 to the terminal OT in the circuit SR[1]. Thus, the wiring GL[1] electrically connected to the terminal OT of the circuit SR[1] has a high-level potential.

At the time T4, a high-level potential is input as the clock signal CLK2 to the gate driver 103. Thus, the high-level potential is input from the terminal C2T in the circuit SR[1], and the high-level potential is applied to the gate and the back gate of the transistor Tr14. Thus, the transistor Tr14 is turned on.

At the time T5, a low-level potential is input as a start pulse signal to the terminal IT of the circuit SR[1] in the gate driver 103. Thus, the transistor Tr11 and the transistor Tr16 are turned off.

When the transistor Tr11 is turned off, the node N11 becomes in a floating state. Thus, the gate and the back gate of the transistor Tr19 and the gate and the back gate of the transistor Tr22 hold potentials VDD. Thus, the transistor Tr19 and the transistor Tr22 are each kept in an on state.

At the time T6, a low-level potential is input as the pulse width control signal PWC1 to the gate driver 103. Thus, the low-level potential is input from the terminal PT through the transistor Tr22 to the terminal OT in the circuit SR[1]. Thus, the wiring GL[1] electrically connected to the terminal OT of the circuit SR[1] has the low-level potential.

At the time T7, a low-level potential is input as the clock signal CLK1 to the gate driver 103, and a high-level potential is input as the clock signal CLK3 to the gate driver 103. Thus, the low-level potential is input from the terminal C1T through the transistor Tr19 to the terminal ST in the circuit SR[1]. Furthermore, in the circuit SR[1], the high-level potential is applied from the terminal C3T, and accordingly, the high-level potential is applied to the gate and the back gate of the transistor Tr13. Thus, the transistor Tr13 is turned on.

At this time, the transistor Tr14 is also in an on state; thus, the potential VDD is applied to the gate and the back gate of the transistor Tr12, the gate and the back gate of the transistor Tr20, the gate and the back gate of the transistor Tr23, and the capacitor C11. Thus, the transistor Tr12, the transistor Tr20, and the transistor Tr23 are turned on.

When the transistor Tr20 is turned on, the GND potential is applied to the terminal ST. In addition, when the transistor Tr23 is turned on, the GND potential is applied to the terminal OT.

When the transistor Tr12 is turned on, the GND potential is applied to the second terminal of the transistor Tr11, the first terminal of the transistor Tr18, and the first terminal of the transistor Tr21. Note that the transistor Tr18 and the transistor Tr21 are always in an on state for the circuit configuration, and the GND potential is applied to the gate and the back gate of the transistor Tr19 and the gate and the back gate of the transistor Tr22. Thus, the transistor Tr19 and the transistor Tr22 are turned off.

The potential VDD is applied to the first terminal of the capacitor C11. Since the transistor Tr16 is in an off state, the capacitor C11 holds the potential VDD. The transistor Tr16 is not turned on unless the high-level potential is input from the terminal IT. In other words, the capacitor C11 holds the potential VDD until the high-level potential is input from the terminal IT.

[Circuit SR[2] and Thereafter]

In the case of the circuit SR[2], as shown in FIG. 26A, the clock signal CLK2 is input to the terminal C1T of the circuit SR[2], the clock signal CLK3 is input to the terminal C2T of the circuit SR[2], the clock signal CLK4 is input to the terminal C3T of the circuit SR[2], and the pulse width control signal PWC2 is input to the terminal PT of the circuit SR[2].

In the operation of the circuit SR[1], from the time T2 to the time T7, the terminal ST has a high-level potential. In other words, from the time T2 to the time 77, the high-level potential output from the terminal ST of the circuit SR[1] is input to the terminal IT of the circuit SR[2].

The circuit SR[2] has a circuit configuration similar to that of the circuit SR[1], and thus, the circuit SR[2] operates in a manner similar to that of the circuit SR[1]. From the time T2 to the time T7, the high-level potential is input to the terminal IT of the circuit SR[2]. When the high-level potential is input as the pulse width control signal PWC2 to the terminal PT of the circuit SR[2] while the terminal IT of the circuit SR[2] has the high-level potential, the high-level potential is output from the terminal OT of the circuit SR[2]. Furthermore, when the clock signal CLK2 has the high-level potential (from the time T4 to a time T8), the high-level potential is output from the terminal ST of the circuit SR[2]. From the time T8 to a time T9, the low-level potential is output from the terminal ST of the circuit SR[2], and the potential VDD is held at the capacitor C11 of the circuit SR[2].

Figure 30:
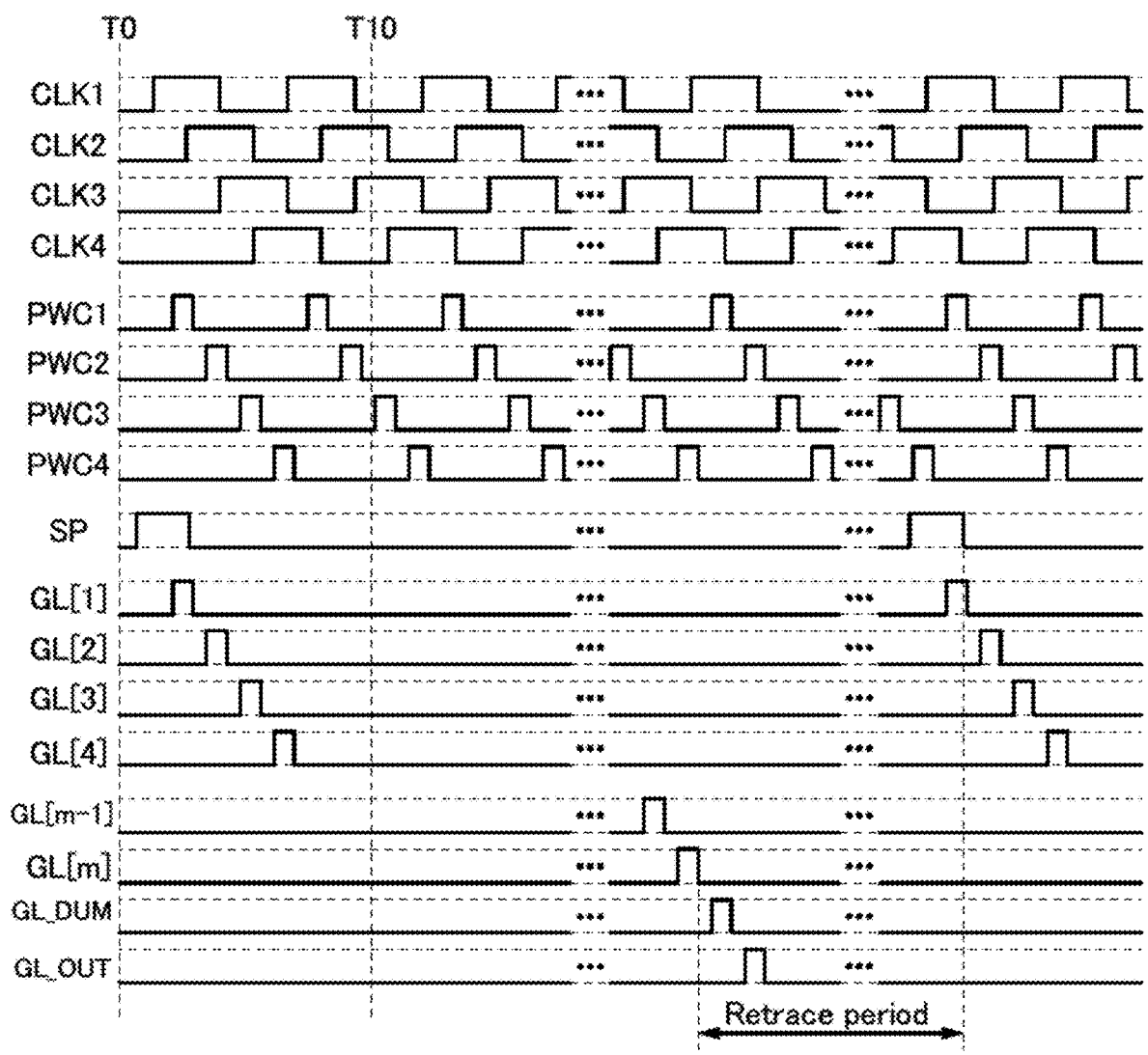
FIG. 30 is a timing chart showing an operation example of a gate driver.

In the circuit SR[3] and the subsequent circuits SR, the high-level potential is input to the terminal IT, and the high-level potential is input to the terminal C1T, the terminal C2T, the terminal C3T, and the terminal PT at a predetermined timing, whereby the high-level potential can be output from the terminal OT and the terminal ST in an operation similar to those of the circuit SR[1] and the circuit SR[2]. FIG. 30 is a timing chart showing operations following the time T10 of the gate driver 103 in addition to the operations from the time T0 to the time T10. After the high-level potential is output from the wiring GL[m], a high-level potential is input as a start pulse signal to the terminal IT of the circuit SR[1] during a retrace period. Note that the retrace period indicates a period from a time at which the potential of the wiring GL[m] decreases from the high-level potential to the low-level potential to a time at which the potential of the start pulse signal decreases from the high-level potential to the low-level potential.

[Terminal RT of Circuit SR]

The terminal RT of the circuit SR[p] is electrically connected to the terminal ST of the circuit SR[p+2]. In other words, when the high-level potential is output from the terminal ST of the circuit SR[p+2], a high-level potential is input to the terminal RT of the circuit SR[p], and accordingly, the transistor Tr15 of the circuit SR[p] is turned on. Thus, the potential VDD is applied to the gate and the back gate of the transistor Tr12, the gate and the back gate of the transistor Tr20, the gate and the back gate of the transistor Tr23, and the capacitor C11.

When the transistor Tr20 is turned on, the GND potential is applied to the terminal ST. In addition, when the transistor Tr23 is turned on, the GND potential is applied to the terminal OT. Moreover, when the transistor Tr12 is turned on, the GND potential is applied to the second terminal of the transistor Tr11, the first terminal of the transistor Tr18, and the first terminal of the transistor Tr21. Note that the transistor Tr18 and the transistor Tr21 are always in an on state for the circuit configuration, and accordingly, the GND potential is applied to the gate and the back gate of the transistor Tr19 and the gate and the back gate of the transistor Tr22. Thus, the transistor Tr19 and the transistor Tr22 are turned off.

In other words, when the high-level potential is output from the terminal ST of the circuit SR[p+2] to the terminal RT of the circuit SR[p], the GND potential is output from each of the terminal OT and the terminal ST as in a manner similar to that of the circuit SR[1] from the time T7 to the time T8.

[Terminal IRT of Circuit SR]

The initialization reset signal INI_RES is input to each of the terminals IRT of the circuits SR[1] to SR[m], the circuit SR_D[1], and the circuit SR_D[2]. When the initialization reset signal INI_RES has a high-level potential, the high-level potential is input to each of the terminals IRT of the above circuits. The transistor Tr17 of each circuit is turned on.

Thus, the potential VDD is applied to the gate and the back gate of the transistor Tr12, the gate and the back gate of the transistor Tr20, the gate and the back gate of the transistor Tr23, and the capacitor C11.

When the transistor Tr20 is turned on, the GND potential is applied to the terminal ST of each circuit. In addition, when the transistor Tr23 is turned on, the GND potential is applied to the terminal OT of each circuit. Moreover, when the transistor Tr12 is turned on, the GND potential is applied to the second terminal of the transistor Tr11, the first terminal of the transistor Tr18, and the first terminal of the transistor Tr21. Note that the transistor Tr18 and the transistor Tr21 are always in an on state for the circuit configuration, and accordingly the GND potential is applied to the gate and the back gate of the transistor Tr19 and the gate and the back gate of the transistor Tr22. Thus, the transistor Tr19 and the transistor Tr22 are tuned off.

In other words, a high-level potential is input as the initialization reset signal INI_RES, the GND potential is output from the terminal OT and the terminal ST of each of the circuits SR[1] to SR[m], the circuit SR_D[1], and the circuit SR_D[2].

Note that this embodiment is effective not only in the display device 100 but also in the display device 100A.

This embodiment can be combined with any of the other embodiments in this specification as appropriate.

Embodiment 4

In this embodiment, a chip of a source driver IC or a controller IC that can be mounted on the display device 100 or the display device 100A described in Embodiment 2 will be described.

<Source Driver IC>

Figure 31:
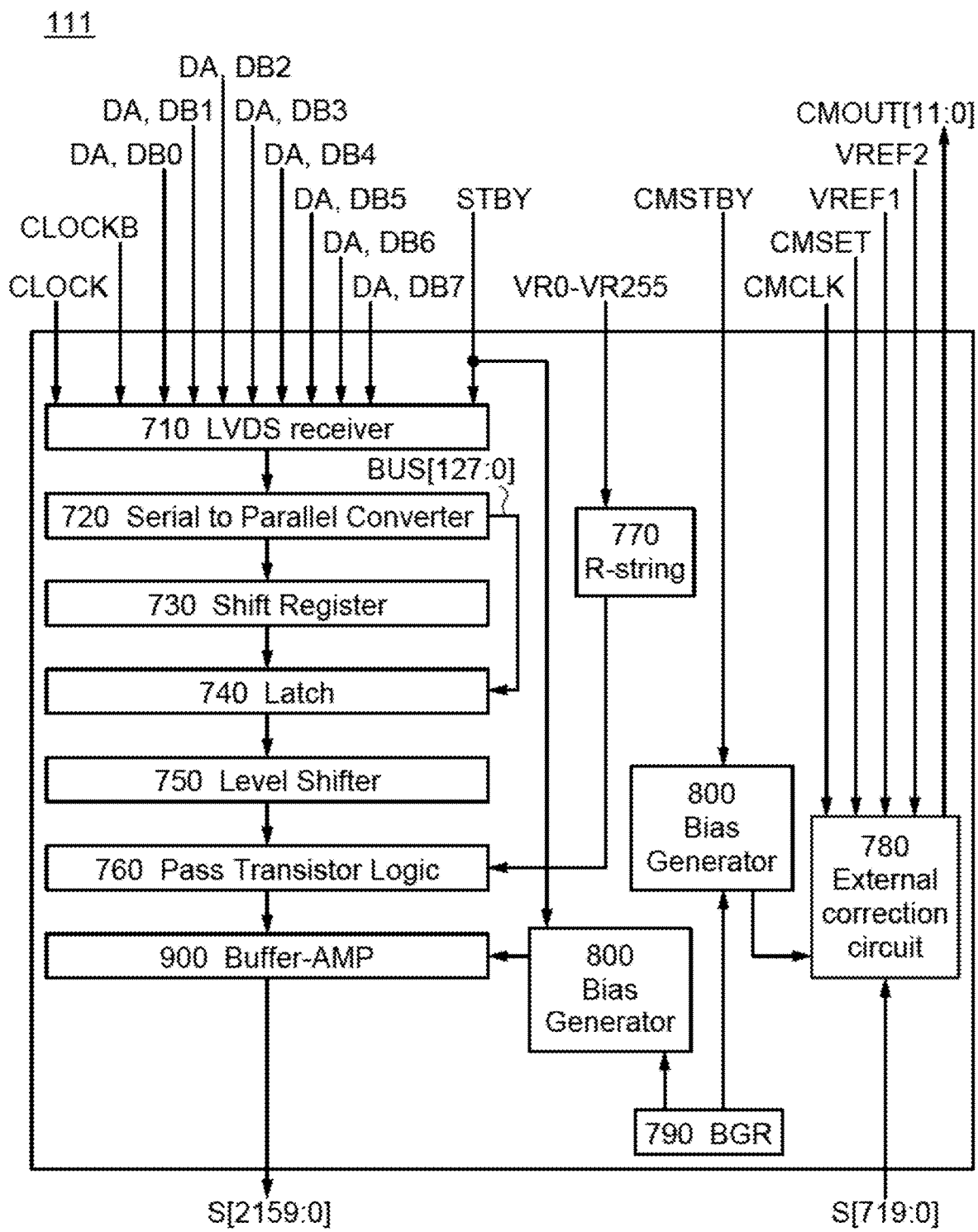
FIG. 31 is a block diagram illustrating a configuration example of a source driver IC.

FIG. 31 is a block diagram illustrating an example of a source driver IC. The source driver IC 111 includes a low voltage differential signaling (LVDS) receiver 710, a serial-parallel converter circuit 720, a shift register circuit 730, a latch circuit 740, a level shifter 750, a pass transistor logic circuit 760, a resistor string circuit 770, an external correction circuit 780, a band gap reference (BGR) circuit 790, bias generators 800, and a buffer amplifier 900. Note that the number of the bias generators 800 included in the source driver IC 111 in FIG. 31 is two.

The LVDS receiver 710 is electrically connected to an external host processor. The LVDS receiver 710 has a function of receiving video signals from the host processor. Moreover, the LVDS receiver 710 converts a differential signal into a single-ended signal and sends the signal to the serial-parallel converter circuit 720. In FIG. 31, an analog voltage signal Da, DB0, an analog voltage signal DA, DB1, an analog voltage signal DA, DB2, an analog voltage signal DA, DB3, an analog voltage signal DA, DB4, an analog voltage signal DA, DB5, an analog voltage signal DA, DB6, and an analog voltage signal DA, DB7 are input as video signals to the LVDS receiver 710. Note that the LVDS receiver 710 sequentially operates in response to inputs of a clock signal CLOCK and a clock signal CLOCKB and can change from a driving state to a standby state (can be temporarily stopped) in response to a standby signal STBY. Note that the clock signal CLOCKB is an inverted signal of the clock signal CLOCK.

The serial-parallel converter circuit 720 is electrically connected to the LVDS receiver 710. The serial-parallel converter circuit 720 has a function of receiving a single-ended signal from the LVDS receiver 710. Moreover, the serial-parallel converter circuit 720 converts the single-ended signal into parallel signals and transmits the signals as signals BUS[127:0] to internal buses.

The shift register circuit 730 is electrically connected to the serial-parallel converter circuit 720, and the latch circuit 740 is electrically connected to the shift register circuit 730. The shift register circuit 730 has a function of designating the timing at which data in the internal bus is stored in the latch circuit 740 in each line, in synchronization with the serial-parallel converter circuit 720.

The level shifter 750 is electrically connected to the latch circuit 740. The level shifter 750 has a function of shifting the levels of pieces of data in all the lines when the pieces of data in all the lines are stored in the latch circuit 740.

The pass transistor logic circuit 760 is electrically connected to the level shifter 750 and the resistor string circuit 770. Note that the pass transistor logic circuit 760 and the resistor string circuit 770 form a digital to analog converter (DAC). An 8-bit signal (denoted by VR0-VR255 in FIG. 31) is input to the resistor string circuit 770, and the resistor string circuit 770 outputs a potential corresponding to the signal to the pass transistor logic circuit 760. The pass transistor logic circuit 760 has a function of digital-analog conversion of the pieces of data with the shifted levels when the potential is supplied.

The buffer amplifier 900 is electrically connected to the pass transistor logic circuit 760. The buffer amplifier 900 has a function of amplifying the data subjected to digital-analog conversion and sending the amplified data as a data signal (denoted by S[2159:0] in FIG. 31) to a pixel array.

The BGR circuit 790 has a function of generating a voltage serving as a reference for driving the source driver IC 111. The BGR circuit 790 is electrically connected to each of the bias generators.

One of the bias generators 800 is electrically connected to the BGR circuit 790 and the buffer amplifier 900. The one bias generator 800 has a function of generating a bias voltage for driving the buffer amplifier 900 on the basis of the voltage serving as a reference that is generated in the BGR circuit 790. Note that the standby signal STBY is input to the one bias generator 800 at the same timing as the input of the standby signal STBY to the LVDS receiver 710 to cause the one bias generator 800 to enter a standby state (to stop temporarily or to enter an idling stop state).

The other of the bias generators 800 is electrically connected to the external correction circuit 780. The other of the bias generators 800 has a function of generating a bias voltage for driving the external correction circuit 780 on the basis of the voltage serving as a reference that is generated in the BGR circuit 790. Note that when the external correction circuit 780 does not need to operate, a standby signal CMSTBY is transmitted to the other bias generator 800 to cause the other bias generator 800 to enter a standby state (to stop temporarily or to enter an idling stop state).

The external correction circuit 780 is electrically connected to transistors included in pixels. When pixel transistors in the pixel array have variations in voltage-current characteristics, the variations influence an image displayed on the display device, causing reduction in the display quality of the display device. The external correction circuit 780 has a function of measuring the amount of current flowing thought the pixel transistor and adjusting the amount of the current flowing through the pixel transistor as appropriate depending on the measured current amount. A set signal CMSET is input to the external correction circuit 780 to initialize the external correction circuit 780. The external correction circuit 780 operates with input of a clock signal CMCLK. The external correction circuit 780 is supplied with signals (denoted by S[719:0] in FIG. 31) from the transistors included in the pixel circuits, and makes determination related to image correction with a reference potential VREF1 and a reference potential VREF2 that are supplied to the external correction circuit 780, used as references. A result of the determination relating to correction is sent as an output signal CMOUT[11:0] to an image processor provided in the outside of the source driver IC 111. The image processor corrects image data on the basis of the contents of CMOUT[11:0].

Note that the source driver IC 111 is not necessarily provided with the external correction circuit 780. For example, instead of the external correction circuit 780 provided in the source driver IC 111, a correction circuit may be provided in each pixel included in the pixel array.

Alternatively, for example, the external correction circuit 780 may be provided in a controller IC described later, instead of being provided in the source driver IC 111.

To form circuits in the source driver IC 111, high withstand-voltage Si transistors are preferably used. With the high withstand-voltage Si transistors, miniaturization of the circuits in the source driver IC 111 becomes possible in some cases, and thus, a high-resolution display device can be achieved.

<Controller IC>

Figure 32:
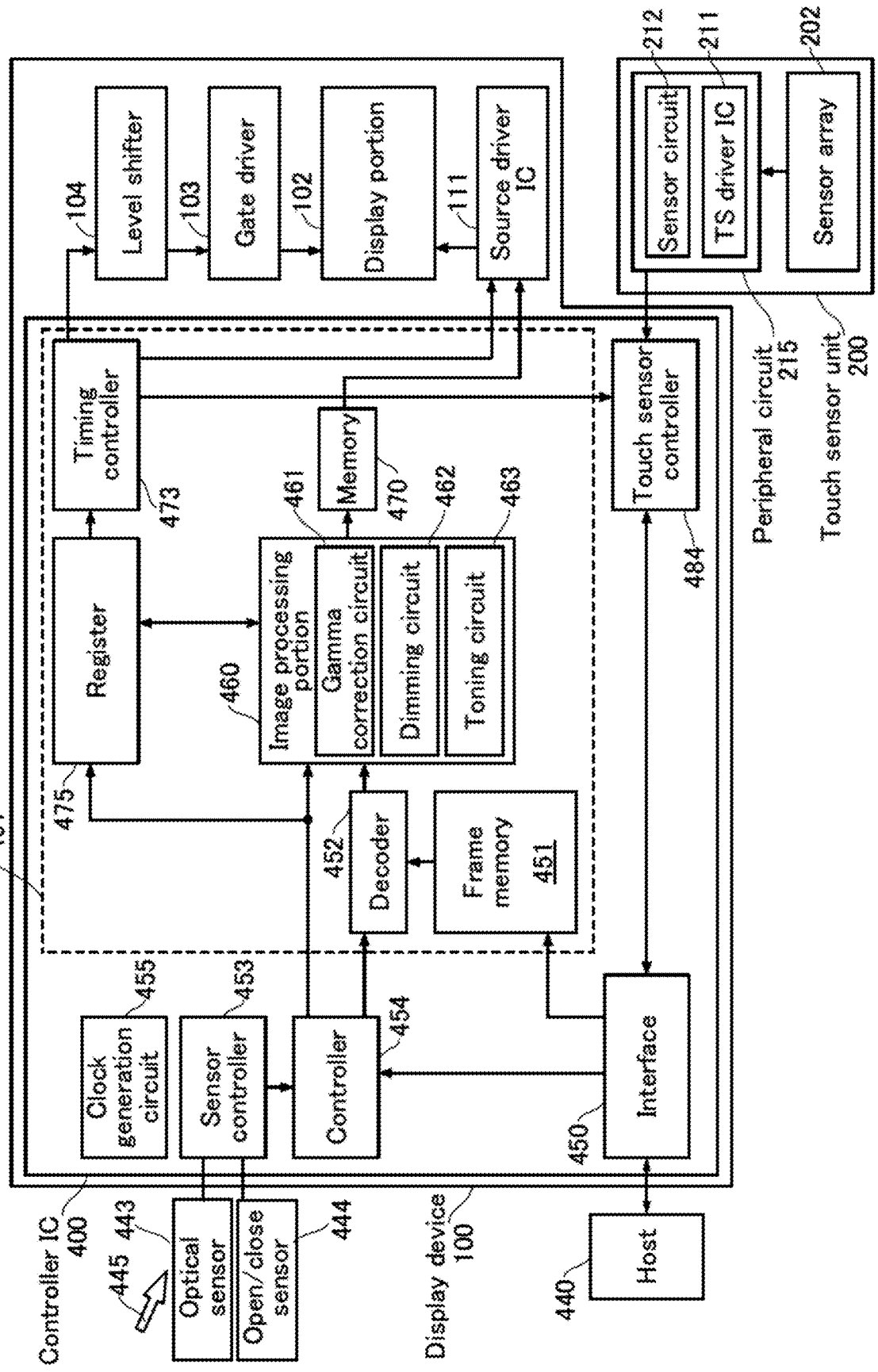
FIG. 32 is a block diagram illustrating a configuration example of a controller IC.

FIG. 32 is a block diagram illustrating a structure example of a controller IC 400 that can be used for the display device 100. The controller IC 400 is an example of the controller IC 112 and includes an interface 450, a frame memory 451, a decoder 452, a sensor controller 453, a controller 454, a clock generation circuit 455, an image processing portion 460, a memory 470, a timing controller 473, a register 475, and a touch sensor controller 484.

The controller IC 400 is preferably mounted on a base by a COG method. FIG. 32 shows functions of the controller IC 400 in detail, which illustrates a host 440, the level shifter 104, the gate driver 103, the display portion 102, the source driver IC 111, and the touch sensor unit 200. Furthermore, as described in Embodiment 2, each of the level shifter 104, the gate driver 103, and the display portion 102 are preferably formed using OS transistors over the base.

Communication between the controller IC 400 and the host 440 is performed through the interface 450. Image data, a variety of control signals, and the like are transmitted from the host 440 to the controller IC 400. Information on a touch position or the like obtained by the touch sensor controller 484 is transmitted from the controller IC 400 to the host 440. Note that the decision whether the circuits included in the controller IC 400 are chosen or not is made as appropriate depending on the standard of the host 440, the specifications of the display device 100, and the like.

The frame memory 451 is a memory for storing the image data input to the controller IC 400. In the case where compressed image data is transmitted from the host 440, the frame memory 451 can store the compressed image data. The decoder 452 is a circuit for decompressing the compressed image data. When decompression of the image data is not needed, processing is not performed in the decoder 452. Alternatively, the decoder 452 can be provided between the frame memory 451 and the interface 450.

The image processing portion 460 has a function of performing various kinds of image processing on the image data. The image processing portion 460 includes a gamma correction circuit 461, a dimming circuit 462, and a toning circuit 463, for example.

The image data processed in the image processing portion 460 is output to the source driver IC 111 in FIGS. 18A and 18B through the memory 470. The memory 470 is a memory for temporarily storing image data. The source driver IC 111 has a function of processing the input image data and writing the image data to the source line of the display portion 102.

The timing controller 473 has a function of generating timing signals to be used in the source driver IC 111, the touch sensor controller 484, and the gate driver 103 in the display device 100. In one embodiment of the present invention, the level of a timing signal input to the gate driver 103 is shifted by the level shifter 104 in the display device 100, and then the signal is transmitted to the gate driver 103. The gate driver 103 has a function of selecting a pixel in the display portion 102.

The touch sensor controller 484 has a function of controlling the TS driver IC 211 and the sense circuit 212 of the touch sensor unit 200 in FIG. 32. A signal including touch information read from the sense circuit 212 is processed in the touch sensor controller 484 and transmitted to the host 440 through the interface 450. The host 440 generates image data reflecting the touch information and transmits the image data to the controller IC 400. Note that the controller IC 400 can reflect the touch information in the image data.

The clock generation circuit 455 has a function of generating a clock signal to be used in the controller IC 400. The controller 454 has a function of processing a variety of control signals transmitted from the host 440 through the interface 450 and controlling a variety of circuits in the controller IC 400. The controller 454 also has a function of controlling power supply to the variety of circuits in the controller IC 400. Hereinafter, temporary stop of power supply to a circuit that is not used is referred to as power gating.

The register 475 stores data used for the operation of the controller IC 400. The data stored in the register 475 includes a parameter used to perform correction processing in the image processing portion 460, parameters used to generate waveforms of a variety of timing signals in the timing controller 473, and the like. The register 475 is provided with a scan chain register including a plurality of registers.

The sensor controller 453 is electrically connected to the optical sensor 443. The optical sensor 443 senses external light 445 and generates a sensor signal. The sensor controller 453 generates a control signal on the basis of the sensor signal. The control signal generated in the sensor controller 453 is output to the controller 454, for example. Note that the optical sensor 443 is not necessarily provided.

The dimming circuit 462 has a function of adjusting brightness (also called luminance) of image data displayed on the display portion 102. Here, the adjustment can be referred to as dimming or dimming treatment. In particular, the dimming treatment can be performed in combination with the optical sensor 443. In this case, measurement is performed using the optical sensor 443 and the sensor controller 453. The luminance of the image data displayed on the display portion 102 can be adjusted in accordance with the brightness of the external light 445.

The toning circuit 463 can correct a color (also called a color tone) of image data displayed on the display portion 102. Here, the correction can be referred to as toning or toning treatment.

The image processing portion 460 might include another processing circuit such as an RGB-RGBW conversion circuit depending on the specifications of the display device 100. The RGB-RGBW conversion circuit has a function of converting image data of red, green, and blue (RGB) into image signals of red, green, blue, and white (RGBW). That is, in the case where the display device 100 includes pixels of four colors of RGBW, power consumption can be reduced by displaying a white (W) component in the image data using the white (W) pixel. Note that in the case where the display device 100 includes pixels of four colors of RGBY, for example, a RGB-RGBY (red, green, blue, and yellow) conversion circuit can be used.

<Parameter>

Image correction processing such as gamma correction, dimming, or toning corresponds to processing of generating output correction data Y with respect to input image data X. The parameter that the image processing portion 460 uses is a parameter for converting the image data X into the correction data Y.

Figure 33A:
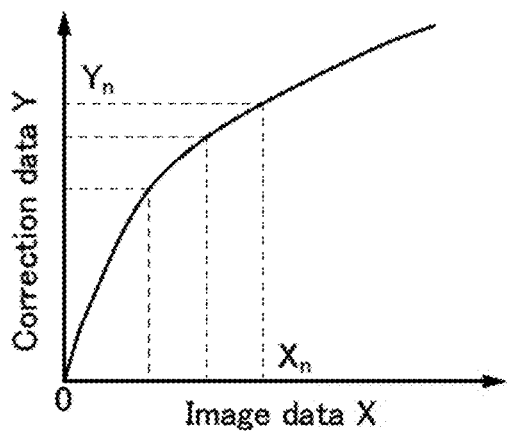
FIGS. 33A to 33C each illustrate a parameter.
Figure 33B:
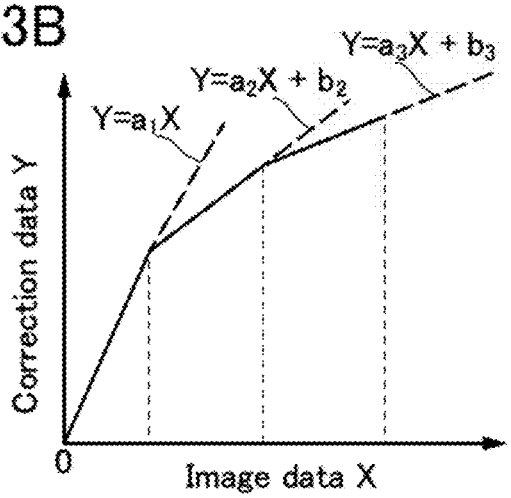

As a parameter setting method, there are a table method and a function approximation method. In a table method shown in FIG. 33A, correction data $Y_n$ with respect to image data $X_n$ is stored in a table as a parameter. In the table method, a number of registers for storing the parameters that correspond to the table is necessary; however, correction can be performed with high degree of freedom. In contrast, in the case where the correction data Y with respect to the image data X can be empirically determined in advance, it is effective to employ a function approximation method as shown in FIG. 33B. Note that $a_1$, $a_2$, $b_2$, and the like are parameters. Although a method of performing linear approximation in every period is shown here, a method of performing approximation with a nonlinear function can be employed. In the function approximation method, correction is performed with low degree of freedom; however, the number of registers for storing parameters that defines a function can be small.

Figure 33C:
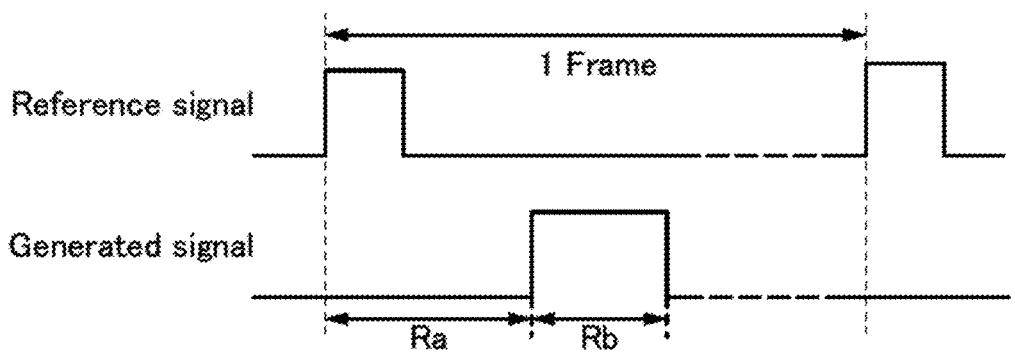

The parameter that the timing controller 473 uses indicates timing at which a generation signal of the timing controller 473 becomes a low-level potential "L" (or high-level potential "H") with respect to a reference signal as explained in FIG. 33C. A parameter Ra (or Rb) indicates the number of clock cycles that corresponds to timing at which the parameter becomes "L" (or "H") with respect to the reference signal.

The above parameter for correction can be stored in the register 475. Other parameters that can be stored in the register 475 include data of the EL correction circuit 464, luminance, color tones, and setting of energy saving (time until display is made dark or turn off display) of the display device 100 which are set by a user, sensitivity of the touch sensor controller 484, and the like.

<Power Gating>

In the case where image data transmitted from the host 440 is not changed, the controller 454 can conduct power gating on some circuits in the controller IC 400. Specifically, for example, the circuits subjected to power gating are circuits in a region 490 (the frame memory 451, the decoder 452, the image processing portion 460, the memory 470, the timing controller 473, and the register 475). Power gating can be performed in the case where a control signal that indicates no change in the image data is transmitted from the host 440 to the controller IC 400 and detected by the controller 454.

The circuits subjected to power gating are not limited to the circuits in the controller IC 400. For example, the power gating may be performed on the source driver IC 111, the level shifter 104, the gate driver 103, and the like.

The circuits in the region 490 are the circuits relating to image data and the circuits for driving the display device 100; therefore, the circuits in the region 490 can be temporarily stopped in the case where the image data is not changed. Note that even in the case where the image data is not changed, a time during which a transistor used for a pixel in the display portion 102 can store data (time for idling stop) may be considered. Furthermore, in the case where a liquid crystal element is used as a reflective element in the pixel in the display portion 102, a time for inversion driving performed to prevent burn-in of the liquid crystal element may be considered.

For example, the controller 454 may be incorporated with a timer function so as to determine timing at which power supply to the circuits in the region 490 is restarted, on the basis of time measured by a timer. Note that it is possible to store image data in the frame memory 451 or the memory 470 in advance and supply the image data to the display portion 102 at inversion driving. With such a structure, inversion driving can be performed without transmitting the image data from the host 440. Thus, the amount of data transmitted from the host 440 can be reduced and the power consumption of the controller IC 400 can be reduced.

Specific circuit configurations of the frame memory 451 and the register 475 will be described below. Note that the circuits that can be power gated are not limited to the circuits in the region 490, the sensor controller 453, the touch sensor controller 484, and the like, which are described here. A variety of combinations can be considered depending on the configuration of the controller IC 400, the standard of the host 440, the specifications of the display device 100, and the like.

<Frame Memory 451>

FIG. 34A illustrates a configuration example of the frame memory 451. The frame memory 451 includes a control portion 502, a cell array 503, and a peripheral circuit 508. The periphery circuit 508 includes a sense amplifier circuit 504, a driver 505, a main amplifier 506, and an input/output circuit 507.

The control portion 502 has a function of controlling the frame memory 451. For example, the control portion 502 controls the driver 505, the main amplifier 506, and the input/output circuit 507.

The driver 505 is electrically connected to a plurality of wirings WL and CSEL. The driver 505 generates signals output to the plurality of wirings WL and CSEL.

The cell array 503 includes a plurality of memory cells 509. The memory cells 509 are electrically connected to wirings WL, LBL (or LBLB), and BGL. The wiring WL is a word line. The wirings LBL and LBLB are local bit lines. Although a folded-bit-line method is employed for the configuration of the cell array 503 in the example of FIG. 34A, an open-bit-line method can also be employed.

FIG. 34B illustrates a configuration example of the memory cell 509. The memory cell 509 includes a transistor MW1 and a capacitor CS1. The memory cell 509 has a circuit configuration similar to that of a memory cell for a dynamic random access memory (DRAM).

The transistor MW1 is an OS transistor. Since an OS transistor has an extremely low off-state current, the frequency of refresh operation of the frame memory 451 can be reduced because leakage of charge from the capacitor CS1 can be suppressed by forming the memory cell 509 using an OS transistor. The frame memory 451 can retain image data for a long time even when power supply is stopped. Moreover, by setting the voltage Vbg_w1 to a negative voltage, the threshold voltage of the transistor MW1 can be shifted to the positive potential side and thus the retention time of the memory cell 509 can be increased.

Here, an off-state current refers to a current that flows between a source and a drain of a transistor in an off state. In the case of an n-channel transistor, for example, when the threshold voltage of the transistor is approximately 0 V to 2 V, a current flowing between a source and a drain when a voltage of a gate with respect to the source is negative can be referred to as an off-state current. An extremely low off-state current means that, for example, an off-state current per micrometer of channel width is lower than or equal to 100 zA (z represents zepto and denotes a factor of $10^{-21}$). Since the off-state current is preferably as low as possible, the normalized off-state current is preferably lower than or equal to 10 zA/μm or lower than or equal to 1 zA/μm), further preferably lower than or equal to 10 yA/μm (y represents yocto and denotes a factor of $10^{-24}$).

A metal oxide (oxide semiconductor) in a channel formation region of an OS transistor has a bandgap of 3.0 eV or higher; thus, the OS transistor has a low leakage current due to thermal excitation and, as described above, an extremely low off-state current. The metal oxide in the channel formation region preferably contains at least one of indium (In) and zinc (Zn). Typical examples of such a metal oxide include an In-M-Zn oxide (M is Al, Ga, Y, or Sn, for example). By reducing impurities serving as electron donors, such as moisture or hydrogen, and also reducing oxygen vacancies, an i-type (intrinsic) or a substantially i-type oxide semiconductor can be obtained. Such a metal oxide can be referred to as a highly purified metal oxide. For example, by using a highly purified metal oxide, the off-state current of the OS transistor that is normalized by channel width can be as low as approximately several yoctoamperes per micrometer to several zeptoamperes per micrometer.

The transistors MW1 in the plurality of memory cells 509 included in the cell array 503 are OS transistors; Si transistors formed over a silicon wafer can be used as transistors in other circuits, for example. Accordingly, the cell array 503 can be stacked over the sense amplifier circuit 504. Thus, the circuit area of the frame memory 451 can be reduced, which leads to miniaturization of the controller IC 400.

The cell array 503 is stacked over the sense amplifier circuit 504. The sense amplifier circuit 504 includes a plurality of sense amplifiers SA. The sense amplifiers SA are electrically connected to adjacent wirings LBL and LBLB (a pair of local bit lines), wirings GBL and GBLB (a pair of global bit lines), and the plurality of wirings CSEL. The sense amplifiers SA have a function of amplifying the potential difference between the wirings LBL and LBLB.

In the sense amplifier circuit 504, one wiring GBL is provided for four wirings LBL, and one wiring GBLB is provided for four wirings LBLB. However, the configuration of the sense amplifier circuit 504 is not limited to the configuration example of FIG. 34A.

The main amplifier 506 is connected to the sense amplifier circuit 504 and the input/output circuit 507. The main amplifier 506 has a function of amplifying the potential difference between the wirings GBL and GBLB. The main amplifier 506 is not necessarily provided.

The input/output circuit 507 has a function of outputting a potential corresponding to a write data to the wirings GBL and GBLB or the main amplifier 506 and a function of outputting the potentials of the wirings GBL and GBLB or an output potential of the main amplifier 506 to the outside as read data. The sense amplifier SA from which data is read and the sense amplifier SA to which data is written can be selected in accordance with the signal of the wiring CSEL. Therefore, there is no need to provide a selection circuit such as a multiplexer in the input/output circuit 507. Thus, the input/output circuit 507 can have a simple circuit configuration and a small occupied area.

<Register 475>

Figure 35:
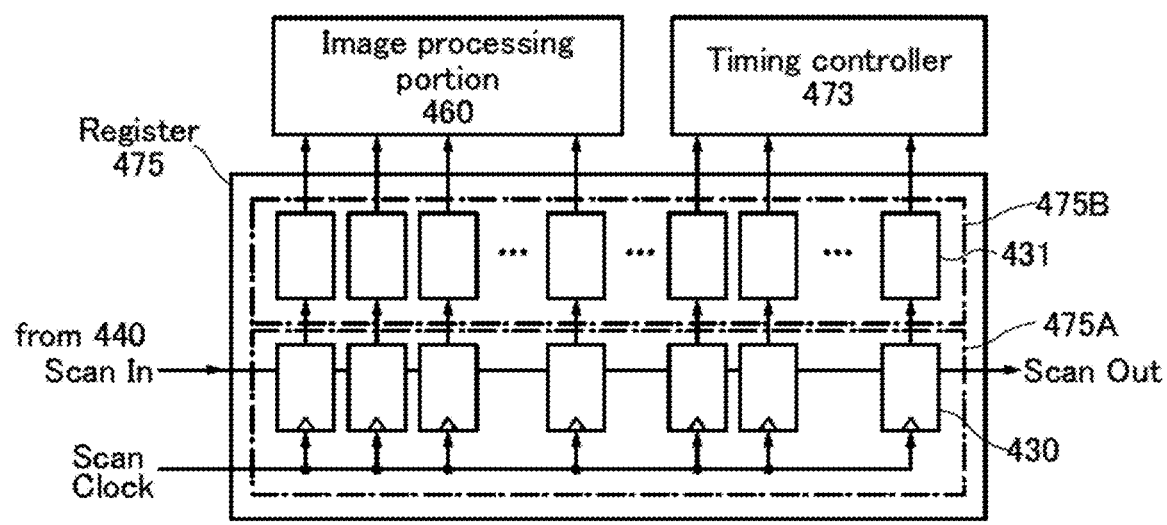
FIG. 35 is a block diagram illustrating a configuration example of a register.

FIG. 35 is a block diagram illustrating a configuration example of the register 475. The register 475 includes a scan chain register portion 475A and a register portion 475B. The scan chain register portion 475A includes a plurality of registers 430. The scan chain register is formed by the plurality of registers 430. The register portion 475B includes a plurality of registers 431.

The register 430 is a nonvolatile register which does not lose data even when power supply is stopped. Here, the register 430 is provided with a retention circuit including an OS transistor to be nonvolatile.

The other register 431 is a volatile register. There is no particular limitation on the circuit configuration of the register 431, and a latch circuit, a flip-flop circuit, or the like is used as long as data can be stored. The image processing portion 460 and the timing controller 473 access the register portion 475B and take data from the corresponding registers 431. Alternatively, the processing contents of the image processing portion 460 and the timing controller 473 are controlled in accordance with data supplied from the register portion 475B.

To update data stored in the register 475, first, data in the scan chain register portion 475A are changed. After the data in the registers 430 of the scan chain register portion 475A are rewritten, the data are loaded into the registers 431 of the register portion 475B at the same time.

Accordingly, the image processing portion 460, the timing controller 473, and the like can perform various kinds of processing using the data which are updated at the same time. The operation of the controller IC 400 can be stable because simultaneity can be maintained in updating data. By providing the scan chain register portion 475A and the register portion 475B, data in the scan chain register portion 475A can be updated even during the operation of the image processing portion 460 and the timing controller 473.

At the time when the power gating is executed in the controller IC 400, power supply is stopped after data is stored (saved) in the retention circuit of the register 430. After the power supply is restored, normal operation is restarted after data in the registers 430 are restored (loaded) in the register 431. Note that in the case where the data stored in the register 430 and the data stored in the register 431 do not match each other, it is preferable to save the data of the register 431 in the register 430 and then store the data again in the retention circuit of the register 430. For example, while updated data is inserting in the scan chain register portion 475A, the data do not match each other.

Figure 36:
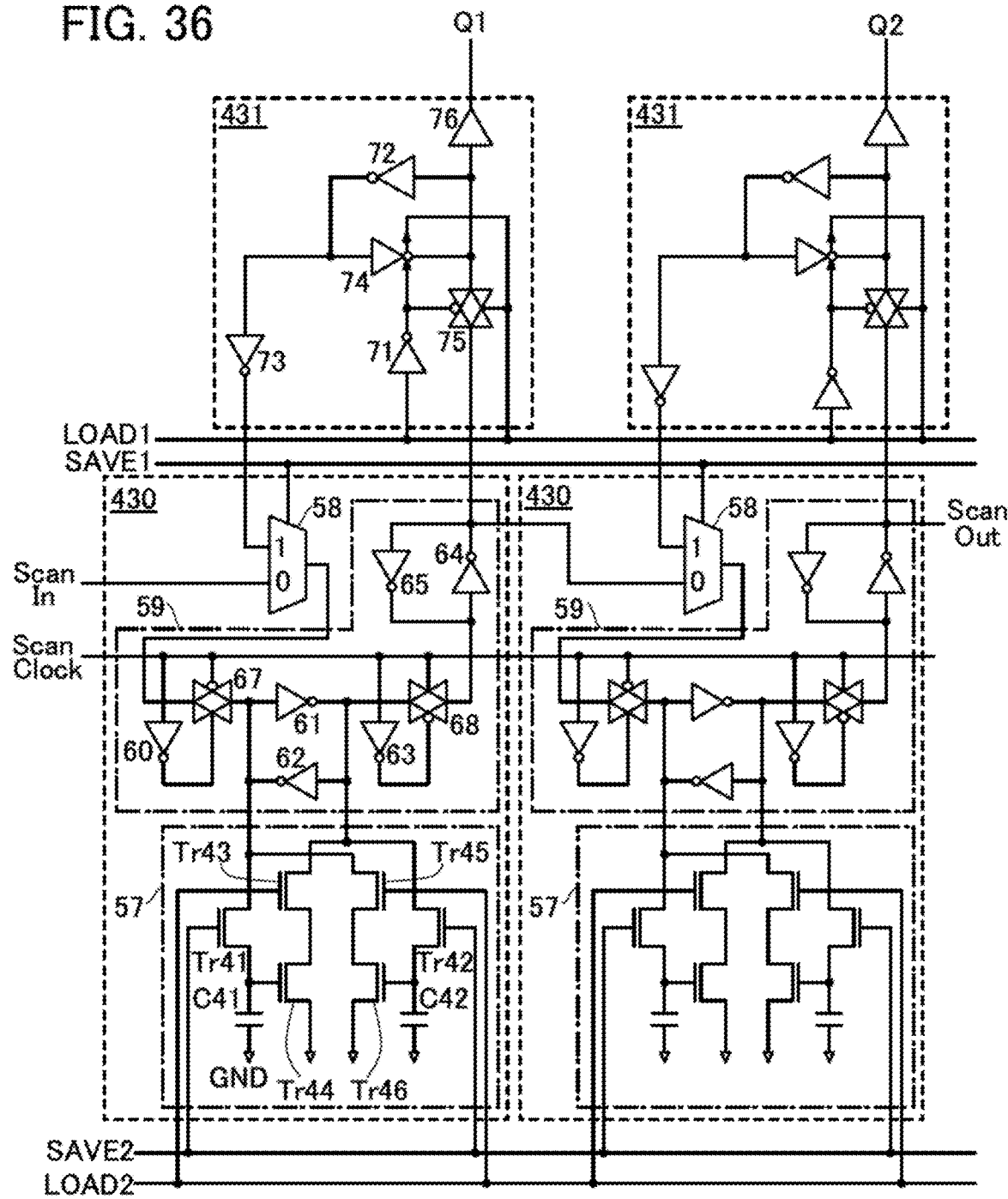
FIG. 36 is a circuit diagram illustrating a configuration example of registers.

FIG. 36 illustrates an example of a circuit configuration of the register 430 and the register 431. FIG. 36 illustrates two registers 430 of the scan chain register portion 475A and corresponding two registers 431.

The register 430 includes a retention circuit 57, a selector 58, and a flip-flop circuit 59. The selector 58 and the flip-flop circuit 59 form a scan flip-flop circuit.

A signal SAVE2 and a signal LOAD2 are input to the retention circuit 57. The retention circuit 57 includes transistors Tr41 to Tr46 and capacitors C41 and C42. Each of the transistors Tr41 and Tr42 is an OS transistor. The transistors Tr41 and Tr42 may each be an OS transistor having a back gate similar to the transistor MW1 of the memory cell 509 (see FIG. 34B).

A 3-transistor gain cell is formed by the transistor Tr41, the transistor Tr43, the transistor Tr44, and the capacitor C41. In a similar manner, a 3-transistor gain cell is formed by the transistor Tr42, the transistor Tr45, the transistor Tr46, and the capacitor C42. The two gain cells store complementary data retained in the flip-flop circuit 59. Since the transistor Tr41 and the transistor Tr42 are OS transistors, the retention circuit 57 can retain data for a long time even when power supply is stopped. In the register 430, the transistors other than the transistor Tr41 and the transistor Tr42 may be formed using Si transistors.

The retention circuit 57 stores complementary data retained in the flip-flop circuit 59 in response to the signal SAVE2 and loads the retained data in the flip-flop circuit 59 in response to the signal LOAD2.

An output terminal of the selector 58 is electrically connected to an input terminal of the flip-flop circuit 59, and an input terminal of the register 431 is electrically connected to a data output terminal. The flip-flop circuit 59 includes an inverter 60, an inverter 61, an inverter 62, an inverter 63, an inverter 64, an inverter 65, an analog switch 67, and an analog switch 68. The on or off state of each of the analog switch 67 and the analog switch 68 is controlled by a scan clock signal. The flip-flop circuit 59 is not limited to the circuit configuration in FIG. 36 and a variety of flip-flop circuits 59 can be employed.

An output terminal of the register 431 is electrically connected to one of two input terminals of the selector 58, and an output terminal of the flip-flop circuit 59 in the previous stage is electrically connected to the other input terminal of the selector 58. Note that data is input from the outside of the register 475 to the input terminal of the selector 58 in the first stage of the scan chain register portion 475A. The selector 58 outputs a signal from one of the two input terminals to the output terminal in accordance with a signal SAVE 1. Specifically, the selector 58 has a function of selecting either data transmitted from the flip-flop circuit 59 in the previous stage or data transmitted from the register 431 and inputting the selected data to the flip-flop circuit 59.

The register 431 includes an inverter 71, an inverter 72, an inverter 73, a clocked inverter 74, an analog switch 75, and a buffer 76. The register 431 loads the data of the flip-flop circuit 59 on the basis of a signal LOAD1. Then the loaded data is output from a terminal Q1 and a terminal Q2. The transistors of the register 431 may be formed using Si transistors.

<Another Configuration Example of Controller IC>

Another configuration example of a controller IC different from the controller IC 400 is described below.

Figure 37:
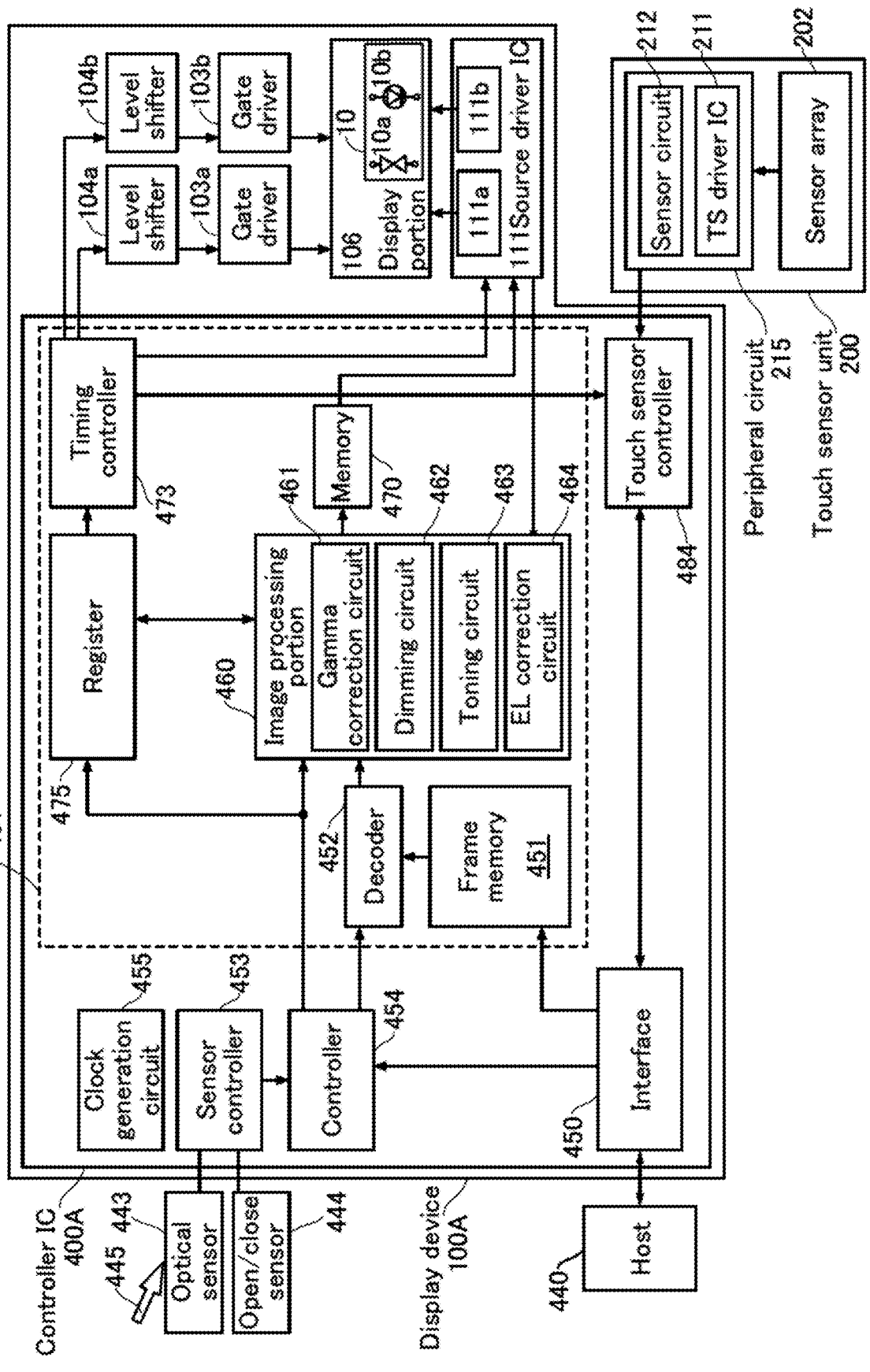
FIG. 37 is a block diagram illustrating a configuration example of a controller IC.

FIG. 37 is a block diagram illustrating a configuration example of the controller IC 112 that can be used for the display device 100A. A controller IC 400A illustrated in FIG. 37 is an example of the controller IC 112 and a modification example of the controller IC 400. The controller IC 112 includes a region 491, and the controller 454 controls the power supply to the circuits in the region 491. As the description of the controller IC 400A, only portions different from those of the controller IC 400 are made, and the description of the same portion as that in the controller IC 400 is omitted.

The controller IC 400A is preferably mounted on the base by a COG method. FIG. 37 shows functions of the controller IC 400A in detail, which illustrates the level shifter 104a, the level shifter 104b, the gate driver 103a, the gate driver 103b, the display portion 106, the source driver IC 111, and the touch sensor unit 200. As described in Embodiment 2, each of the level shifter 104a, the level shifter 104b, the gate driver 103a, the gate driver 103b, and the display portion 106 is formed using OS transistors over the base.

As described in Embodiment 2 and Embodiment 3, the display device 100A is a hybrid display device, and thus a pixel 10 of the display portion 106 in the display device 100A includes a reflective element 10a and a light-emitting element 10b. The reflective element 10a is a display element that displays an image with use of reflected light in the display device, and a liquid crystal element, for example, can be used as the reflective element 10a. The light-emitting element 10b is a display element that displays an image by self-emission in the display device, and an organic EL element, for example, can be used as the light-emitting element 10b. Note that the light-emitting element 10b is not limited to an organic EL element. For example, a transmissive liquid crystal element provided with a backlight, an LED, or a display element utilizing quantum dot may be used. In this case, the controller IC 400A in which a liquid crystal element is used as the reflective element 10a and an organic EL element is used as the light-emitting element 10b is described.

As described in Embodiment 2, the source driver IC 111 is mounted on the base 101 of the display device 100A by a COG method. In this configuration example, the source driver IC 111 includes a source driver IC 111a and a source driver IC 111b. The source driver IC 111a has a function of driving either the reflective element 10a or the light-emitting element 10b, and the source driver IC 111b has a function of driving the other of the reflective element 10a and the light-emitting element 10b. Although the source driver of the display portion 106 is formed using two kinds of the source drivers IC 111a and 111b, the configuration of the source driver is not limited thereto. For example, the display device 100A may include a source driver IC that enables both a source driver for driving the reflective element 10a and a source driver for driving the light-emitting element 10b to drive.

As described in Embodiment 2, the gate drivers 103a and 103b are formed over the base 101. The gate driver 103a has a function of driving a scanning line for one of the reflective element 10a and the light-emitting element 10b, and the gate driver 103b has a function of driving a scanning line for the other of the reflective element 10a and the light-emitting element 10b. Although two kinds of gate drivers, the gate drivers 103a and 103b, of the display portion 106 are used, the structure of the gate driver is not limited thereto. For example, the display device 100A may include a gate driver that can drive both the reflective element 10a and the light-emitting element 10b.

The display device 100A includes an organic EL element as the light-emitting element 10b, and thus the EL correction circuit 464 can be provided in the image processing portion 460 of the controller IC 400A. The EL correction circuit 464 is provided in the case where a current detection circuit for detecting the current flowing in the light-emitting element 10b is provided for the source driver IC (the source driver IC 111a or the source driver IC 111b) for driving the light-emitting element 10b. The EL correction circuit 464 has a function of adjusting luminance of the light-emitting element 10b on the basis of a signal transmitted from the current detection circuit.

In the controller IC 400A, the sensor controller 453 can be electrically connected to the optical sensor 443 as in the controller IC 400. The optical sensor 443 senses external light 445 and generates a sensor signal. The sensor controller 453 generates a control signal on the basis of the sensor signal. The control signal generated in the sensor controller 453 is output to the controller 454, for example.

In the case where the reflective element 10a and the light-emitting element 10b display the same image data, the image processing portion 460 has a function of separately generating image data that the reflective element 10a displays and image data that the light-emitting element 10b displays. In that case, reflection intensity of the reflective element 10a and emission intensity of the light-emitting element 10b can be adjusted (dimming treatment) in response to brightness of the external light 445 measured using the optical sensor 443 and the sensor controller 453.

In the case where the display device 100A is used outside at daytime on a sunny day, it is not necessary to make the light-emitting element 10b emit light if sufficient luminance can be obtained only with the reflective element 10a. This is due to the fact that favorable display cannot be obtained because, even when the light-emitting element 10b is used to perform display, the intensity of external light exceeds that of light emitted from the light-emitting element 10*b*. In contrast, in the case where the display device 100A is used at night or in a dark place, display is performed by making the light-emitting element 10*b* emit light.

In response to the brightness of external light, the image processing portion 460 can generate image data that only the reflective element 10*a* displays, image data that only the light-emitting element 10*b* displays, or image data that the reflective element 10*a* and the light-emitting element 10*b* display in combination. Accordingly, the display device 100A can perform favorable display even in an environment with high intensity of external light or an environment with low intensity of external light. Furthermore, the power consumption of the display device 100A can be reduced by making the light-emitting element 10*b* emit no light or reducing the luminance of the light-emitting element 10*b* in the environment with bright external light.

Color tones can be corrected by combining the display by the light-emitting element 10*b* with the display by the reflective element 10*a*. A function of measuring the color tones of the external light 445 may be added to the optical sensor 443 and the sensor controller 453 to perform such tone correction. For example, in the case where the display device 100 is used in a reddish environment at evening, a blue (B) component or a green (G) component is not sufficient or both of the components are not sufficient only with the display by the reflective element 10*a*; thus, the color tones can be corrected (calibration processing) by making the light-emitting element 10*b* emit light.

The reflective element 10*a* and the light-emitting element 10*b* can display different image data. In general, operation speed of liquid crystal, electronic paper, or the like that can be used as a reflective element is low in many cases (it takes time to display a picture). Thus, a still image to be a background can be displayed on the reflective element 10*a* and a moving mouse pointer or the like can be displayed on the light-emitting element 10*b*. By performing the above IDS driving on a still image and making the light-emitting element 10*b* emit light to display a moving image, the display device 100A can achieve display of a smooth moving image and reduction of power consumption at the same time. In that case, the frame memory 451 may be provided with regions for storing image data displayed on the reflective element 10*a* and image data displayed on the light-emitting element 10*b*.

The controller IC 400A may be provided with one or both of the TS driver IC 211 and the sense circuit 212. The same applies to the controller IC 400.

<<Operation Example>>

Operation examples of the controller IC 400A and the register 475 of the display device 100A before shipment, at boot-up of an electronic device including the display device 100A, and at normal operation will be described separately.

<Before Shipment>

Parameters relating to the specifications and the like of the display device 100A are stored in the register 475 before shipment. These parameters include, for example, the number of pixels, the number of touch sensors, parameters used to generate the variety of timing signals in the timing controller 473, and correction data of the EL correction circuit 464 in the case where the source driver IC (the source driver IC 111*a* or the source driver IC 111*b*) is provided with the current detection circuit that detects current flowing through the light-emitting element 10*b*. These parameters may be stored by providing a dedicated ROM other than the register 475.

<At Boot-Up>

At boot-up of an electronic device including the display device 100A, the parameters set by a user or the like which are transmitted from the host 440 are stored in the register 475. These parameters include, for example, luminance, color tones, sensitivity of a touch sensor, setting of energy saving (time taken to make display dark or turn off display), and a curve or a table for gamma correction. Note that in storing the parameters in the register 475, a scan clock signal and data corresponding to the parameters in synchronization with the scan clock signal are transmitted from the controller 454 to the register 475.

<Normal Operation>

Normal operation can be classified into a state of displaying a moving image or the like, a state capable of performing IDS driving while a still image is being displayed, a state of displaying no image, and the like. The image processing portion 460, the timing controller 473, and the like are operating in the state of displaying a moving image or the like; however, the image processing portion 460 and the like are not influenced because only the data of the register 475 in the scan chain register portion 475A are changed. After the data of the scan chain register portion 475A are changed, the data of the scan chain register portion 475A are loaded in the register portion 475B at the same time, so that change of the data of the register 475 is completed. The operation of the image processing portion 460 and the like is switched to the operation corresponding to the data.

In the state capable of performing IDS driving while a still image is displaying, the register 475 can be power gated in a manner similar to that of the other circuits in the region 490. In that case, the complementary data retained in the flip-flop circuit 59 is stored in the retention circuit 57 in response to the signal SAVE2 before the power gating in the register 430 included in the scan chain register portion 475A.

To restore the data retained in the retention circuit 57 from power gating, the data is loaded in the flip-flop circuit 59 in response to the signal LOAD2 and the data in the flip-flop circuit 59 is loaded in the register 431 in response to the signal LOAD1. In this manner, the data of the register 475 becomes effective in the same state as before the power gating. Note that even when the register 475 is in a state of power gating, the parameter of the register 475 can be changed by canceling the power gating in the case where change of the parameter is requested by the host 440.

In the state of displaying no image, for example, the circuits (including the register 475) in the region 490 can be power gated. In that case, the operation of the host 440 might also be stopped; however, when the data in the frame memory 451 and the register 475 are restored from the power gating, the frame memory 451 and the register 475 can perform display (a still image) before power gating without waiting the restore of the host 440 because they are nonvolatile.

For example, a configuration in which an open/close sensor 444 is electrically connected to the sensor controller 453 in the display device 100A is considered. In particular, in the case where the display device 100A with the above configuration is employed for a display portion of a foldable mobile phone, when the mobile phone is folded and the display surface of the display device 100A is sensed to be unused by a signal from the open/close sensor 444, the sensor controller 453, the touch sensor controller 484, and the like can be power gated in addition to the circuits in the region 490.

When the mobile phone is folded, the operation of the host 440 might be stopped depending on the standard of the host 440. Even when the mobile phone is unfolded while the operation of the host 440 is stopped, the image data in the frame memory 451 can be displayed before image data, a variety of control signals, and the like are transmitted from the host 440 because the frame memory 451 and the register 475 are nonvolatile.

In such a manner, the register 475 includes the scan chain register portion 475A and the register portion 475B and data of the scan chain register portion 475A are changed, so that the data can be changed smoothly without influencing the image processing portion 460, the timing controller 473, and the like. Each register 430 in the scan chain register portion 475A includes the retention circuit 57 and can perform transfer to and restore from a power gated state smoothly.

A logic Si transistor and an OS transistor can be formed over one base. For example, a logic Si transistor is formed on a Si wafer, and an OS transistor is formed above the logic Si transistor, whereby the above-described controller IC 400 or 400A can be achieved.

This embodiment can be combined with any of the other embodiments in this specification as appropriate.

Embodiment 5

In this embodiment, a specific structure of the display device 100A that is a hybrid display device will be described.

<Cross-Sectional View>

Figure 38:
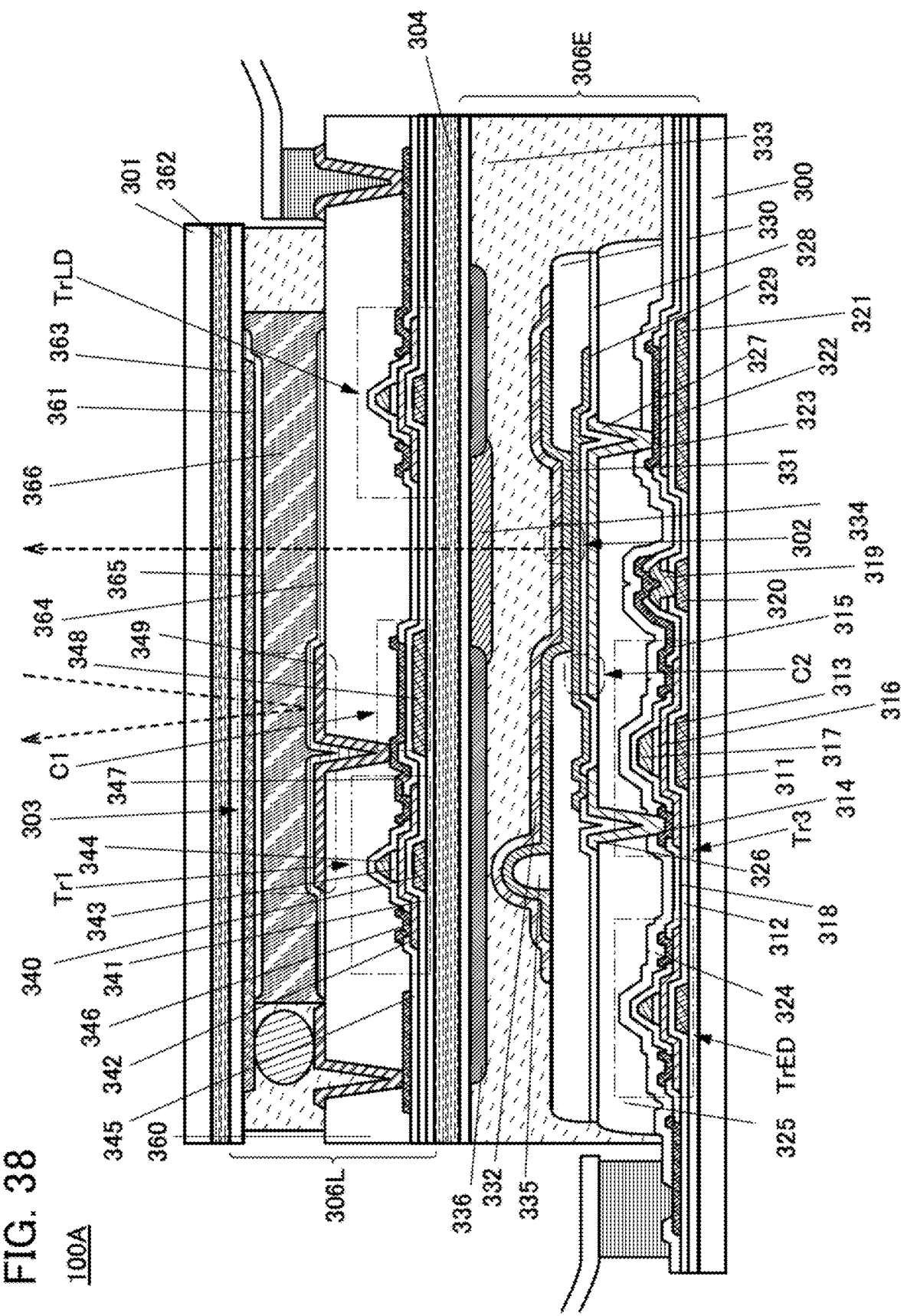
FIG. 38 is a cross-sectional view illustrating an example of a display device.

FIG. 38 is a cross-sectional view illustrating the display device 100A. The display device 100A in FIG. 38 includes the pixel circuit 35 or the pixel circuit 36 described in Embodiment 3.

The display device 100A in FIG. 38 has such a structure that a display portion 306E and a display portion 306L are stacked between a substrate 300 and a substrate 301. Specifically, the display portion 306E and the display portion 306L are bonded to each other with a bonding layer 304 in FIG. 38.

In addition, a light-emitting element 302, the transistor Tr3, and the capacitor C2 included in a pixel of the display portion 306E, and a transistor TrED included in a driver circuit of the display portion 306E are illustrated in FIG. 38. The light-emitting element 302 corresponds to the light-emitting element 10b in the other embodiment. The transistor Tr3 and the capacitor C2 are each described in Embodiment 3.

FIG. 38 also illustrates a liquid crystal element 303, the transistor Tr1, and the capacitor C1, which are included in a pixel of the display portion 306L, and a transistor TrLD included in a driver circuit of the display portion 306L. The liquid crystal element 303 corresponds to the reflective element 10a described in the other embodiment. The transistor Tr1 and the capacitor C1 are described in Embodiment 3.

The transistor Tr3 includes a conductive layer 311 functioning as a back gate, an insulating layer 312 over the conductive layer 311, a semiconductor layer 313 which is provided over the insulating layer 312 to overlap with the conductive layer 311, an insulating layer 316 over the semiconductor layer 313, a conductive layer 317 which functions as a gate and is positioned over the insulating layer 316, and conductive layers 314 and 315 which are positioned over an insulating layer 318 over the conductive layer 317 and electrically connected to the semiconductor layer 313.

The conductive layer 315 is electrically connected to a conductive layer 319, and the conductive layer 319 is electrically connected to a conductive layer 320. The conductive layer 319 is formed in the same layer as the conductive layer 317. The conductive layer 320 is formed in the same layer as the conductive layer 311.

A conductive layer 321 which functions as a back gate of the transistor Tr2 (not illustrated) is positioned in the same layer as the conductive layers 311 and 320. The insulating layer 312 is positioned over the conductive layer 321, and a semiconductor layer 322 having a region overlapping with the conductive layer 321 is positioned over the insulating layer 312. The semiconductor layer 322 includes a channel formation region of the transistor Tr2 (not illustrated). The insulating layer 318 is positioned over the semiconductor layer 322, and a conductive layer 323 is positioned over the insulating layer 318. The conductive layer 323 is electrically connected to the semiconductor layer 322 and serves as a source electrode or a drain electrode of the transistor Tr2 (not illustrated).

The transistor TrED has the same structure as the transistor Tr3, and therefore, detailed description thereof is omitted.

An insulating layer 324 is positioned over the transistor Tr3, the conductive layer 323, and the transistor TrED, and an insulating layer 325 is positioned over the insulating layer 324. A conductive layer 326 and a conductive layer 327 are positioned over the insulating layer 325. The conductive layer 326 is electrically connected to the conductive layer 314, and the conductive layer 327 is electrically connected to the conductive layer 323. An insulating layer 328 is positioned over the conductive layers 326 and 327, and a conductive layer 329 is positioned over the insulating layer 328. The conductive layer 329 is electrically connected to the conductive layer 326 and serves as a pixel electrode of the light-emitting element 302.

A region where the conductive layer 327, the insulating layer 328, and the conductive layer 329 overlap with each other serves as the capacitor C2.

An insulating layer 330 is positioned over the conductive layer 329, an EL layer 331 is positioned over the insulating layer 330, and a conductive layer 332 serving as a counter electrode is positioned over the EL layer 331. The conductive layer 329, the EL layer 331, and the conductive layer 332 are electrically connected to each other in an opening of the insulating layer 330. A region where the conductive layer 329, the EL layer 331, and the conductive layer 332 are electrically connected to each other serves as the light-emitting element 302. The light-emitting element 302 has a top emission structure in which light is emitted in a direction indicated by a dotted arrow from the conductive layer 332 side.

One of the conductive layers 329 and 332 serves as an anode, and the other serves as a cathode. When a voltage higher than the threshold voltage of the light-emitting element 302 is applied between the conductive layer 329 and the conductive layer 332, holes are injected to the EL layer 331 from the anode side and electrons are injected to the EL layer 331 from the cathode side. The injected electrons and holes are recombined in the EL layer 331 and a light-emitting substance contained in the EL layer 331 emits light.

Note that in the case where a metal oxide (oxide semiconductor) is used for the semiconductor layers 313 and 322, it is preferable to use an insulating material containing oxygen for the insulating layer 318 and it is preferable to use a material through which impurities such as water and hydrogen do not easily diffuse for the insulating layer 324.

In the case where an organic material is used for the insulating layer 325 or 330, when the insulating layer 325 or 330 is exposed at an end portion of the display device, impurities such as water may enter the light-emitting element 302 and the like from the outside of the display device through the insulating layer 325 or 330. Deterioration of the light-emitting element 302 due to the entry of impurities can lead to deterioration of the display device. For this reason, the insulating layers 325 and 330 are preferably not positioned at the end portion of the display device, as illustrated in FIG. 38.

The light-emitting element 302 overlaps with a coloring layer 334 with an adhesive layer 333 provided therebetween. The spacer 335 overlaps with the light-blocking layer 336 with the adhesive layer 333 provided therebetween. Although FIG. 38 illustrates the case where a space is provided between the conductive layer 332 and the light-blocking layer 336, the conductive layer 332 and the light-blocking layer 336 may be in contact with each other.

The coloring layer 334 is a colored layer that transmits light in a specific wavelength range. For example, a color filter that transmits light in a specific wavelength range, such as red, green, blue, or yellow light, can be used.

Note that one embodiment of the present invention is not limited to a color filter method, and a separate coloring method, a color conversion method, a quantum dot method, and the like may be employed.

The transistor Tr1 in the display portion 306L includes a conductive layer 340 functioning as a back gate, an insulating layer 341 over the conductive layer 340, a semiconductor layer 342 which is provided over the insulating layer 341 to overlap with the conductive layer 340, an insulating layer 343 over the semiconductor layer 342, a conductive layer 344 which functions as a gate and is positioned over the insulating layer 343, and conductive layers 346 and 347 which are positioned over an insulating layer 345 over the conductive layer 344 and electrically connected to the semiconductor layer 342.

A conductive layer 348 is positioned in the same layer as the conductive layer 340. The insulating layer 341 is positioned over the conductive layer 348, and the conductive layer 347 is positioned over the insulating layer 341 and in a region overlapping with the conductive layer 348. A region where the conductive layer 347, the insulating layer 341, and the conductive layer 348 overlap with one another functions as the capacitor C1.

The transistor TrLD has the same structure as the transistor Tr1, and therefore, detailed description thereof is omitted.

An insulating layer 360 is positioned over the transistor Tr1, the capacitor C1, and the transistor TrLD. A conductive layer 349 is positioned over the insulating layer 360. The conductive layer 349 is electrically connected to the conductive layer 347 and serves as a pixel electrode of the liquid crystal element 303. An alignment film 364 is positioned over the conductive layer 349.

A conductive layer 361 serving as a common electrode is positioned over the substrate 301. Specifically, in FIG. 38, an insulating layer 363 is bonded to the substrate 301 with an adhesive layer 362 interposed therebetween, and the conductive layer 361 is positioned over the insulating layer 363. An alignment film 365 is positioned over the conductive layer 361, and a liquid crystal layer 366 is positioned between the alignment film 364 and the alignment film 365.

In FIG. 38, the conductive layer 349 has a function of reflecting visible light, and the conductive layer 361 has a function of transmitting visible light; accordingly, light entering through the substrate 301 can be reflected by the conductive layer 349 and then exits through the substrate 301, as shown by an arrow of a broken line.

For example, a material containing one of indium (In), zinc (Zn), and tin (Sn) is preferably used for the conductive material that transmits visible light. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, and zinc oxide containing gallium are given, for example. Note that a film including graphene can be used as well. The film including graphene can be formed, for example, by reducing a film containing graphene oxide.

Examples of a conductive material that reflects visible light include aluminum, silver, and an alloy including any of these metal elements. Furthermore, a metal material such as gold, platinum, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La); or an alloy containing silver such as an alloy of silver and copper, an alloy of silver, palladium, and copper (also referred to as Ag—Pd—Cu or APC), or an alloy of silver and magnesium may be used.

Although the structure of the display device including a top-gate transistor with a back gate is illustrated in FIG. 38, the display device of one embodiment of the present invention may include a transistor without a back gate or a transistor including a back gate.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

As a semiconductor material used for the transistor, a metal oxide (oxide semiconductor) can be used. Typically, a metal oxide containing indium or the like can be used. In particular, a CAC-OS to be described in Embodiment 7 is preferably used as a metal oxide in the transistor.

In particular, a semiconductor material having a wider band gap and a lower carrier density than silicon is preferably used because off-state current of the transistor can be reduced.

The semiconductor layer preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistors including the metal oxide, the oxide preferably contains a stabilizer in addition to In and Zn.

Examples of the stabilizer, including metals that can be used as M, are gallium, tin, hafnium, aluminum, and zirconium. As another stabilizer, lanthanoid such as lanthanum, cerium, praseodymium, neodymium, samarium, europium, gadolinium, terbium, dysprosium, holmium, erbium, thulium, ytterbium, or lutetium can be given.

As a metal oxide included in the semiconductor layer, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no limitation on the ratio of In:Ga:Zn. Furthermore, a metal element in addition to In, Ga, and Zn may be contained.

Note that although the structure of the display device in which a liquid crystal element is used as a reflective display element is exemplified in this embodiment, a display element using a microcapsule method, an electrophoretic method, an electrowetting method, an Electronic Liquid Powder (registered trademark) method, or the like can also be used, other than micro electro mechanical systems (MEMS) shutter element or an optical interference type MEMS element.

As a light-emitting display element, a self-luminous light-emitting element such as an organic light-emitting diode (OLED), a light-emitting diode (LED), and a quantum-dot light-emitting diode (QLED) can be used.

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes. For example, a liquid crystal element using, instead of a vertical alignment (VA) mode, a twisted nematic (TN) mode, an in-plane switching (IPS) mode, a fringe field switching (FFS) mode, an axially symmetric aligned microcell (ASM) mode, an optically compensated birefringence (OCB) mode, a ferroelectric liquid crystal (FLC) mode, an antiferroelectric liquid crystal (AFLC) mode, or the like can be used.

As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, either of a positive liquid crystal and a negative liquid crystal may be used, and an appropriate liquid crystal material can be used depending on the mode or design to be used.

An alignment film can be provided to adjust the alignment of a liquid crystal. In the case where a horizontal electric field mode is employed, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition which includes liquid crystal exhibiting a blue phase and a chiral material has a short response time and optical isotropy, which makes the alignment process unneeded. In addition, the liquid crystal composition which includes liquid crystal exhibiting a blue phase and a chiral material has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

Figure 39:
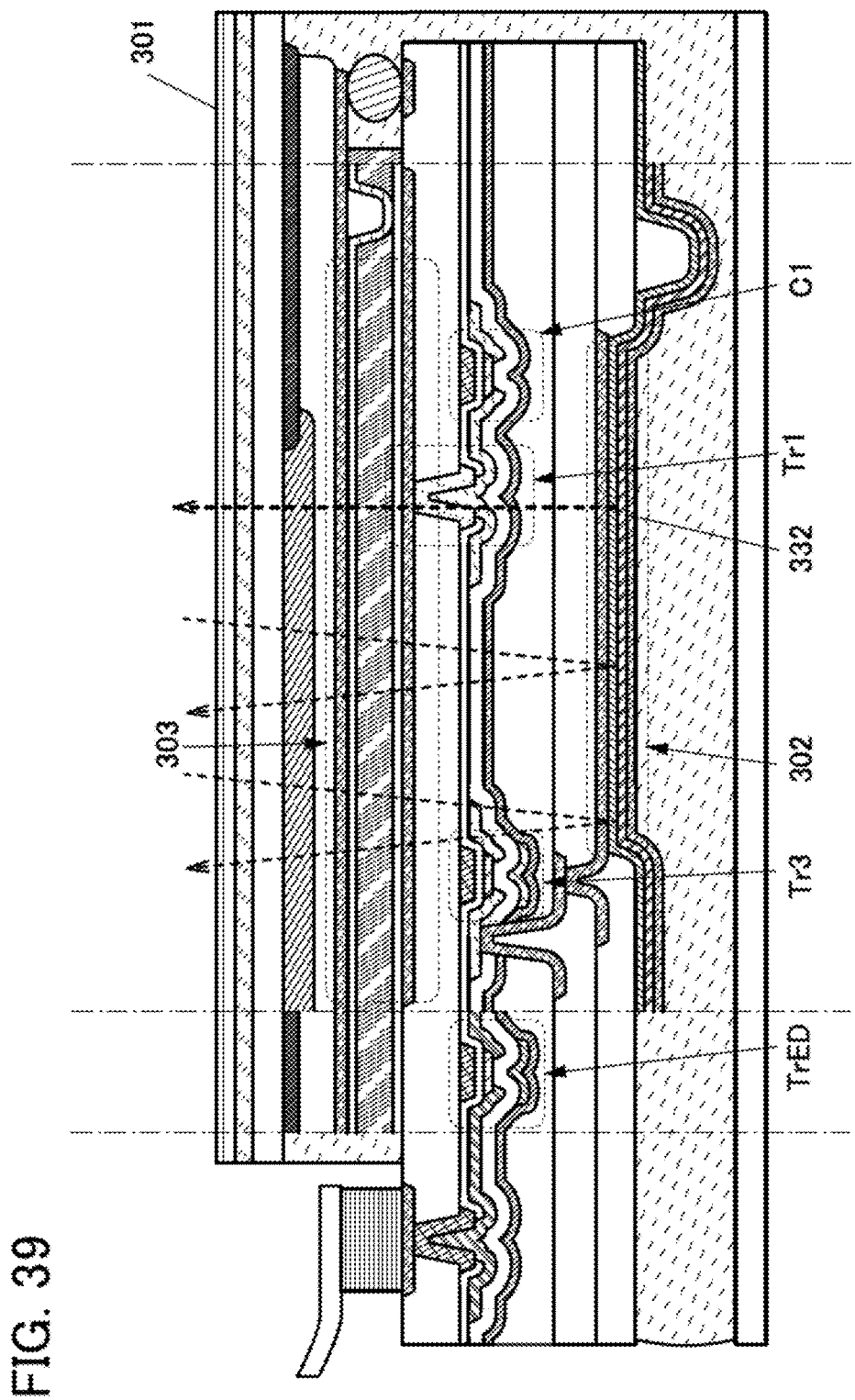
FIG. 39 is a cross-sectional view illustrating an example of a display device.

As another example, when a semiconductor and a conductor of the transistor are formed using light-transmitting materials, light emitted from the light-emitting element 302 can pass through the transistor Tr1, the transistor Tr3, and the capacitor C1 as illustrated in FIG. 39. Moreover, light entering from the substrate 301 side and passing through the liquid crystal element 303 can be reflected by the conductive layer 332. Note that one or both of a conductive layer serving as a gate electrode and a conductive layer serving as a back gate electrode may be a layer having no light-transmitting property such as a metal layer in order to improve the reliability of the transistors Tr1 and Tr3.

<Pixel Portion>

Figure 40:
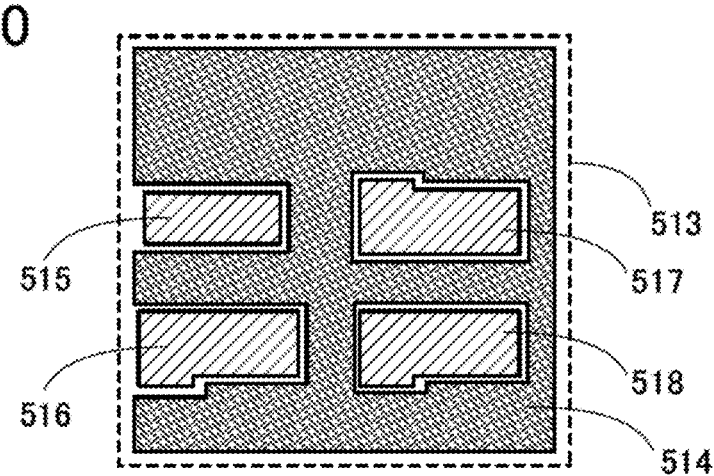
FIG. 40 is a top view illustrating an example of a pixel.

FIG. 40 is a top view illustrating one pixel included in the display portion 106 of the display device 100A. Specifically, FIG. 40 illustrates a layout of a display region by a liquid crystal element and a layout of a display region of a light-emitting element in a pixel 513 in the display portion 106.

The pixel 513 in FIG. 40 includes a display region 514 of the liquid crystal element, a display region 515 of a light-emitting element corresponding to yellow, a display region 516 of a light-emitting element corresponding to green, a display region 517 of a light-emitting element corresponding to red, and a display region 518 of a light-emitting element corresponding to blue.

Note that in order to display black with high color reproducibility by using the light-emitting elements corresponding to green, blue, red, and yellow, the amount of current flowing to the light-emitting element corresponding to yellow per unit area needs to be the smallest among those flowing to the light-emitting elements. In FIG. 40, the display region 516 of the light-emitting element corresponding to green, the display region 517 of the light-emitting element corresponding to red, and the display region 518 of the light-emitting element corresponding to blue have substantially the same area, and the display region 515 of the light-emitting element corresponding to yellow has a slightly smaller area than the other display regions. Therefore, black can be displayed with high color reproducibility.

This embodiment can be combined with any of the other embodiments as appropriate.

Embodiment 6

In this embodiment, the touch sensor unit 200 will be described.

Figure 41:
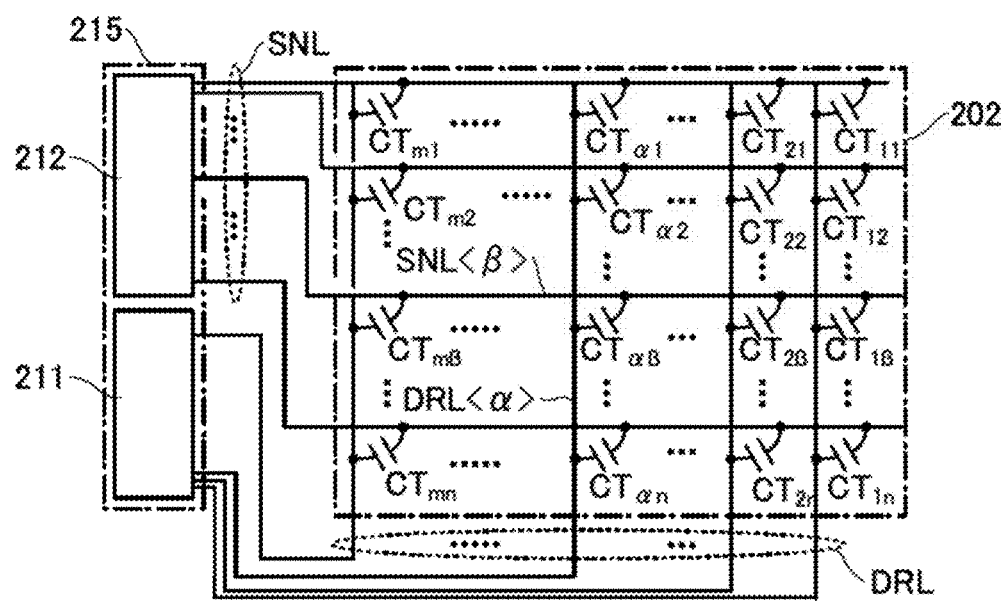
FIG. 41 is a circuit diagram illustrating an example of a touch sensor unit.

FIG. 41 illustrates a configuration example of the touch sensor unit 200. The touch sensor unit 200 includes the sensor array 202, the TS driver IC 211, and the sense circuit

212. In FIG. 41, the TS driver IC 211 and the sense circuit 212 are collectively referred to as the peripheral circuit 215.

Here, the touch sensor unit 200 is a mutual capacitive touch sensor unit as an example. The sensor array 202 includes m wirings DRL and n wirings SNL, where m is an integer greater than or equal to 1 and n is an integer greater than or equal to 1. The wiring DRL is a driving line, and the wiring SNL is a sensing line. Here, the α-th wiring DRL is referred to as a wiring DRL<α>, and the β-th wiring SNL is referred to as a wiring SNL<β>. A capacitor $CT_{\alpha\beta}$ refers to a capacitor formed between the wiring DRL<α> and the wiring SNL<β>.

The m wirings DRL are electrically connected to the TS driver IC 211. The TS driver IC 211 has a function of driving the wirings DRL. The n wirings SNL are electrically connected to the sense circuit 212. The sense circuit 212 has a function of sensing signals of the wirings SNL. A signal of the wiring SNL<β> at the time when the wiring DRL<α> is driven by the TS driver IC 211 has information on the change amount of capacitance of the capacitor $CT_{\alpha\beta}$. By analyzing signals of n wirings SNL, information on the presence or absence of touch, the touch position, and the like can be obtained.

This embodiment can be combined with any of the other embodiments in this specification as appropriate.

Embodiment 7

<Composition of CAC-OS>

Described below will be the composition of a cloud-aligned composite oxide semiconductor (CAC-OS) applicable to a transistor of one embodiment of the present invention.

The CAC-OS has, for example, a composition in which elements included in a metal oxide are unevenly distributed. Materials including unevenly distributed elements each have a size greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite metal oxide with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ (−1≤x0≤1; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of a metal oxide is exhibited. Accordingly, when regions including $In_{X2}Zn_{Y2}O_{Z2}$ or $InO_{X1}$ as a main component are distributed in a metal oxide like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in a metal oxide, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Ion) and high field-effect mobility ($\mu$) can be achieved.

A semiconductor element including a CAC-OS has high reliability. Thus, the CAC-OS is suitably used in a variety of semiconductor devices typified by a display.

At least part of this embodiment can be implemented in combination with any of the other embodiments and the other examples described in this specification as appropriate.

Embodiment 8

In this embodiment, a display module that includes a display device including a semiconductor device of one embodiment of the present invention will be described.

Figure 42A:
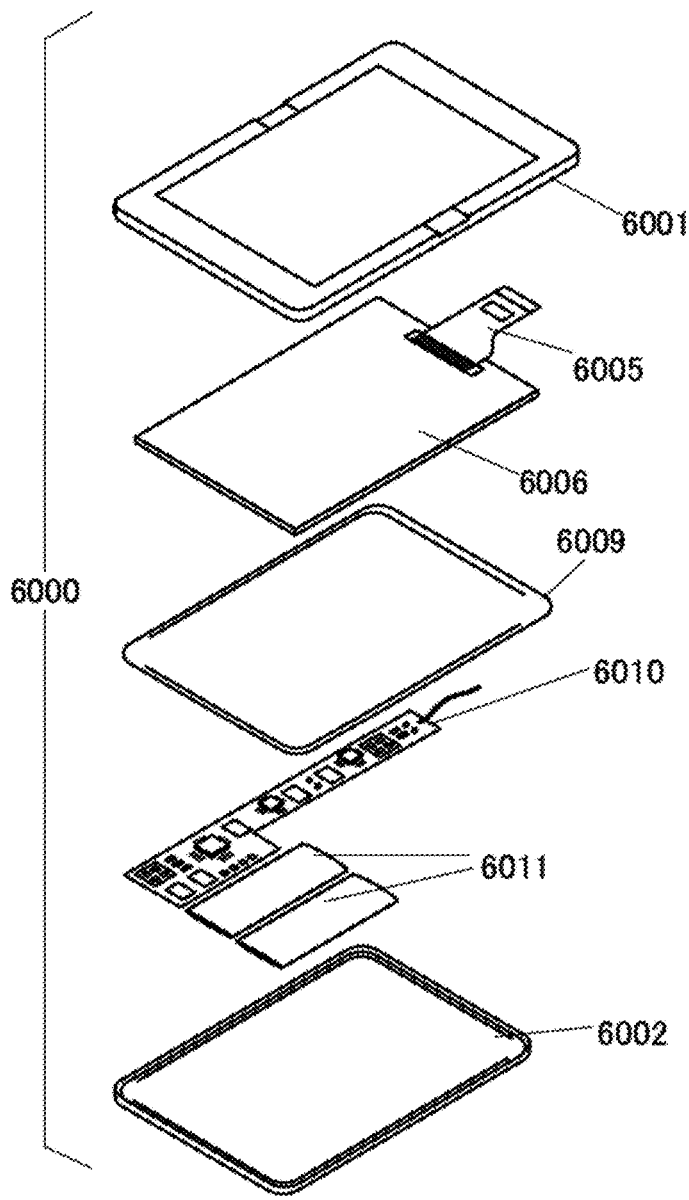
FIGS. 42A and 42B illustrate an example of a display module.

In a display module 6000 in FIG. 42A, a display panel 6006 connected to an FPC 6005, a frame 6009, a printed circuit board 6010, and a battery 6011 are provided between an upper cover 6001 and a lower cover 6002.

For example, the above-described display device including a semiconductor device of one embodiment of the present invention can be used for the display panel 6006. Thus, the display module that can perform high-speed switching in boosting a voltage to a desired voltage can be manufactured.

The shapes and sizes of the upper cover 6001 and the lower cover 6002 can be changed as appropriate in accordance with the sizes of the display panel 6006.

A touch panel may be provided so as to overlap with the display panel 6006. The touch panel can be a resistive touch panel or a capacitive touch panel and may be formed to overlap with the display panel 6006. Instead of providing the touch panel, the display panel 6006 can have a touch panel function.

The frame 6009 protects the display panel 6006 and also serves as an electromagnetic shield for blocking electromagnetic waves generated by the operation of the printed circuit board 6010. The frame 6009 may serve as a radiator plate.

The printed circuit board 6010 includes a power supply circuit and a signal processing circuit for outputting a video signal and a clock signal. As a power source for supplying power to the power supply circuit, an external commercial power source or the battery 6011 provided separately may be used. The battery 6011 can be omitted in the case of using a commercial power source. The battery 6011 does not overlap with a region to be curved of the display panel. The structure is favorable to prevent damage to the battery 6011.

The display module 6000 can be additionally provided with a member such as a polarizing plate, a retardation plate, or a prism sheet.

Figure 42B:
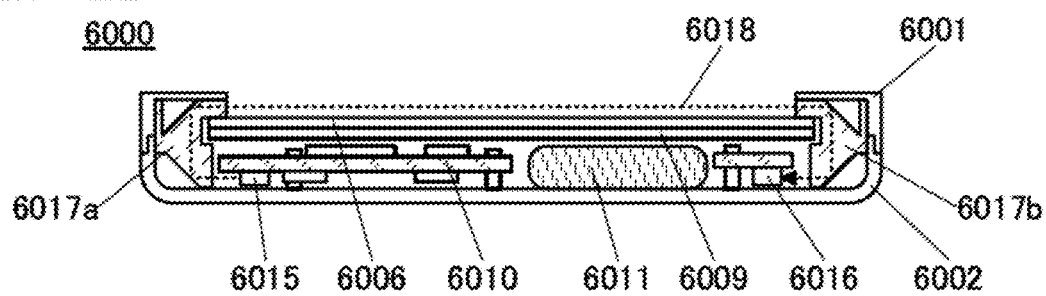

FIG. 42B is a cross-sectional schematic view of the display module 6000 with an optical touch sensor.

The display module 6000 includes a light-emitting portion 6015 and a light-receiving portion 6016 which are provided on the printed circuit board 6010. A pair of light guide portions (a light guide portion 6017a and a light guide portion 6017b) is provided in a region surrounded by the upper cover 6001 and the lower cover 6002.

The display panel 6006 overlaps with the printed circuit board 6010 and the battery 6011 with the frame 6009 located therebetween. The display panel 6006 and the frame 6009 are fixed to the light guide portion 6017a and the light guide portion 6017b.

Light 6018 emitted from the light-emitting portion 6015 travels over the display panel 6006 through the light guide portion 6017a and reaches the light-receiving portion 6016 through the light guide portion 6017b. For example, blocking of the light 6018 by a sensing target such as a finger or a stylus can be detected as touch operation.

A plurality of light-emitting portions 6015 are provided along two adjacent sides of the display panel 6006, for example. A plurality of light-receiving portions 6016 are provided so as to face the light-emitting portions 6015. Accordingly, information about the position of touch operation can be obtained.

As the light-emitting portion 6015, a light source such as an LED element can be used. It is particularly preferable to use a light source that emits infrared light, which is not visually recognized by users and is harmless to users, as the light-emitting portion 6015.

As the light-receiving portion 6016, a photoelectric element that receives light emitted by the light-emitting portion 6015 and converts it into an electrical signal can be used. A photodiode that can receive infrared light can be favorably used.

For the light guide portions 6017a and 6017b, members that transmit at least the light 6018 can be used. With the use of the light guide portions 6017a and 6017b, the light-emitting portion 6015 and the light-receiving portion 6016 can be placed under the display panel 6006, and a malfunction of the touch sensor due to external light reaching the light-receiving portion 6016 can be suppressed. It is particularly preferable to use a resin which absorbs visible light and transmits infrared light. This is more effective in suppressing the malfunction of the touch sensor.

At least part of this embodiment can be implemented in combination with any of the other embodiments described in this specification as appropriate.

Embodiment 9

FIGS. 43A to 43F each illustrate a specific example of an electronic device to which the display module described in the above embodiment can be applied.

Figure 43A:
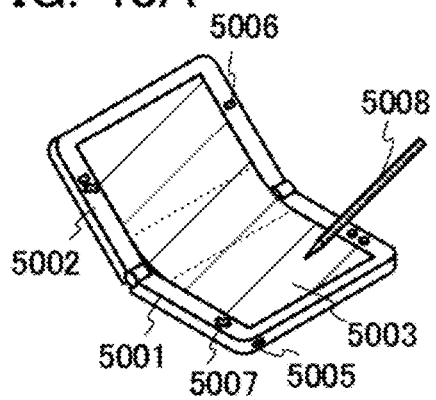
FIGS. 43A to 43F each illustrate an example of an electronic device.

FIG. 43A illustrates a portable game machine, which includes a housing 5001, a housing 5002, a display module 5003, a microphone 5005, a speaker 5006, an operation key 5007, a stylus 5008, and the like.

Figure 43B:
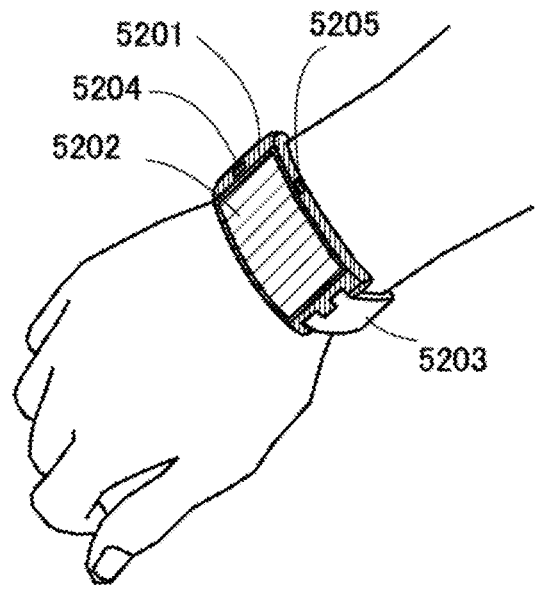

FIG. 43B illustrates a wristwatch-type mobile terminal, which includes a housing 5201, a display module 5202, a band 5203, a photosensor 5204, a switch 5205, and the like.

Figure 43C:
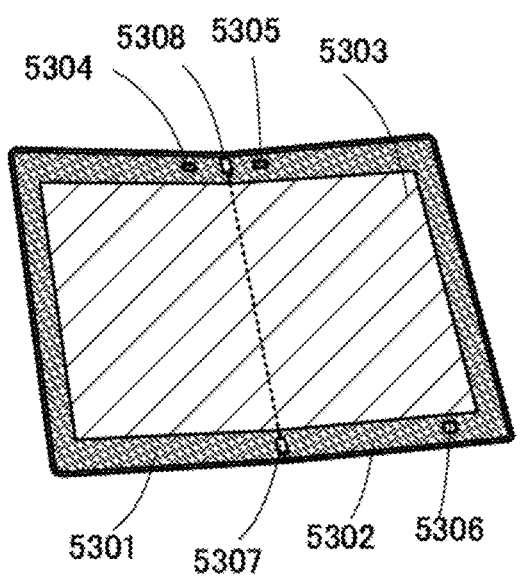

FIG. 43C illustrates a tablet personal computer, which includes a housing 5301, a housing 5302, a display module 5303, an optical sensor 5304, an optical sensor 5305, a switch 5306, and the like. The display module 5303 is supported by the housing 5301 and the housing 5302. The display module 5303 is formed using a flexible substrate and therefore has a function of being flexible in shape and bendable. By changing the angle between the housing 5301 and the housing 5302 with a hinge 5307 and a hinge 5308, the display module 5303 can be folded such that the housing 5301 and the housing 5302 overlap with each other. Although not illustrated, an open/close sensor may be incorporated so that the above-described angle change can be used as information about conditions of use of the display module 5303.

Figure 43D:
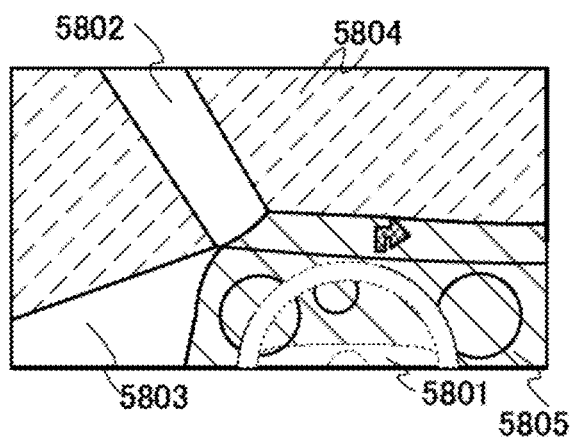

FIG. 43D shows the peripheral portion of the driver's seat of a moving object such as a car, which includes a handle 5801, a pillar 5802, a door 5803, a windshield 5804, a display module 5805 of one embodiment of the present invention, and the like. The display module 5805 is formed using a flexible substrate and therefore has a function of being flexible in shape and bendable. Thus, the display module 5805 can be used for an instrument panel that displays meters and the like on a dashboard of a car having a plane surface or curved surfaces with different radii of curvature.

Figure 43E:
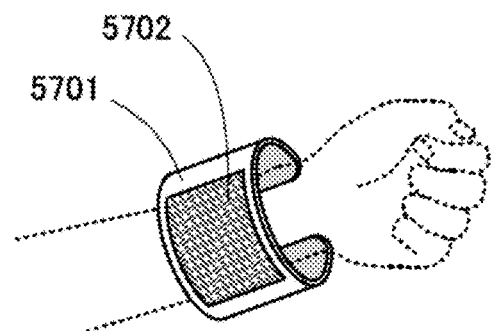

FIG. 43E illustrates a wristwatch-type portable terminal, which includes a housing 5701 having a curved surface, a display module 5702, and the like. When a flexible substrate is used for the display module 5702 of one embodiment of the present invention, the display module 5702 can be supported by the housing 5701 having a curved surface. Consequently, it is possible to provide a user-friendly wristwatch-type portable terminal that is flexible and lightweight.

Figure 43F:
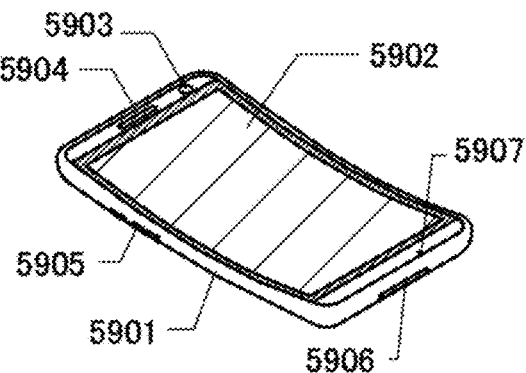

FIG. 43F illustrates a cellular phone, which includes a display module 5902, a microphone 5907, a speaker 5904, a camera 5903, an external connection portion 5906, and an operation button 5905 in a housing 5901 having a curved surface.

This embodiment can be combined with any of the other embodiments as appropriate. The display device according to the above embodiment can be applied to the display module of this embodiment. Thus, an electronic device which can perform high-speed switching in boosting a voltage to a desired voltage can be obtained.

EXAMPLE

Figure 44A:
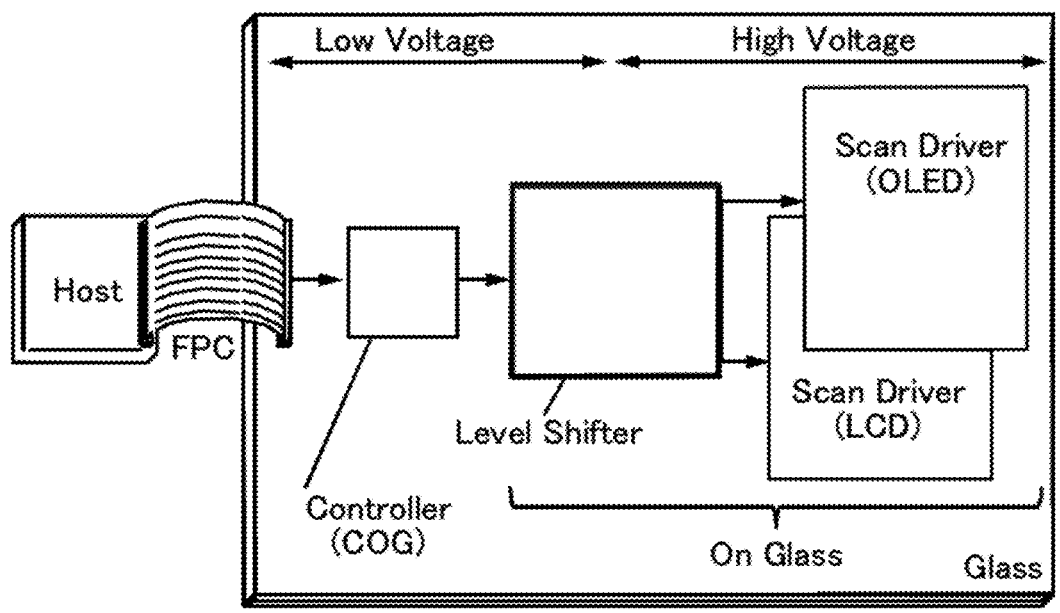
FIGS. 44A to 44C are block diagrams and a graph for describing Example.

A display device including the semiconductor device described in the above embodiment was fabricated. FIG. 44A is a system block diagram of the display device.

FIG. 44A illustrates a controller IC (Controller) to which a signal is supplied from a host (Host) through an FPC, a semiconductor device serving as a level shifter (Level Shifter), a gate driver for an OLED (Scan Driver (OLED)), and a gate driver for an LCD (Scan Driver (LCD)), which are on a glass substrate (Glass).

As illustrated in FIG. 44A, a circuit on the left side of the level shifter such as the controller IC operates at low voltage, and a circuit on the right side of the level shifter such as the gate driver operates at high voltage. In the configuration of this example, the level shifter provided between the gate drivers and the controller IC boosts the voltages of signals input to the gate drivers. The structure allows the voltages of signals for controlling the operation of the gate drivers to be increased, whereby the operation speed of the gate drivers can be increased.

As illustrated in FIG. 44A, the controller IC is formed by COG. The level shifter, the gate drivers, and a pixel circuit (not illustrated) are formed on the glass substrate.

Figure 44B:
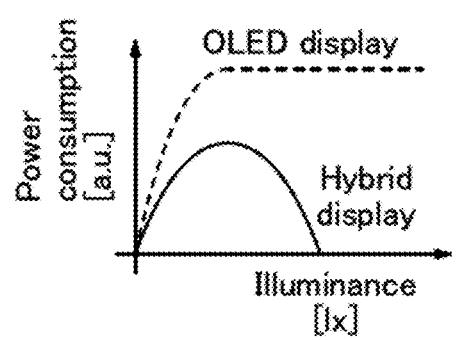

As illustrated in FIG. 22A or the like, the power consumption of a display device including a pixel circuit that drives a light-emitting element and a liquid crystal element separately (also referred to as a hybrid display) can be extremely smaller than that of a display device including a pixel circuit that drives only a light-emitting element (an OLED display). Comparison between the hybrid display and the OLED display is shown in FIG. 44B, where the horizontal axis and the vertical axis represent illuminance and power consumption, respectively. The power consumption of the hybrid display can be extremely low particularly in a high illuminance environment.

Figure 44C:
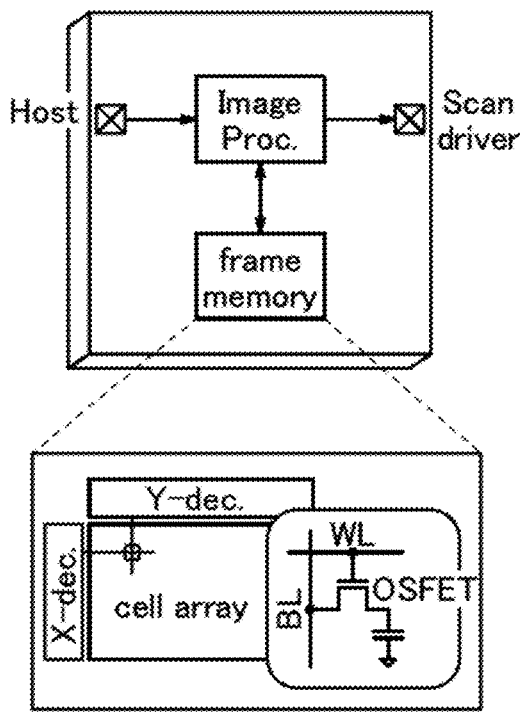

The controller IC of FIG. 44A includes a frame memory in addition to an image processing circuit (Image Proc.) as illustrated in FIG. 44C. An OS transistor (OSFET) can be effectively used as a transistor included in a memory element of the frame memory. An OS transistor has a low off-state current; thus, frequency of data refresh operation in a dynamic RAM (DRAM) or the like can be reduced and power consumption can be reduced.

A semiconductor device with the structure of FIG. 10A described in the above embodiment was fabricated on a glass substrate and the waveform of the output signal OUTH when the input signal IN and the inverted input signal INB are input was obtained by an oscilloscope. Note that the voltage VDDH was 17 V, the voltage VDD was 5 V, and the voltage VSS was 0 V.

Figure 45:
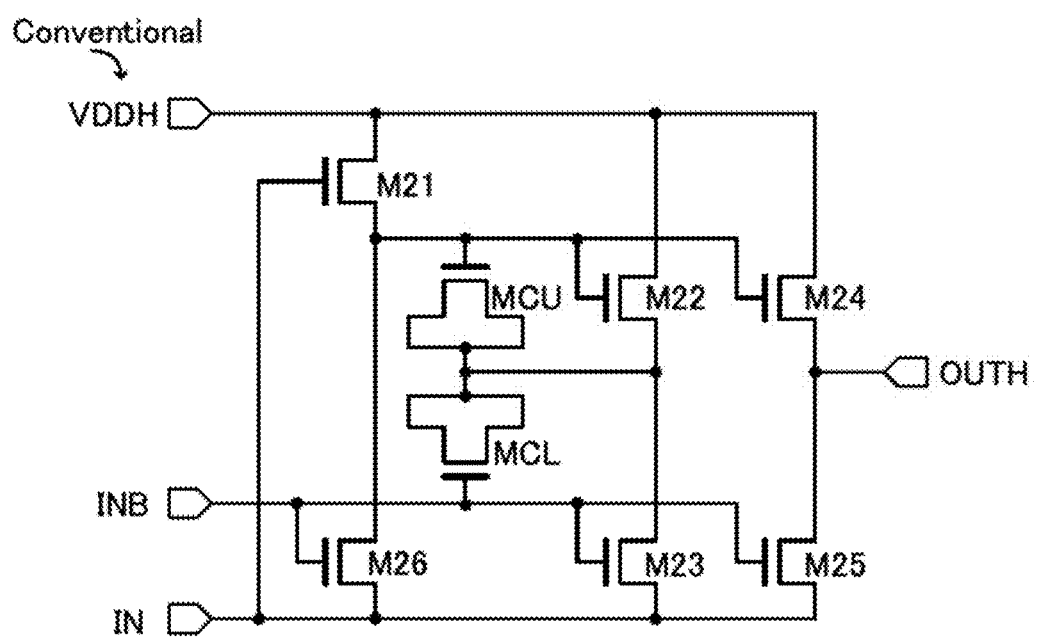
FIG. 45 is a circuit diagram for describing Example.

A circuit of a semiconductor device serving as a level shifter and that is different from the circuit of FIG. 10A was fabricated for comparison. FIG. 45 illustrates a circuit configuration described in "Hongkyun. Lym et al., "5 V input level shifter circuit for IGZO thin-film transistors", *IEICE Electronics Express*, Vol. 11, No. 13, pp. 1-6". The circuit is illustrated as "Conventional" in FIG. 45 and includes transistors M21 to M26 and the capacitors MCU and MCL. The voltage VDDH, the input signal IN, and the inverted input signal INB are the same as those of FIG. 10A. The circuit illustrated in FIG. 45 functions, as in FIG. 10A, as a level shifter that outputs the output signal OUTH boosted in accordance with the input signal IN.

Figure 46:
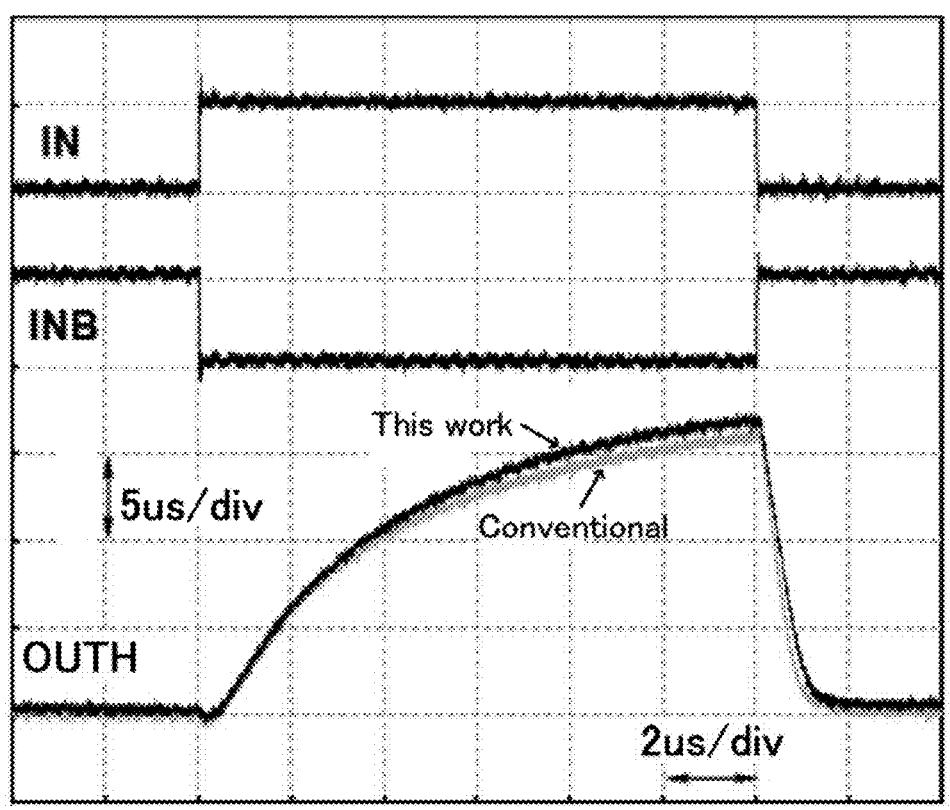
FIG. 46 is a graph for describing Example.

FIG. 46 shows a waveform chart of the output signal OUTH when the input signal IN and the inverted input signal INB are input. The horizontal axis and the vertical axis represent time and voltage, respectively. In FIG. 46, a waveform obtained by using the circuit configuration of FIG. 10A and a waveform obtained by using the circuit configuration of FIG. 45 are denoted as "This work" and "Conventional", respectively. As shown in FIG. 46, the waveform of the output signal OUTH reflects the voltage boosted in accordance with the change of the voltage of the input signal IN. Moreover, the circuit configuration of FIG. 10A was found to be superior to that of FIG. 45 in boosting speed.

Figure 47:
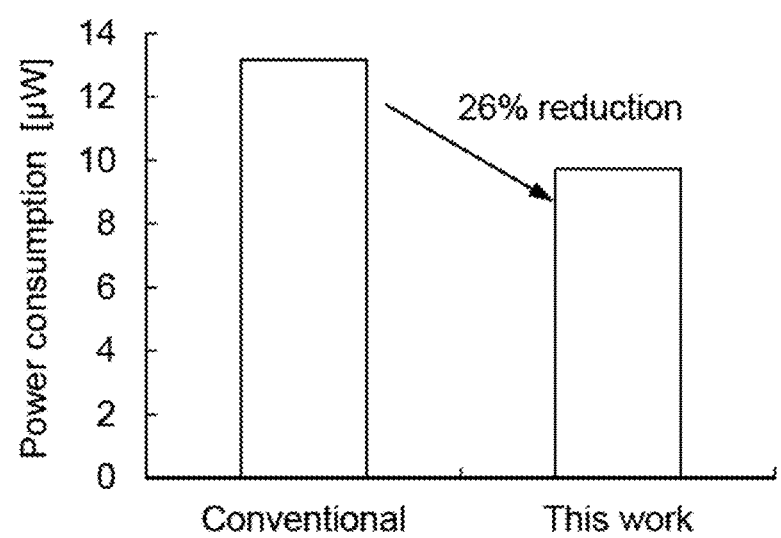
FIG. 47 is a graph for describing Example.

The power consumption of each of the circuit configuration of FIG. 10A and the circuit configuration of FIG. 45 was estimated. FIG. 47 is a graph showing comparison of the power consumption. The power consumption was estimated by simulation. Note that a circuit simulator, Smart Spice (manufactured by Silvaco Data Systems Inc.), was used for the simulation. Note that the voltage VDDH was 17 V, the voltage VDD was 5 V, and the voltage VSS was 0 V. As parasitic capacitance of the circuit when the power consumption was estimated, a capacitance of 1 pF was connected to each of a wiring between the wiring to which the voltage VDDH is supplied and a wiring to which the voltage IN is supplied in the circuit configuration of FIG. 45, and a capacitance of 1 pF was connected to a wiring between the wiring to which the voltage VDDH is supplied and a wiring to which the voltage VSS is supplied in the circuit configuration of FIG. 10A. Operation conditions such as a voltage are the same as the measurement conditions of FIG. 46. The power consumption of the circuit configuration of FIG. 10A was smaller than that of the circuit configuration of FIG. 45 by 26%.

Figure 48:
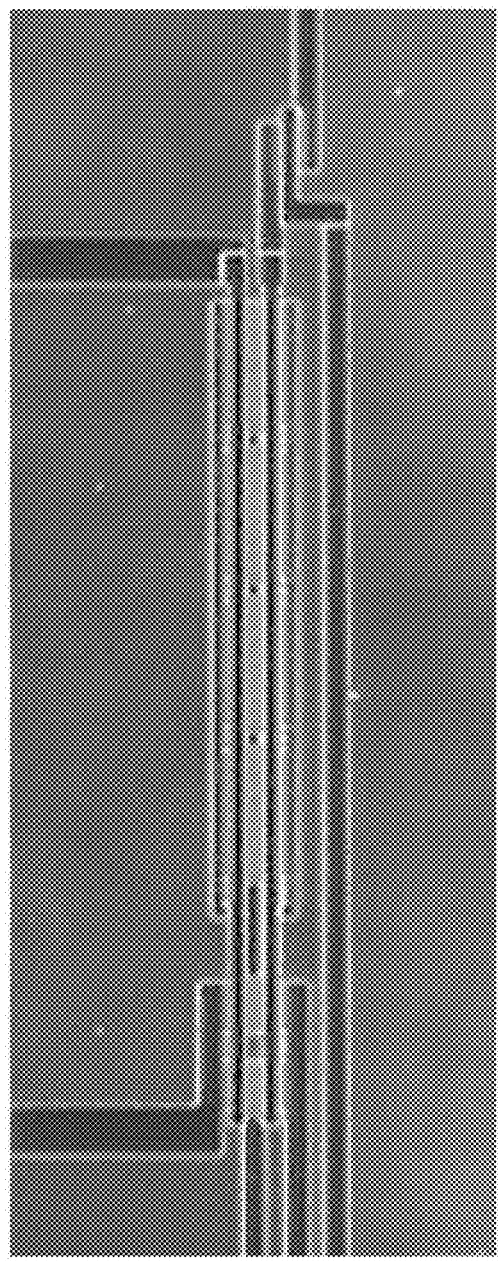
FIG. 48 is a micrograph for describing Example.

FIG. 48 is a micrograph of the level shifter fabricated on a glass substrate. The channel length of the transistor in the level shifter is 4 µm.

This application is based on Japanese Patent Application Serial No. 2016-231653 filed with Japan Patent Office on Nov. 29, 2016, the entire contents of which are hereby incorporated by reference.

What is claimed is:

1. A semiconductor device comprising:
a level shifter over a substrate, the level shifter comprising:
a first transistor, a second transistor, a third transistor, and a fourth transistor; and
a first capacitor and a second capacitor,
a controller IC over the substrate, the controller IC comprising a ninth transistor and a tenth transistor; and
a gate driver over the substrate,
wherein a chip of the controller IC is mounted on the substrate,
wherein the level shifter and the gate driver are formed on the substrate,
wherein the controller IC is operated at a first voltage,
wherein the gate driver is operated at a second voltage which is higher than the first voltage and boosted by the level shifter,
wherein a material of a channel formation region of the ninth transistor is different from a material of a channel formation region of the tenth transistor,
wherein a gate of the first transistor and one of a source and a drain of the first transistor are electrically connected to a first wiring to which an input signal is supplied,
wherein a gate of the second transistor, a gate of the fourth transistor, and a first electrode of the second capacitor are electrically connected to a second wiring to which an inverted input signal is supplied,
wherein one of a source and a drain of the third transistor is electrically connected to a third wiring,
wherein one of a source and a drain of the second transistor and one of a source and a drain of the fourth transistor are electrically connected to a fourth wiring that is different from the first wiring,
wherein a first electrode of the first capacitor is electrically connected to the other of the source and the drain of the first transistor, the other of the source and the drain of the second transistor, and a gate of the third transistor,
wherein a second electrode of the first capacitor is electrically connected to a second electrode of the second capacitor, the other of the source and the drain of the third transistor, and the other of the source and the drain of the fourth transistor,
wherein the first capacitor and the second capacitor are a seventh transistor and an eighth transistor, respectively,
wherein the first electrode of the first capacitor is a gate of the seventh transistor,
wherein the second electrode of the first capacitor is a source and a drain of the seventh transistor,
wherein the first electrode of the second capacitor is a gate of the eighth transistor,
wherein the second electrode of the second capacitor is a source and a drain of the eighth transistor,
wherein the semiconductor device is configured to generate an output signal by boosting the input signal, and
wherein a capacitance of the second capacitor is larger than a capacitance of the first capacitor when voltages of the input signal and the inverted input signal change.

2. The semiconductor device according to claim 1, wherein a channel formation region of each of the first transistor, the second transistor, the third transistor, and the fourth transistor comprises an oxide semiconductor, and
wherein the oxide semiconductor comprises indium.

3. The semiconductor device according to claim 1, wherein each of the seventh transistor and the eighth transistor comprises an oxide semiconductor, and
wherein the oxide semiconductor comprises indium.

4. The semiconductor device according to claim 1, further comprising a fifth transistor and a sixth transistor,
wherein a gate of the fifth transistor is electrically connected to the first electrode of the first capacitor,
wherein a gate of the sixth transistor is electrically connected to the first electrode of the second capacitor,
wherein one of a source and a drain of the fifth transistor is electrically connected to the third wiring,
wherein one of a source and a drain of the sixth transistor is electrically connected to the fourth wiring, and
wherein the other of the source and the drain of the fifth transistor and the other of the source and the drain of the sixth transistor are electrically connected to a fifth wiring from which the output signal is output.

5. A display device comprising:
the semiconductor device according to claim 1; and
a display portion.

6. An electronic device comprising the display device according to claim 5.

7. The semiconductor device according to claim 1, wherein the fourth wiring is a wiring to which a fixed voltage is supplied.

8. The semiconductor device according to claim 1, wherein the fourth wiring is not electrically connected to the first wiring.

9. The semiconductor device according to claim 1, wherein the ninth transistor comprises silicon in the channel formation region, and
wherein the tenth transistor comprises an oxide semiconductor in the channel formation region.

10. A semiconductor device comprising:
a level shifter over a substrate, the level shifter comprising:
  a first transistor, a second transistor, a third transistor, and a fourth transistor; and
  a first capacitor and a second capacitor,
a controller IC over the substrate, the controller IC comprising a ninth transistor and a tenth transistor; and
a gate driver over the substrate,
wherein a chip of the controller IC is mounted on the substrate,
wherein the level shifter and the gate driver are formed on the substrate,
wherein the controller IC is operated at a first voltage,
wherein the gate driver is operated at a second voltage which is higher than the first voltage and boosted by the level shifter,
wherein a material of a channel formation region of the ninth transistor is different from a material of a channel formation region of the tenth transistor,
wherein a gate of the first transistor and one of a source and a drain of the first transistor are electrically connected to a first wiring to which an input signal is supplied,
wherein a gate of the second transistor, a gate of the fourth transistor, and a first electrode of the second capacitor are electrically connected to a second wiring to which an inverted input signal is supplied,
wherein one of a source and a drain of the third transistor is electrically connected to a third wiring,
wherein one of a source and a drain of the second transistor and one of a source and a drain of the fourth transistor are electrically connected to a fourth wiring that is different from the first wiring,
wherein a first electrode of the first capacitor is electrically connected to the other of the source and the drain of the first transistor, the other of the source and the drain of the second transistor, and a gate of the third transistor,
wherein a second electrode of the first capacitor is electrically connected to a second electrode of the second capacitor, the other of the source and the drain of the third transistor, and the other of the source and the drain of the fourth transistor,
wherein the first capacitor and the second capacitor are a seventh transistor and an eighth transistor, respectively,
wherein the first electrode of the first capacitor is a gate of the seventh transistor,
wherein the second electrode of the first capacitor is a source and a drain of the seventh transistor,
wherein the first electrode of the second capacitor is a gate of the eighth transistor, and
wherein the second electrode of the second capacitor is a source and a drain of the eighth transistor.

11. The semiconductor device according to claim 10,
wherein the ninth transistor comprises silicon in the channel formation region, and
wherein the tenth transistor comprises an oxide semiconductor in the channel formation region.

12. The semiconductor device according to claim 1, further comprising an flexible printed circuit (FPC) attached to the substrate and electrically connected to the controller IC.

13. The semiconductor device according to claim 10, further comprising an flexible printed circuit (FPC) attached to the substrate and electrically connected to the controller IC.

* * * * *